United States Patent
Ishida et al.

[11] Patent Number: 6,046,466
[45] Date of Patent: Apr. 4, 2000

[54] SOLID-STATE IMAGING DEVICE

[75] Inventors: Tomohisa Ishida, Tokyo; Naoki Ohkouchi, Yokohama; Satoshi Suzuki, Yokohama; Masahiro Juen, Yokohama; Tadao Isogai, Yokohama, all of Japan

[73] Assignee: Nikon Corporation, Tokyo, Japan

[21] Appl. No.: 09/209,322

[22] Filed: Dec. 9, 1998

Related U.S. Application Data

[63] Continuation-in-part of application No. 09/152,138, Sep. 10, 1998.

[30] Foreign Application Priority Data

| Sep. 12, 1997 | [JP] | Japan | 9-248435 |
| Dec. 1, 1997 | [JP] | Japan | 9-330287 |
| Dec. 10, 1997 | [JP] | Japan | 9-356379 |
| Jan. 9, 1998 | [JP] | Japan | 10-015044 |

[51] Int. Cl.[7] .................................................. H01L 29/80
[52] U.S. Cl. .......................... 257/258; 257/257; 257/262; 257/290; 257/291; 257/292; 348/296; 348/300; 348/301; 348/307; 348/308
[58] Field of Search .................................. 257/257, 258, 257/262, 290, 291, 292; 348/296, 300, 301, 307, 308

[56] References Cited

U.S. PATENT DOCUMENTS

| 3,770,967 | 11/1973 | Hanna et al. | 250/214 R |
| 4,841,349 | 6/1989 | Nakano | 357/30 |
| 5,241,575 | 8/1993 | Miyatake et al. | 377/60 |
| 5,471,515 | 11/1995 | Fossum et al. | 377/60 |
| 5,561,287 | 10/1996 | Turner et al. | 250/208.2 |
| 5,563,429 | 10/1996 | Isogai | 257/258 |
| 5,646,428 | 7/1997 | Hamada | 257/239 |
| 5,739,562 | 4/1998 | Ackland et al. | 257/291 |
| 5,854,498 | 12/1998 | Merrill | 257/292 |
| 5,861,621 | 1/1999 | Takebe et al. | 250/214 R |
| 5,869,857 | 2/1999 | Chen | 257/292 |
| 5,912,483 | 6/1999 | Hamada | 257/239 |
| 5,923,794 | 7/1999 | McGrath et al. | 382/312 |

FOREIGN PATENT DOCUMENTS 8-293591  2/1996  Japan .

Primary Examiner—Ngân V. Ngô
Attorney, Agent, or Firm—Klarquist Sparkman Campbell Leigh & Whinston, LLP

[57] ABSTRACT

A photoelectric conversion device suitable for use as an element of a photodetector array includes a photodiode for generating a first signal charge in response to incident light, an output unit including a JFET, and at least one transistor having an electrode that generates a second signal charge in response to incident light. The first and second signal charges may be output separately or combined. The second signal charge, or the first and second signal charges combined, may be monitored during an exposure time to determine the desired end of the exposure. An image sensor array may have one or more pixels with such light monitoring capability. The output signal for monitoring the light may be output over a reset drain interconnection, directly from the monitoring pixel or through other pixels via inter-pixel MOSFETS. Exposure time may be controlled, by timing a shutter or a strobe or the like, based on the monitored accumulation of signal charge during exposure. Microlenses may be provided on-chip to increase the effective aperture ratio of the array. The microlenses are designed to avoid interfering with the incident light used for monitoring. Resulting pixel-to-pixel variations in effective aperture ratio, if any, may be electronically compensated.

68 Claims, 39 Drawing Sheets

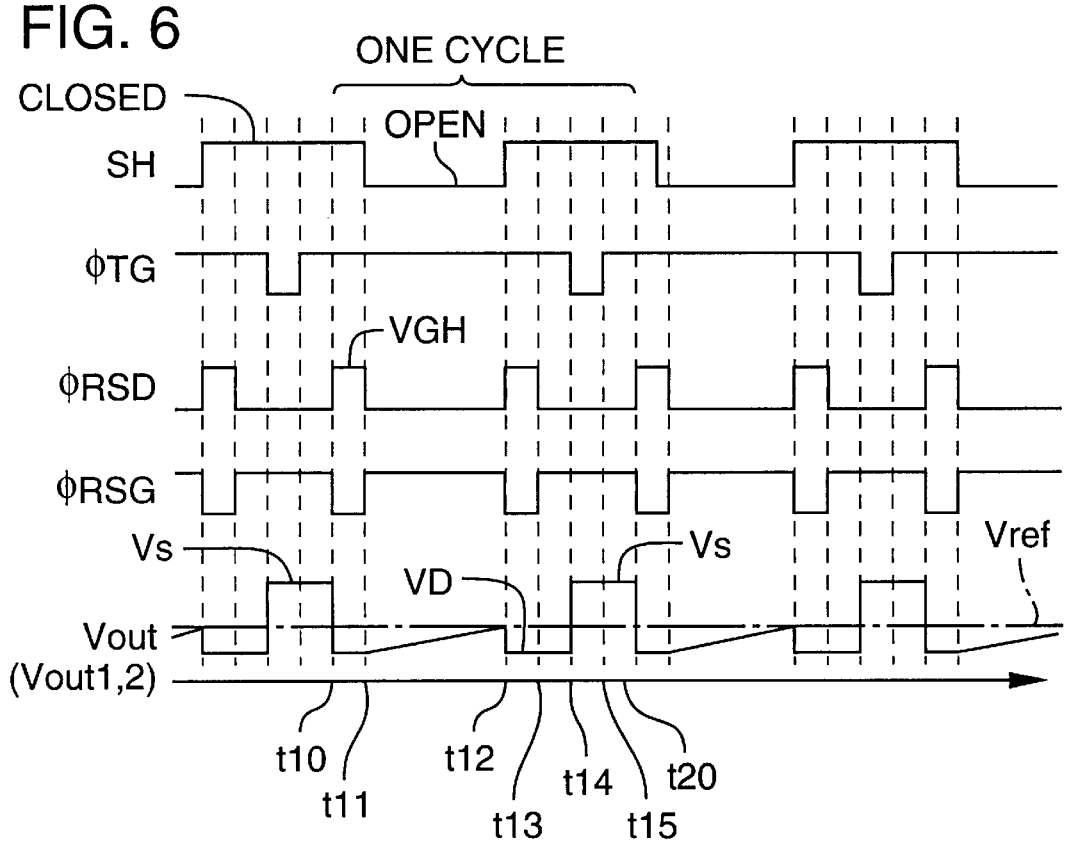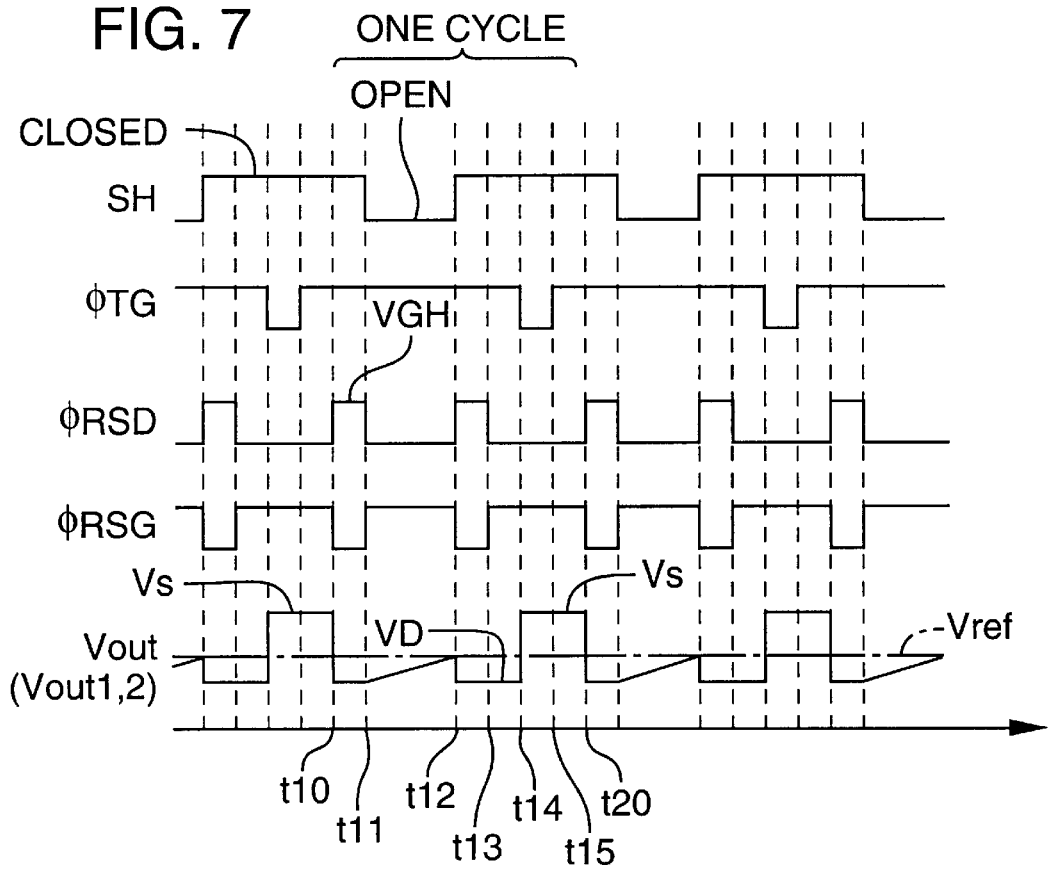

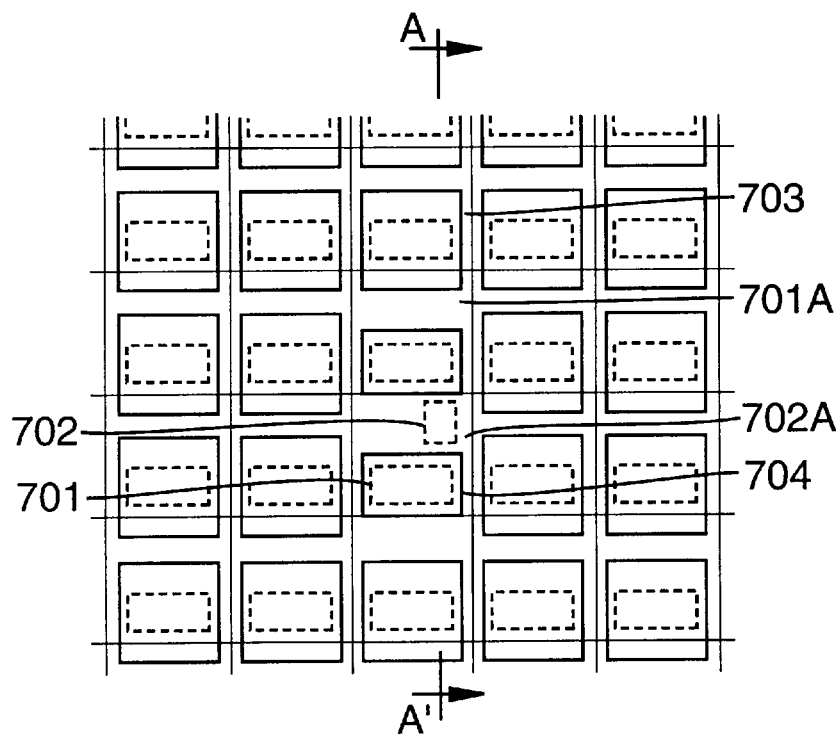
FIG. 43(a)
FIG. 43(b)
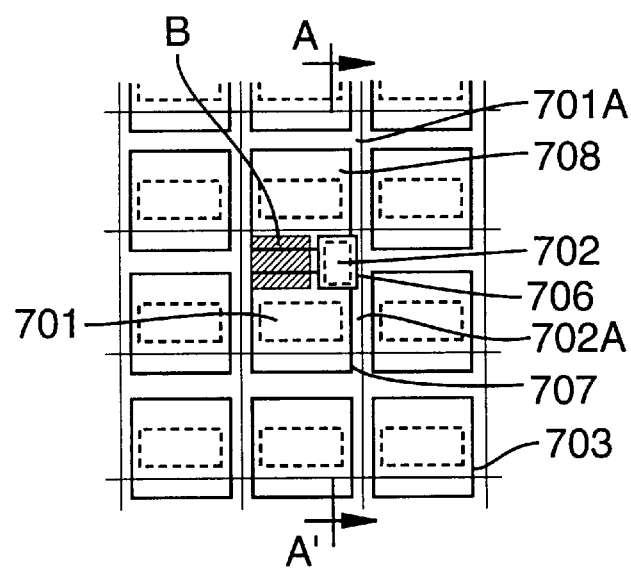
FIG. 44(a)
FIG. 44(b)

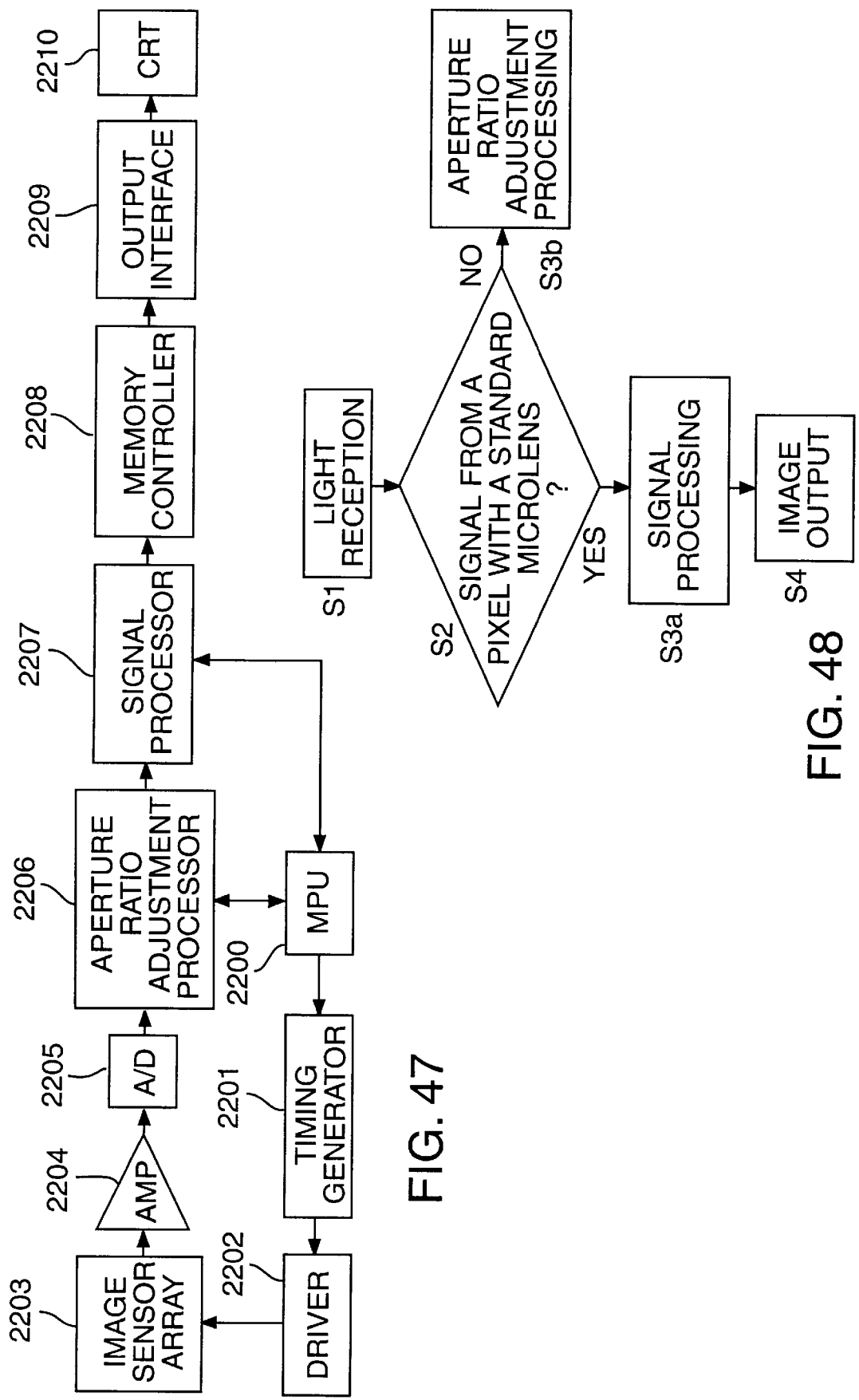

SOLID-STATE IMAGING DEVICE

This application is a continuation-in-part of U.S. patent application Ser. No. 09/152,138, filed Sep. 10, 1998.

FIELD OF THE INVENTION

The present invention relates to solid-state imaging devices and photoelectric conversion devices used therein, particularly to image capturing apparatus and image sensor arrays useful in such apparatus for capturing fixed images as in digital photography and the like.

BACKGROUND OF THE INVENTION

Photoelectric conversion devices using photodiodes as photoelectric conversion elements for generating signal charges corresponding to incident light are known in the art. An example of such a photoelectric conversion device is disclosed in, for example, Japanese Laid-Open Patent Application No. 8-293591, which is the subject of U.S. patent application Ser. No. 08/606,995, assigned to the assignee of the present application.

FIGS. 49, 50, and 51 of the present application show the structure of a photoelectric conversion device as disclosed in Japanese Laid-Open Patent Application No. 8-293591. FIG. 49 is a plan view of a photoelectric conversion device 110, FIG. 50 is a cross-sectional view taken along the line X—X shown in FIG. 49, and FIG. 51 is a cross-sectional view taken along the line Y—Y shown in FIG. 49.

As shown in FIGS. 49–51, the photoelectric conversion device 110 comprises as basic elements a photodiode 111 for generating and accumulating a charge corresponding to the incident light; a junction field-effect transistor (JFET) 112 for outputting an electric signal Vout corresponding to the signal charge received by its gate region 112A; a transfer transistor 113 for supplying (or transferring) the signal charge generated by and accumulated in the photodiode 111 to the gate region 112A of the JFET 112; and a reset transistor 114 for removing the signal charge supplied to the gate region 112A of the JFET 112.

FIG. 52 is a circuit diagram including the photoelectric conversion device 110 shown in FIG. 51 and a signal detection circuit 1190 connected to the photoelectric conversion device 110. FIG. 53 is a timing chart showing the waveforms of a driving pulse TG supplied to the transfer transistor QTG (113), a driving pulse φRSG supplied to a gate 114C of the reset transistor QRSG (114), and a driving pulse φRSD supplied to a reset drain 114B of the reset transistor QRSG (114), together with the waveform of the electric signal Vout occurring at the source (node N1) of the JFET 112.

For the sake of convenience, the operation of the photoelectric conversion device 110 will be described beginning from the point in time t10. The driving pulse φRSG changes from a high level to a low level at t10, which causes the reset transistor QRSG to be turned on. While the reset transistor QRSG is turned on, the driving pulse φRSD reaches a readout level (a constant voltage VGH), and this constant voltage VGH is applied to the gate region 112A of the JFET 112 via the drain of the reset transistor QRSG.

The electric signal Vout occurring at the node N1 then becomes the reference signal voltage VD, which corresponds to a dark output.

At t11, the driving pulse φRSG becomes high, which causes the reset transistor QRSG to be turned off, and the voltage of driving pulse φRSD becomes a low level (VGL).

At this time, although the gate region 112A of the JFET 112 is now in a floating state, the level of the electric signal Vout occurring at the node N1 remains at VD.

At t12, the driving pulse φRSG returns to the low level again, and the reset transistor QRSG is turned on. Also at t12, the driving pulse φRSD returns to the readout level (the constant voltage VGH), and this constant voltage VGH is applied to the gate region 112A of the JFET 112 via the drain of the reset transistor QRSG.

At t13, the driving pulse φRSG becomes high, which causes the reset transistor QRSG to be turned off, putting the gate region 112A of the JFET 112 in a floating state.

At t14, the driving pulse φTG becomes low, turning on the transfer transistor QTG, whereby the signal charge generated and accumulated in the photodiode 111 corresponding to the incident light is supplied to the gate region 112A of the JFET 112. When the JFET 112 receives the signal charge from the photodiode 111, the source voltage Vout (that is, the electric signal Vout occurring at the node N1) becomes a signal voltage Vs corresponding to the signal charge supplied to the gate region 112A, which signal charge corresponds to the incident light.

At t15, the driving pulse φTG is inverted to the high level, and the photodiode 111 begins again generating and accumulating a signal charge.

At t20, the driving pulse φRSD becomes high and the driving pulse φRSG becomes low and, then, the electric signal Vout occurring at the node N1 becomes the reference signal voltage VD, which corresponds to the dark output.

The two electric signals VD and Vs occurring at the node N1 at different points in time are output to the signal detection circuit shown in FIG. 52. One of these two signal values (for example, VD) is stored and held in a sample-and-hold circuit 1191, and a difference calculation circuit 1192 subtracts this stored value VD from the other electric signal Vs, and outputs a photosignal Vp which does not contain the dark output component VD.

By removing the noise component VD (which results from, for example, fluctuation) from the electric signal Vs in the signal detection circuit 1190, a photosignal Vp is obtained, whereby the photoelectric conversion device 110 can detect the incident light with high accuracy.

In order to block light, the semiconductor area of the photoelectric conversion device 110, except for the photodiode 111, is covered with a reset drain interconnection (i.e., an aluminum interconnection) 1148 (indicated by the region of wide-spaced diagonal top-left to bottom-right hatching in FIG. 49) which is connected to the drain of the reset transistor QRSG.

Other features of the photoelectric conversion device 110 are described in more detail in the detailed description below. These include a P-type semiconductor substrate 1101, an N-type layer 1102, an N$^+$-type layer 1103, an insulating layer 1109, a P-type impurity diffusion layer 1121, a vertical signal line 1128, a transfer gate interconnection 1138, a reset gate interconnection 1147, and a transfer gate 113C. These features correspond to features in the example embodiments of the invention with similar reference characters (reference characters identical except for the second digit). The functions of, and relationships between, these features are the same as those described for corresponding features in the example embodiments of the invention below.

FIG. 54 shows a single pixel of a fixed-image image sensor array in which a known photoelectric conversion element similar to that of FIG. 49 is designed and structured for use as a pixel in a two-dimensional array of like pixels. FIG. 54(a) is a plan view, FIG. 54(b) is a cross-sectional view taken along the line X19–X20 in FIG. 54(a), and FIG. 54(c) is a cross-sectional view taken along the line Y19–Y20 in FIG. 54(a).

The structure of the pixel of FIG. 54 is formed on a P-type semiconductor substrate 10 upon which an N-type semiconductor layer 11 is formed. A photodiode 1 functions to accumulate charge in response to incident light. A transfer gate 3 functions as part of a transfer transistor to transfer accumulated charge from the photodiode 1 to an amplification transistor in the form of a JFET 2, specifically, to a gate area 15 of the JFET 2. A reset gate 5 functions as part of a reset transistor in the form of a P-channel MOSFET 9, positioned to selectably electrically connect the gate area 15 with a reset drain 4. The reset gate 5, together with the gate area 15 and the reset drain 4 as major electrodes, forms the P-channel MOSFET 9.

The photodiode 1 comprises a P-type diffusion region 12 with a high-density N$^+$-type region 13 overlying the region 12. The JFET 2 comprises a P-type gate region 15 sandwiching an N-type channel region 17, and a high-density N$^+$-type source region 14. High-density N$^+$-type diffusion regions serve as pixel isolation regions 16 and as a drain region for JFET 2.

A vertical signal line 22 connects the source regions 14 of JFETs 2 in one column of the array. Drain interconnect 25, through drain contact holes 32, provides a low-resistance conduction path for removing charges from and controlling the potential of the drain and pixel isolation/drain region 16. Transfer gate interconnect 20 controls the transfer gates 3 in one row of the array. Similarly, reset gate interconnect 21 controls the reset gates 5 in one row of the array. Reset drain interconnect 24, via contact 31, relay 23, and relay contact 30, controls the potential of the reset drains 4 in one row of the array. Reset drain interconnect 24 also functions as a light shield over JFET 2 and reset drain 4, shielding them from exposure to incoming radiation, while leaving photodiode 1 exposed. An insulating dielectric layer 33 supports and isolates the various interconnections and signal lines.

FIG. 55 is a circuit diagram showing an existing fixed image capture apparatus with the single pixels shown in FIG. 54 arranged in a two-dimensional matrix (m×n). The area of FIG. 55 surrounded by the dashed line is the single pixel equivalent circuit.

Each JFET 2 source area 14 (indicated by "S" in FIG. 55), is connected mutually in each matrix column by vertical signal lines 22-1 through 22-n (corresponding to vertical signal line 22 in FIG. 54).

Each JFET 2 drain area 16 (D) is connected to drain power source VDD, which is shared for all pixels, via a diffusion layer formed continuously along all the seams of the web that constitutes the previously discussed N-type drain area 16 and via the drain interconnect 25.

Transfer gate 3 is connected in common in the horizontal scan direction to each row of the matrix by transfer gate interconnects 20-1 through 20-m (corresponding to transfer gate interconnect 20 in FIG. 54) and is connected to vertical scan circuit 7. In addition, each row is driven by drive pulses φTG1 through φTGm provided from vertical scan circuit 7.

Reset gate 5 is connected in common to each row of the matrix in the horizontal scan direction by reset gate interconnects 21-1 through 21-m (corresponding to reset gate interconnect 21 in FIG. 54), and is connected to vertical scan circuit 7. In addition, each row is driven by drive pulses φRSG1 through φRSGm provided from vertical scan circuit 7.

Reset drain 4 is connected in common to each matrix row in the horizontal scan direction (row direction) by reset drain interconnects 24-1 through 24-m (corresponding to reset drain interconnect 24 in FIG. 54), and is connected to vertical scan circuit 7. In addition, each row is driven by drive pulses (drive signals to discharge the charge from JFET2 gate area 15 and to control the potential of said gate area 15) φRSD1 through φRSDm sent from vertical scan circuit 7.

Vertical signal lines 22-1 through 22-n are connected on one hand to constant current sources 26-1 through 26-n. This permits constant current to flow from constant current sources 26-1 through 26-n, thereby forming a source-follower circuit between JFET4 and constant current sources 26-1 through 26-n. The output side of these source-follower circuits (the opposite end of the vertical signal lines 22-1 through 22-n) are connected to sort-processing circuits 27-1 through 27-n, which serve respectively as read circuits. Sort-processing circuits 27-1 through 27-n comprise capacitors 28-1 through 28-n and MOSFET switches 29-1 through 29-n. The gates of switches 29-1 through 29-n are connected in common so as to be activated by pulse φN. The outputs of sort-processing circuits 27-1 through 27-n are connected to signal-output line 34 via horizontal-select switches 39-1 through 39-n. Horizontal-select switches 39-1 through 39-n are activated in sequence by pulses φH1 through φHn sent from horizontal scan circuit 8, and the output from the sort processing circuits 27-1 through 27-n is output in sequence to signal the output line 34. This output is fed by output line 34 to output amp 35 for amplification and final output. Output signal line 34 is grounded (reset) by switch 36. The switch 36 is activated by a pulse φRH.

With the continuing improvement of semiconductor design and fabrication technologies, the number of pixels in image sensor arrays has increased as pixel size has decreased, but the ratio of light-sensitive surface area to total light-receiving surface area, or aperture ratio, has tended to decline.

To improve the effective aperture ratio of image sensor arrays, on-chip microlenses have been developed. The microlenses collect and focus onto a photosensitive element light from an area larger than the photosensitive element itself. This increases the effective aperture ratio, or the proportion of the image area that is sensitive to light.

Microlens technology has been described in Japanese Patent H9-64325, for example. In the type of fixed-image image sensor array described therein, the area outside a photodiode that serves as a photoelectric conversion element is shielded by a shielding film formed on the array. Only information related to the light entering the photoelectric conversion element during the specified exposure time interval is output outside the array.

FIG. 56 illustrates part of the structure of a fixed-image image CCD-type sensor array equipped with microlenses of this known type. FIG. 56(a) is a plan view of the surface, while FIG. 56(b) is a cross-sectional view taken along the line A-A' in FIG. 56(a). The structure shown in FIG. 56 comprises a vertical electrode 2401, a photodiode 2402, a microlens 2403, an Al (aluminum) light-shielding film 2404, a photodiode N-type semiconductor area 2405, a photodiode P-type semiconductor area 2406, a vertical N-type semiconductor area 2407, and a vertical P-type semiconductor area 2408. The area 2400 indicated by the dashed line in FIG. 56(a) corresponds to a single pixel.

Light entering from the outside is focused onto the photodiode 2402 by the microlens 2403, which, in effect, increases the aperture ratio, the ratio of the light-sensitive surface area to total surface area.

Fixed-image image sensor arrays are typically exposed to a given image for a predetermined exposure interval. But whenever there is a sudden change during the exposure interval in the amount of incoming light, it becomes impossible to read out image information with optimal exposure. Generally this is dealt with by including a mechanical shutter apart from the fixed-image image sensor array, with the quantity of incoming light adjusted by controlling the open-close timing of the shutter. An exposure control sensor capable of monitoring changes in incoming light volume during exposure is typically included. Such a sensor does not monitor the response of the image-sensing array to the incoming light, but rather monitors the incoming light separately from the photosensitive elements of which the image sensor array is comprised.

One goal in the design of a photoelectric conversion apparatus is to improve the exposure control so that optimal exposure is a achieved even when light levels fluctuate significantly during the exposure time.

Another goal in the design of a photoelectric conversion apparatus is to increase the light-receiving area (e.g., the size of the photodiode 111) in each pixel (i.e., in each photoelectric conversion device 110), and to increase the effective light-receiving area.

In the conventional photoelectric conversion device 110, the signal charge generated by the photodiode 111 according to the incident light is amplified by the transistor 112 to generate an electric signal Vout. In order to provide for the amplification function, the transistor 112 and the reset transistor 114 are included, in addition to the photodiode 111, in each pixel (i.e., in each individual photoelectric conversion device). Since the amplification transistor 112 and the reset transistor 114 require a certain amount of space, this limits the maximum size of the photodiode 111 within a pixel.

A third goal in the design of photoelectric conversion devices is to obtain a sufficient amount of the spectral characteristics (i.e., color information) of the incident light when detecting the light using a photoelectric conversion apparatus.

A known example of the use of a photoelectric conversion apparatus is in photometry, which is a method for measuring the properties of an object by emitting light having a specific wavelength toward the object and then detecting the light radiated from that object.

For example, in order to perform photometry using blue light having a specific wavelength, said blue light is emitted toward an object, and the intensity of the light radiated from that object is detected. This radiation contains the blue light component and other light components having wavelengths longer than that of the original blue light. The spectral components of this radiation are detected and analyzed. However, the conventional photoelectric device can detect only a narrow range of spectral components, using a color filter of a specific color.

OBJECTS AND SUMMARY OF THE INVENTION

It is an object of the present invention to overcome the problems in the prior art and to provide photoelectric conversion devices and image sensor arrays comprised thereof and image capture apparatus employing such arrays, which allow a sharp image to be stably obtained despite changes in the brightness of the surroundings. This is achieved by automatically adjusting the exposure time in accordance with the environment in which the photoelectric conversion apparatus is placed.

It is another object of the invention to increase the light-receiving area and/or effective light-receiving in each pixel in order to improve the efficiency of the photoelectric conversion, and to allow a sharp photosignal to be obtained with a low quantity of light.

It is still another object of the invention to provide photoelectric conversion devices and photoelectric conversion apparatus which can efficiently detect a wide range of wavelengths of incident light according to its spectral components.

In order to achieve these objects, the present invention encompasses a light-receiving device, useful as a pixel element in a photodetector array. The device includes a light-receiving element that generates, in response to incident light, a first signal charge corresponding to the incident light. The light-receiving element is preferably a photodiode. The device further includes at least a first transistor structured and arranged such that at least a first electrode thereof itself generates, in response to incident light, a second signal charge corresponding to the incident light.

The first and second signal charges may be combined (added together, summed) for output, or may be output individually from the device. If the signal charges are added, the effective light gathering area and the corresponding light gathering power of the device is increased. If the signal charges are output or detected individually, the use of color filters allows increased spectral information to be detected by a single device. Color filters may also be used without separate output to allow detection of—and/or exposure monitoring based on—specific wavelengths.

The accumulation of the second signal charge may be monitored during exposure, so that a shutter may be closed after a desired exposure is reached. Alternatively, the first electrode of the first transistor may be electrically connected to the light-receiving element during exposure, so that the first and second signal charges are combined even as they are generated, allowing direct monitoring of the entire signal charge in order to control the exposure time.

The first transistor may be an amplification transistor having a control electrode (gate), and functioning in the device as part of an output unit for providing an output signal corresponding to charge present at the control electrode. The control electrode may be the first electrode of the first transistor. The device may include a transfer unit, preferably in the form of a transfer transistor, for transferring the first signal charge to the control electrode. The transfer unit may be supplied with control signals so as to allow individual or combined output and/or monitoring of the first and second signal charges.

The device may also include a second transistor structured and arranged such that at least a first electrode thereof itself generates, in response to incident light, a third signal charge corresponding to the incident light. The first, second, and third signal charges may be combined all together or in a subcombination for output, or may be output individually. Combined output increases the light-gathering area of the device. Separate output, with the use of color filters, allows increased detection of spectral content of the incident light. The second and third signal charges may also be simultaneously monitored during exposure, with accumulation of either charge being able to trigger the end of the exposure upon reaching a respective predetermined level.

The second transistor may be a reset transistor, and the first electrode of the second transistor may be a drain electrode of the reset transistor. The device may include the provision of control signals to the reset transistor such that the third signal charge, generated in the drain electrode of the reset transistor, is output from via the drain electrode of the reset transistor, either alone, or combined with the second signal charge. Alternatively, the third signal charge may be output via the control electrode of the amplification transistor, either separately from or combined with both or either of the first and second signal charges.

Alternatively to the first transistor being an amplification transistor, the first transistor may be a reset transistor, and the first electrode may be a drain electrode of the reset transistor. The device may then include the provision of control signals to the reset transistor such that the second signal charge, generated in the drain electrode of the reset transistor, is output separately from the first signal charge via the drain electrode of the reset transistor, or is output via a control electrode of an amplification transistor, either separately from, or combined with, the first signal charge.

The present invention also encompasses photoelectric conversion apparatus including one or more devices as described above, a shutter, and a shutter controller for controlling an exposure time based on the monitored accumulation of a signal charge in the one or more devices.

The present invention also includes photoelectric conversion apparatus having an amplification transistor, the amplification transistor being on only intermittently, rather than being constantly on, so as to consume less power while still functioning to provide an output signal corresponding to a charge present at its gate.

The present invention also includes image sensor arrays formed at least in part of pixels comprising the inventive photoelectric conversion devices. Specifically, the fixed-image image sensor array includes a regular array of pixels formed on the same silicon substrate, with at least one pixel having both a first photosensitive surface and a second photosensitive surface, each surface being capable of providing an output signal, independent of the other's output. The image sensor array is typically a two-dimensional rectangular or square array, but may also be "one-dimensional" (i.e., rectangular with one-pixel width).

The image sensor array typically also includes pixels having only one photosensitive area. Signals from pixels having only one such area and signals from the first photosensitive area(s) of the multi-photosensitive-area pixel(s) are both read out in the normal fashion via an amplifier in the form of a JFET. Signals from the second photosensitive area(s) may also be read out via the JFET, but in the main embodiments are read out via reset drain interconnects. The second photosensitive area(s) can comprise at least a portion of the reset drain of the associated first pixel.

The second photosensitive area(s) may be permanently electrically connected to the reset interconnection(s), or may be intermittently and selectably connected to the reset interconnection(s). Selective connection may be accomplished via inter-pixel MOSFETs that connect a second photosensitive area to an area (a JFET gate area) of an adjacent pixel, which is in turn connected, via one or more additional MOSFETs, to a reset drain connected to a reset drain interconnection.

The image sensor array may also be provided with a switch associated with each reset drain interconnect. The switch is so arranged as to be able to switch between two states: a first state in which a driving pulse is supplied to the reset drain interconnection and a second state in which an output signal may be read from the reset drain interconnection.

The image sensor array of the present invention may further be provided with on-chip microlenses designed and structured particularly to allow for use of the second photosensitive area.

Each first pixel of the array and each second pixel of the array may have a an on-chip microlens to focus incident light on the first photosensitive area of said first pixel and on the one and only photosensitive area in the second pixel. The microlens on each type of pixel may be identical or different, but in either case is shaped to avoid obscuring the second photosensitive area. If more than one type of microlens is used in the array, the microlens on the firs pixel may be smaller than the others. A microlens on a second pixel adjacent the first pixel may also be smaller than the others to avoid obstructing light incident to the second photosensitive area. The microlenses may be hemispherical, cylindrical, or toric in shape. Identical microlenses may be used on every pixel, with a hole cut in the lens material only over the second photosensitive surface(s), or such holes may be made over every pixel, regardless of any photosensitive surfaces underneath. In either case, the hole(s) may have sidewalls with a reflective layer positioned thereon to inhibit cross-talk. In addition to any other microlenses, a microlens may be provided for the second photosensitive area to increase the light gathering power of that surface, increasing the low-light sensitivity of the exposure control process.

The image sensor array may be provided with an aperture ratio compensator, particularly where different microlenses are used on different pixels within the array. The compensator adjusts the signals from the pixels so as to cancel differences in the signal levels attributable to differing effective aperture ratios.

The invention also includes a fixed-image image capture apparatus including a light control device to control the exposure duration of an image sensor array based on the light incident during the exposure on the second photosensitive surface(s). The light control device can control the exposure duration by operating a shutter, or by operating a strobe light, to start and stop the exposure at the appropriate times.

More particular summary of various particular photoelectric conversion devices of the present invention will now be given. Such devices are useful as pixels in image sensor arrays.

In one aspect of the invention, a first respresentative embodiment of a photoelectric conversion device comprises a photoelectric conversion element for generating in response to incident light; a first signal charge, corresponding to the incident light; an output unit comprising an amplification transistor with a control electrode for outputting an electric signal corresponding to charge present in the control electrode; a transfer unit for supplying the signal charge generated by the photoelectric conversion element to the control electrode; and a signal line for supplying a control signal to the transfer unit.

As a feature of the device according to this aspect of the invention, the amplification transistor is designed so that the control electrode itself generates, in response to incident light, a second signal charge corresponding to the incident light. Also, the control signal is supplied to the transfer unit to transfer the first signal charge to the control electrode such that the first and second signal charges are combined in the control electrode, so that the output unit outputs an electric signal corresponding to the sum of the first and second signal charges. Alternatively, the control signal is supplied to the transfer unit to transfer the first signal charge to the control electrode such that the first and second signal charges are present individually and successively in the control electrode, so that the output unit outputs an output signal corresponding to the first signal charge and another output signal corresponding to the second signal charge.

In this first aspect of the invention, the second signal charge generated by the control electrode of the amplification transistor may be added to the first signal charge generated by the photoelectric conversion element, and an electric signal corresponding to the sum of them may be output. This arrangement allows the area which is capable of photoelectric conversion to be increased in each of the photoelectric conversion devices (i.e., in each pixel) and, as a result, the photoelectric conversion efficiency is improved.

An output signal corresponding to the second signal charge may be monitored as the second signal charge accumulates, regardless of whether the first and second signal charges are combined for output. Accordingly, the brightness of the surroundings can be monitored based on the second signal charge and the amount of signal charge being generated in the photoelectric conversion element can be estimated based on the monitoring result. As a further alternative, the first and second signal charges may be combined at the control electrode even as they are accumulating, so that the total accumulated charge may be monitored via an output signal from the output unit.

The amplification transistor of the output unit is preferably a field-effect transistor.

A color filter of a specific color may be installed above the light-receiving surface of the control electrode of the amplification transistor and/or above the light-receiving surface of the photoelectric conversion element. Also, color filters of different colors may be installed above the light-receiving surfaces of the control electrode of the amplification transistor and the photoelectric conversion element. This affords various possibilities for monitoring exposure based on specific color components, and for imaging based on specific color components.

By using a color filter of a specific color, the spectral component of that specific wavelength is detected by the photoelectric conversion element, while the control electrode of the amplification transistor detects light having the same or a wider range of wavelength in order to monitor the quantity of signal charge generated by the photoelectric conversion element.

If two color filters having different colors are used, the photoelectric conversion element detects the spectral component of one of the specific wavelengths (colors), while the control electrode of the amplification transistor detects the spectral component of the other specific wavelength. This arrangement allows the intensities of light components having specific wavelengths to be detected based on the spectral characteristics (i.e., color information) of the incident light.

In another aspect of the invention, a second representative embodiment of a photoelectric conversion apparatus comprises one or more of the photoelectric conversion devices described above, a shutter, and a controller for controlling the timing of the shutter based on the signal charge generated by the control electrode of the amplification transistor, in order to adjust the time during which the photoelectric conversion element generates a charge. The desired exposure level for the photoelectric conversion elements may thus be estimated based on the monitored accumulation of second signal charges.

In still another aspect of the invention, a third representative embodiment of a photoelectric conversion apparatus comprises one or more of the photoelectric conversion devices described above, a shutter, and a controller for controlling the timing of the shutter based on the sum of the second signal charge generated by the control electrode of the amplification transistor and the first signal charge generated by the photoelectric conversion element, in order to adjust the time during which the photoelectric element generates a charge. The desired exposure level of the photoelectric conversion elements may thus be monitored directly, and the shutter may be closed when the desired level is reached.

In another aspect of the invention, a fourth representative embodiment of a photoelectric conversion device comprises a photoelectric conversion element for generating, in response to incident light, a first signal charge corresponding to the incident light; an output unit comprising an amplification transistor with a control electrode for outputting an electric signal corresponding to charge present in the control electrode; a transfer unit for transferring the signal charge generated by the photoelectric conversion element to the control electrode; a reset transistor for removing from the control electrode the charge present in the control electrode; and signal lines for providing control signals to both the reset transistor and the transfer unit.

As a feature of this aspect of the invention, the reset transistor is designed so that at least one of its main electrodes generates, in response to incident light, a second signal charge corresponding to the incident light. Further, the control signals are provided to the reset transistor and the transfer unit such that the transfer unit transfers the first signal charge to the control electrode so that an output signal corresponding to the first signal charge is output by the output unit, and so that the second signal charge is output from the at least one of the main electrodes of the reset transistor.

The second signal charge need not be output from the at least one of the main electrodes of the reset transistor. Instead, the control signals can be provided to the transfer unit and the reset transistor such that the first and second signal charges are both transferred to the control electrode, either so as to be individually and successively present at the control electrode, or so as to be combined at the control electrode. Output signals corresponding to the first and second signal charges (individually or combined [added together], as the case may be) are thus output by the output unit.

If the selected main electrode (that is, the said one of the main electrodes) is used to output a signal charge, it may be connected to a first transistor for outputting the signal charge, and to a second transistor for applying a prescribed voltage to this main electrode.

The reset transistor is preferably a MOS transistor.

If the first and second charges are combined, the light-sensitive area in each photoelectric device (each pixel) of a photoelectric apparatus may be increased. If the first and second charges are output separately, they may be used to monitor the spectral content of the incident light, by the use of color filters.

A color filter of a specific color may be installed above the light-receiving surface of the said one of the main electrodes of the reset transistor and/or above the light-receiving surface of the photoelectric conversion element. Also, color filters having different colors may be installed above the light-receiving surfaces of the said one of the main electrodes of the reset transistor and the photoelectric conversion element. Use of such filters allows the advantages mentioned above for embodiments having such filters.

In yet another aspect of the invention, a fifth representative embodiment of a photoelectric conversion apparatus comprises one or more of the photoelectric conversion devices having a reset transistor as described above, a shutter unit, and a controller for controlling the timing of the shutter unit based on the second signal charge generated by the said one of the main electrodes of the reset transistor, in order to adjust the time during which the photoelectric element generates a charge. The desired exposure level for the photoelectric conversion elements of the photoelectric conversion devices may thus be estimated by monitoring the accumulation of the second signal charges in the said ones of the main electrodes of the reset transistors.

In still another aspect of the invention, a sixth representative embodiment of a photoelectric conversion device comprises a photoelectric conversion element for generating, in response to incident light, a first signal charge corresponding to the incident light; an output unit comprising an amplification transistor with a control electrode for outputting an electric signal corresponding to charge present at the control electrode; a transfer unit for transferring the signal charge generated by the photoelectric conversion element to the control electrode; a reset transistor for removing, from the control electrode, the charge present at the control electrode; and signal lines for providing control signals to both the reset transistor and the transfer unit.

In this aspect of the invention, the amplification transistor is designed so that the control electrode generates, in response to incident light, a second signal charge corresponding to the incident light. The reset transistor is designed so that at least one of its main electrodes generates, in response to incident light, a third signal charge corresponding to the incident light.

Control signals are supplied to the transfer unit and to the reset transistor such that the first signal charge is transferred to the control electrode so that the output unit outputs a signal corresponding to the first signal charge, and such that the second signal charge is transferred to the at least one of the main electrodes of the reset transistor for output from the at least one of the main electrodes, either separately, or combined with (added to), the third signal charge.

The control signals may be supplied to the transfer unit and to the reset transistor such that the second and first signal charges are output, either together or individually, via the control electrode and the output unit, and such that the third signal charge is output via the at least one of the main electrodes of the reset transistor.

The first, second, and third signal charges may all be transferred to the control electrode for output via the output unit, all together (all combined or added at the control electrode), all individually, or in any desired subcombination.

In the embodiments in which first, second, and third signal charges are generated, a color filter of a specific color may be installed above at least one light-receiving surface from among the light-receiving surfaces of the control electrode of the amplification transistor, the one of the main electrodes of the reset transistor, and the photoelectric conversion element. Also, color filters of different colors may be installed above any two or all three of the light-receiving surfaces of (1) the control electrode of the amplification transistor, (2) the one of the main electrodes of the reset transistor, and (3) the photoelectric conversion element.

In yet another aspect of the invention, a seventh representative embodiment of a photoelectric conversion apparatus comprises (1) one or more of the photoelectric conversion devices, described above, that generate first, second and third signal charges, (2) a shutter, and (3) a controller for controlling the timing of the shutter based on the second signal charge generated by the control electrode of the amplification transistor, or based on the third signal charge generated by the said one of the main electrodes of the reset transistor, or both, in order to adjust the time during which the photoelectric conversion element generates a charge.

The controller preferably closes the shutter when the electric signal output from the output unit (corresponding to the accumulated second signal charge) exceeds a first prescribed value, or when the third signal charge output from the said one of the main electrodes of the reset transistor exceeds a second prescribed value, whichever is first, thereby adjusting the time during which the photoelectric conversion element generates a charge.

The above and other objects, features, and advantages of the present invention will be apparent from the detailed description given below by way of non-limiting exemplary embodiments of the present invention, with reference to the following drawings:

BRIEF DESCRIPTION OF THE DRAWINGS

FIG. 6 is a timing chart showing the waveforms of driving pulses φTG, φRSG, and φRSD which are supplied to the photoelectric conversion device 120 of FIG. 1.

FIG. 7 is a timing chart showing the waveforms of driving pulses φTG, φRSG, and φRSD which are supplied to the photoelectric conversion device 120 of FIG. 1 in the presence of higher-intensity incident light.

FIG. 25 shows an example embodiment of a single pixel of an image sensor array useful in the context of the present invention.

FIG. 27 shows another example embodiment of a single pixel of an image sensor array useful in the context of the present invention. FIG. 27(a) is a plan view, FIG. 27(b) is a cross-sectional view taken along the line X3–X4 in FIG. 27(a), and FIG. 27(c) is a cross-sectional view taken along the line Y3–Y4 in FIG. 27(a).

FIG. 29 shows another example embodiment of a single pixel of an image sensor array useful in the context of the present invention.

FIG. 33 shows still another example embodiment of a single pixel of an image sensor array useful in the context of the present invention.

FIG. 33(c) is a cross-sectional view taken along the line Y15–Y16 in FIG. 30(a).

FIG. 43 shows an example embodiment of on-chip microlenses for use with the present invention. FIG. 43(a) is a plan view, and FIG. 43(b) is a cross-sectional view taken along the line A-A' in FIG. 43(a).

FIG. 44 shows another example embodiment of on-chip microlenses for use with the present invention. FIG. 44(a) is a plan view, and FIG. 44(b) is a cross-sectional view taken along the line A-A' in FIG. 44(a).

FIG. 46 shows still another example embodiment of on-chip microlenses for use with the present invention.

FIG. 47 is a schematic diagram of an aperture-ratio compensation system for use in the present invention.

FIG. 48 is a flow diagram illustrating the basic operation of the system of FIG. 47.

FIG. 54 (prior art) shows a conventional pixel similar to that of FIG. 49, but structured and arranged to be part of a two-dimensional matrix of such pixels in an image sensor array.

FIG. 56 (prior art) shows know microlenses as employed on a CCD-type image sensor array.

DETAILED DESCRIPTION

Photoelectric Conversion Device Example Embodiment 1

The first example embodiment of the invention is described below with reference to FIGS. 1 through 7.

Figure 1:
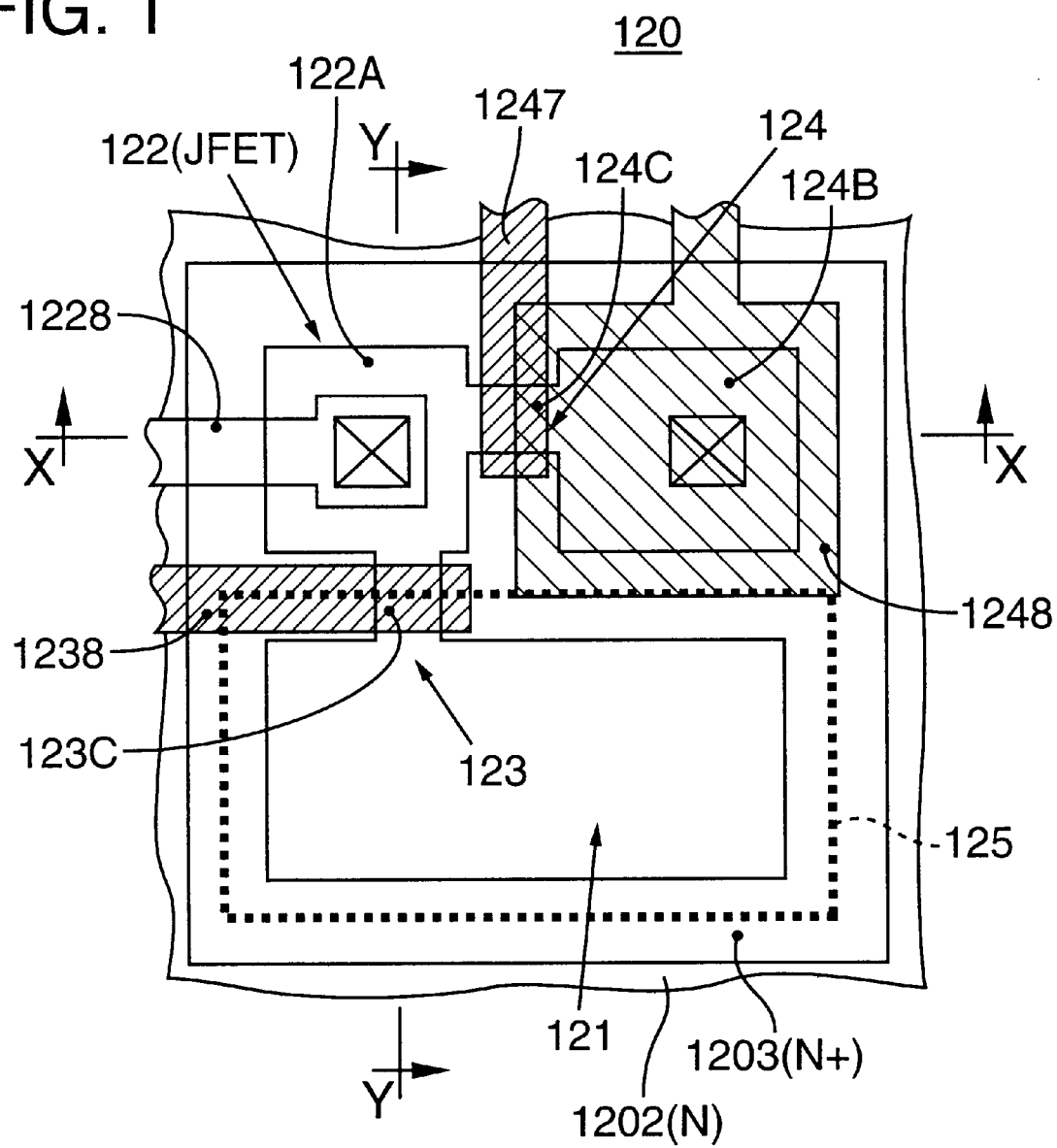
FIG. 1 is a plan view of a photoelectric conversion device 120 according to a first embodiment of the invention.
Figure 2:
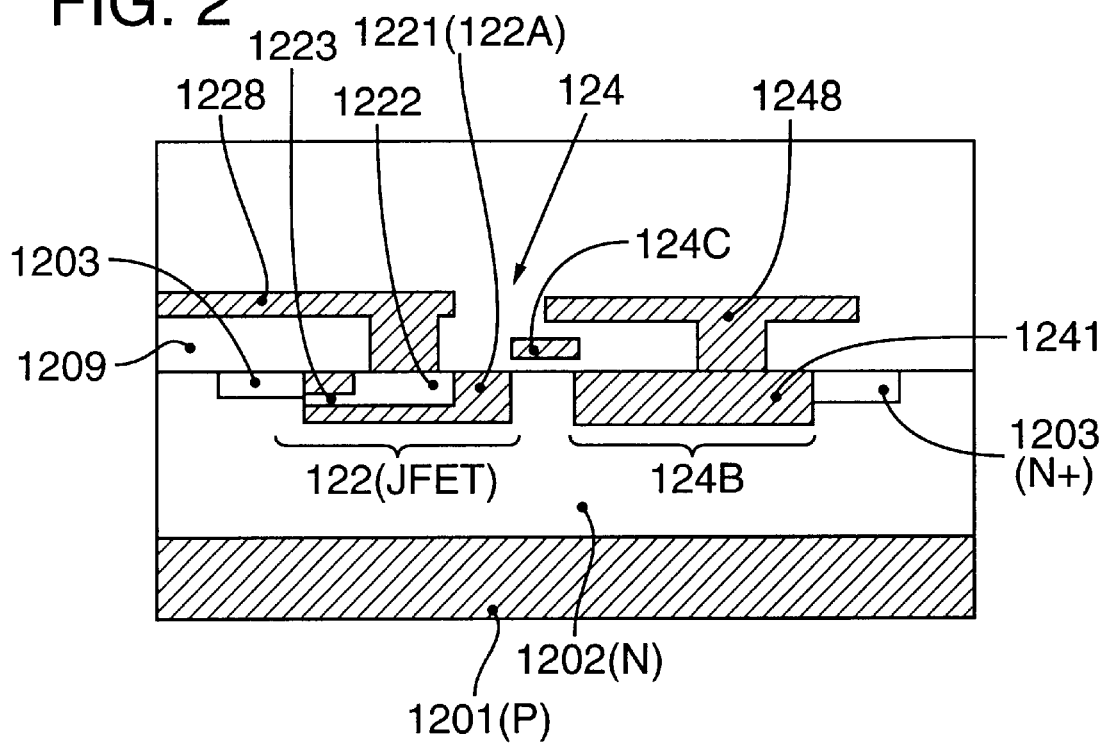
FIG. 2 is a cross-sectional view taken along the line X—X shown in FIG. 1.
Figure 3:
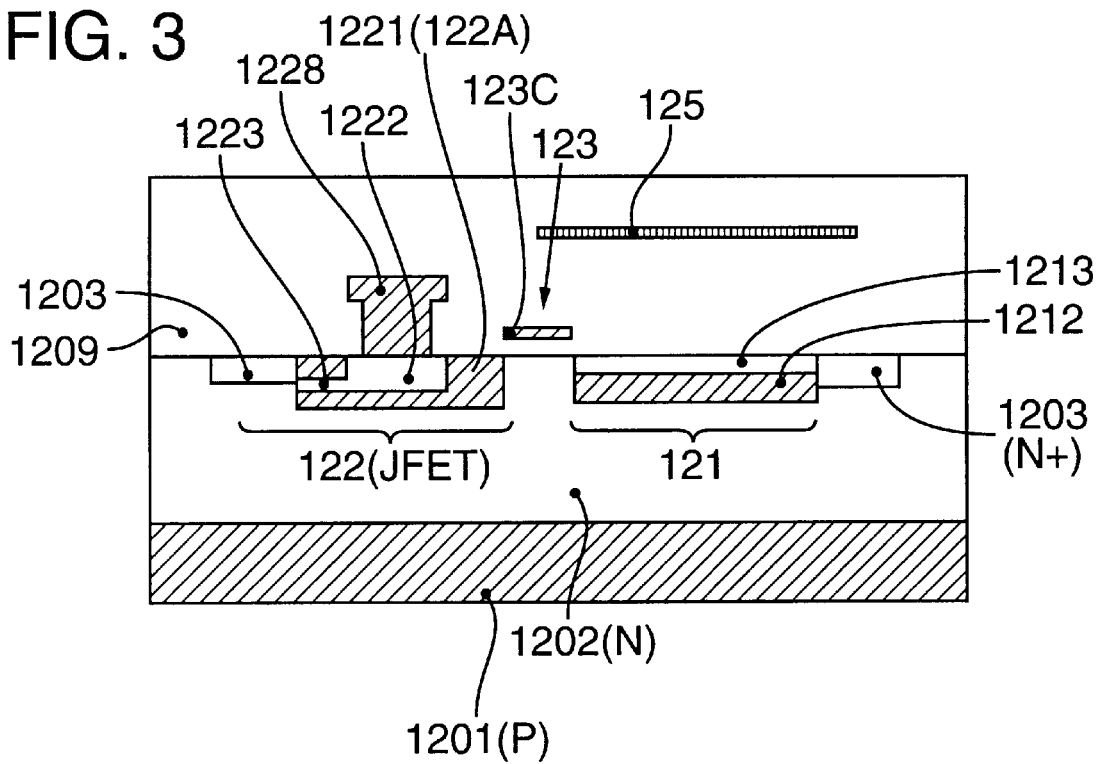
FIG. 3 is a cross-sectional view taken along the line Y—Y shown in FIG. 1.
Figure 4:
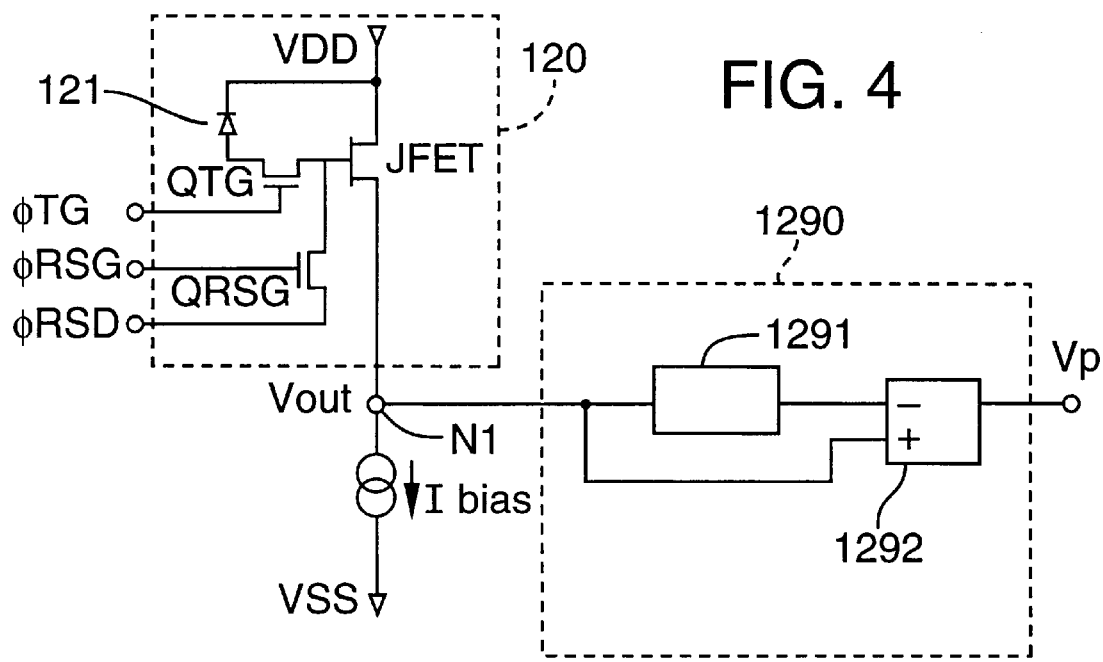
FIG. 4 is a circuit diagram showing the photoelectric conversion device 120 and a signal detection circuit 1290.
Figure 5:
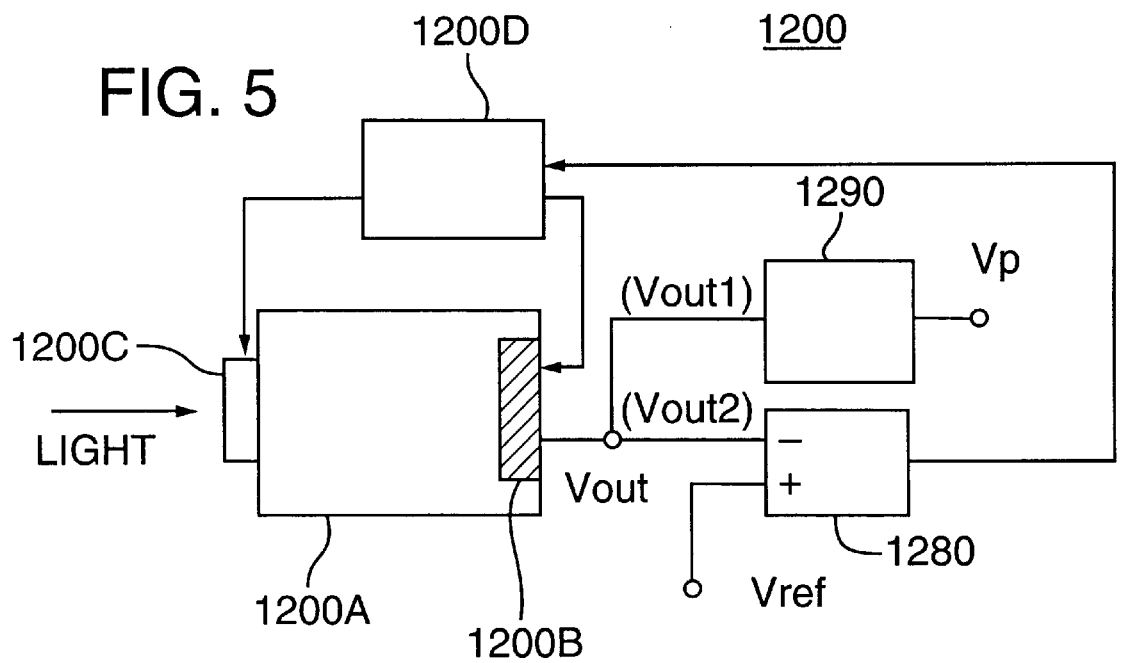
FIG. 5 is a schematic block diagram of a photoelectric conversion apparatus 1200 which uses the photoelectric conversion device 120 as a light-receiving device 1200B.

The structure of the photoelectric conversion device 120 according to the first embodiment is shown in FIGS. 1 through 3, where FIG. 1 is a plan view, FIG. 2 is a cross-sectional view taken along the line X—X shown in FIG. 1, and FIG. 3 is a cross-sectional view taken along the line Y—Y shown in FIG. 1. FIG. 4 is a circuit diagram showing the photoelectric conversion device 120 and a signal detection circuit 1290 connected to the photoelectric conversion device 120. FIG. 5 is a schematic block diagram of a photoelectric conversion apparatus 1200 which uses the photoelectric conversion device 120 as a light-receiving device 1200B, and FIGS. 6 and 7 are timing charts that may be used to explain the operation of the photoelectric conversion device 120.

The photoelectric conversion device 120 comprises a photodiode (i.e., a photoelectric conversion element) 121 for generating a signal charge corresponding to the incident light; a junction field-effect transistor (i.e., an amplification transistor; referred to as a JFET) 122 for outputting an electric signal (Vout) according to the signal charge supplied to its gate region (i.e., a control electrode) 122A; a P-type transfer transistor 123 (i.e., a transfer unit) for supplying or transferring the signal charge generated and accumulated in the photodiode 121 to the gate region 122A; and a P-type reset transistor 124 for removing the signal charge supplied to the gate region 122A. In this photoelectric conversion device 120, the JFET serves, together with a vertical signal line 1228 and associated circuit components, as an output unit.

As shown in FIGS. 1 through 3, the light-blocking film (e.g., the light-blocking aluminum layer) which typically covers the entire semiconductor area except for the photodiode 121, is selectively removed from the gate region 122A of the JFET 122 so that light strikes the gate region 122A.

When light is incident on the photoelectric conversion device 120, not only the photodiode 121 (as a primary light-receiving element), but also the semiconductor area that comprises the gate region 122A (as a secondary light-receiving element) generates a signal charge corresponding to the incident light. In other words, the JFET 122 functions as a second photoelectric conversion device in this embodiment. When a signal charge is generated in the gate region 122A in response to the incident light, an electric signal Vout2 corresponding to this signal charge occurs at the source region because of the operation of the JFET 122, the details of which will be described later.

In this arrangement, by controlling the timing of the transfer of the signal charge from the photodiode 121 (i.e., the primary light-receiving element) to the gate region 122A (i.e., the secondary light-receiving element), an electric signal Vout1, which corresponds to the signal charge generated and accumulated in the photodiode 121, and an electric signal Vout2, which corresponds to the signal charge generated by the gate region 122A of the JFET 122, may be output separately. As an alternative, by appropriate control of the timing of the transfer of the signal charge from the photodiode, the separately generated signal charges may be combined, and an electric signal Vout corresponding to the sum of the two signal charges can be output.

First, the arrangement in which the electric signal Vout1 and the electric signal Vout2 are separately output will be explained.

In this arrangement, the electric signal Vout2 which represents the signal charge generated by the gate region 122A of the JFET 122 is used to control the shutter-open time (i.e., the exposure time) of a shutter 1200C of a photoelectric conversion apparatus 1200 that employs the photoelectric conversion device 120. To be more precise, the amount of signal charge generated and accumulated in the photodiode 121, which represents the intensity of the incident light, is monitored based on the amount of signal charge generated in the gate region 122A, and the exposure time is controlled based on the monitoring result (using Vout2).

The structure of the photoelectric conversion device 120 according to this embodiment will now be explained in more detail, with reference to FIGS. 1 through 3.

As shown in FIGS. 2 and 3, the photodiode 121, the JFET 122, the P-type transfer transistor 123, and the P-type reset transistor 124, which constitute the photoelectric conversion device 120, are provided on an N-type semiconductor layer 1202 formed on a P-type semiconductor substrate 1201. The photodiode 121, the JFET 122, the transfer transistor 123, and the reset transistor 124 are surrounded by a high-density $N^+$-type impurity diffusion layer 1203, as shown in FIG. 1.

The photodiode 121 consists of a P-type impurity diffusion layer (i.e., a charge accumulation region) 1212 formed in the N-type semiconductor layer 1202, and a high-density $N^+$-type impurity diffusion layer 1213 formed on the P-type impurity diffusion layer 1212.

The signal charge generated in response to the light incident on the photodiode 121 is accumulated in the P-type impurity diffusion layer (i.e., charge accumulation region) 1212.

The JFET 122 consists of a P-type impurity diffusion layer 1221 formed in the N-type semiconductor layer 1202, which becomes a gate region 122A; an N-type impurity diffusion layer 1222 formed in the P-type impurity diffusion layer 1221, which becomes a source; an N-type impurity diffusion layer 1223 formed in the same P-type impurity diffusion layer 1221, which becomes a channel; and a portion of N-type impurity diffusion layer 1203 facing the N-type impurity diffusion layer 1222 with the N-type impurity diffusion layer 1223 sandwiched between them, which becomes a drain.

The signal charge generated and accumulated in the photodiode 121 is supplied (or transferred) to the gate region 122A of the JFET 122 via the transfer transistor 123 shown in FIG. 3, and an electric signal corresponding to the supplied signal charge is output from the source of the JFET 122.

As shown in FIGS. 2 and 3, the gate region 122A of JFET 122 sandwiches the channel region 1223 from above and below in order to increase the gain of the source-follower action, while reducing the variation of the gain.

The transfer transistor 123 comprises a source, which consists of the charge accumulation region (i.e., the P-type impurity diffusion layer) 1212 of the photodiode 121, and a drain, which consists of the gate region 122A (i.e., the P-type impurity diffusion layer 1221) of the JFET 122. A gate is formed between the above source and drain by a gate electrode (i.e., a transfer gate) 123C together with the N-type semiconductor layer 1202, separated by an insulating film 1209, as shown in FIG. 3.

As has been described above, the transfer transistor 123 transfers the signal charge accumulated in the P-type charge accumulation region (i.e., the P-type impurity diffusion layer) 1212 of the photodiode 121 to the gate region 122A of the JFET 122.

The reset transistor 124 comprises a source, which consists of the gate region 122A (i.e., the P-type impurity diffusion layer 1221) of the JFET 122, and a reset drain, which consists of the P-type impurity diffusion layer 1241. A gate electrode (i.e., a reset gate) 124C is positioned between the source and the reset drain, above the N-type semiconductor layer 1202 and separated therefrom by a gate insulating film, as shown in FIG. 2.

The reset transistor 124 resets the potential of the gate region 122A of the JFET 122 to the readout level VGH.

Since the voltage of the gate region 122A of the JFET 122 is brought to the constant voltage VGH upon the reset action, the charge that has been accumulated in the gate region 122A is removed, and it is not reflected in the output (i.e., the source voltage) of the JFET 122 any longer. At this time, an electric signal VD, corresponding to the constant voltage VGH at the gate region 122A, is output. This electric signal VD corresponds to the dark output of the photoelectric conversion device 120.

As shown in FIG. 3, a color filter (for example, a blue filter) 125 is provided above the light-receiving surface of the photodiode 121 in the photoelectric conversion device 120, whereby a signal charge reflecting the intensity of the blue spectral component of the incident light is generated in the photodiode 121.

The photoelectric conversion device 120 also includes a vertical signal line 1228, a transfer gate interconnection 1238, a reset gate interconnection 1247, and a reset drain interconnection 1248, as shown in FIGS. 1–3.

Next, the circuit structure of the photoelectric conversion device 120 and the signal detection circuit 1290 connected to the photoelectric conversion device 120 will be explained with reference to FIG. 4. In addition, the structure of the photoelectric conversion apparatus 1200 using the photoelectric conversion device 120 as a light-receiving unit 1200B will be described with reference to FIG. 5, and the operation of this apparatus will be explained using the timing charts shown in FIGS. 6 and 7.

As shown in FIG. 4, in the photoelectric conversion device 120, the photodiode 121, which functions as the primary light-receiving element, is connected to a constant voltage source VDD, and a reverse bias is applied. The constant voltage source VDD is also connected to the drain of the JFET 122, as shown.

A driving pulse φTG is supplied from a driving circuit (not shown) to the gate electrode (i.e., transfer gate) 123C of the transfer transistor QTG (1023).

A driving pulse φRSG is supplied to the gate electrode (i.e., reset gate) 124C of the reset transistor QRSG (1024), and a driving pulse φRSD is supplied to a drain (i.e., the reset drain) 124B from the driving circuit (not shown).

The source (the node N1 side) of the JFET 122 is connected to a constant voltage source VSS via a constant-current source which supplies a constant current Ibias to the source of the JFET 122, thereby allowing a source-follower action.

In this photoelectric conversion device 120, the source voltage Vout (i.e., the voltage at the node N1) of the JFET 122 becomes an electric signal obtained by current amplification for amplifying the signal charge accumulated in the gate region 122A, based on source-follower action. If the signal charge held in the gate region 122A of the JFET 122 is the signal charge generated by the photodiode (i.e., the primary light-receiving element) 121, the output electric signal is Vout1, which indicates the intensity of the incident light detected by the photodiode 121. On the other hand, if the signal charge held in the gate region 122A is the charge accumulated directly in the gate region 122A, the output electric signal is Vout2, which indicates the intensity of the incident light detected by the gate region (i.e., secondary light-receiving element) 122A.

By controlling the waveforms of the driving pulses φTG, φRSG, and φRSD supplied from the driving circuit (not shown), the electric signal Vout occurring at the source (on the node N1 side) of the JFET 122 can be made to correspond to Vout1 at a certain time, and to Vout2 at another time. When the gate region 122A is reset by the reset transistor QRSG (1024), the electric signal Vout represents the dark output of the photoelectric conversion device 120.

The source (the node N1) of the JFET 122 is connected to the signal detection circuit 1290, and the electric signal Vout is supplied from the source of the JFET 122 to the signal detection circuit 1290.

The signal detection circuit 1290 has a sample-and-hold circuit 1291 and a difference calculation circuit 1292. The reference signal voltage VD, which corresponds to the dark output, is held by the sample-and-hold circuit 1291. The difference calculation circuit 1292 subtracts this reference voltage VD from Vout1 (also referred to as Vs) which represents the signal charge generated by the photodiode 121. Difference calculation circuit thus produces photosignal Vp, from which the dark output has been removed.

FIG. 5 shows the overall structure of the photoelectric conversion apparatus 1200 using the photoelectric conversion device 120 as a light-receiving device 1200B.

The light-receiving device 1200B is comprised of the photoelectric conversion device 120 (and may include an array of such devices) and the driving circuit (not shown), and it is accommodated in a dark box 1200A. A shutter 1200C is fit into an opening of the dark box 1200A, through which light comes in the direction indicated by the arrow.

A controller 1200D, a comparator 1280, and the signal detection circuit 1290 are connected to the light-receiving device 1200B accommodated in the dark box 1200A.

The controller 1200D outputs a control signal to the driving circuit (not shown) in order to cause the driving circuit to supply the driving pulses φTG, φRSG, and φRSD to the photoelectric conversion device 120.

The comparator 1280 is connected to the controller 1200D. The comparator 1280 compares the electric signal Vout2, which corresponds to the signal charge generated by the gate region 122A of the JFET 122, with the reference signal Vref, and outputs a signal representing the comparison result to the controller 1200D.

The controller 1200D supplies a control signal SH to the shutter 1200C based on the comparison signal received from the comparator 1280, thereby controlling the shutter-open time (i.e., the exposure time).

Next, the operation of the photoelectric conversion device 120 during the detection of the incident light will be explained using the timing charts shown in FIGS. 6 and 7. For ease of explanation, a single cycle of operation from t10 to t20 will be used.

As shown in FIG. 6, the shutter 1200C has been closed based on the control signal SH being set high (high being closed, low being open) by the controller 1200D before t10. Just before t10 the driving pulse φTG is at a high level, the driving pulse φRSD is at a low level, and the driving pulse φRSG is at a high level. Because the signal charge generated by the photodiode 121 has been transferred to the gate region 122A of the JFET 122 before t10, the electric signal Vout1 occurring at the node N1 has a value Vs corresponding to the incident light of the previous cycle.

At t10, the driving pulse φRSD is changed from the low level to the high level (i.e., the readout level VGH), and the driving pulse φRSG is changed from the high level to the low level.

Upon the change of the driving pulse φRSG to the low level, the P-type reset transistor QRSG is turned on. Upon the change of the driving pulse φRSD to the readout level (VGH), a constant voltage VGH is applied to the drain of the reset transistor QRSG, and to the gate region 122A of the JFET 122, resetting the gate region 122A.

At t11, the control signal SH supplied from the controller 1200D becomes low, and the shutter 1200C is opened, whereby exposure starts. Also at t11, the driving pulse φRSD returns to the low level, and the driving pulse φRSG returns to the high level, whereby the reset state of the gate region 122A of the JFET 122 is terminated.

At t11, the driving pulse φTG remains at the high level, and the transfer transistor QTG is still in the OFF state. Accordingly, the signal charge generated in the photodiode 121 upon the start of the exposure time is accumulated in the photodiode 121, and it is not supplied to the gate region 122A of the JFET 122.

Because the shutter 1200C is opened at t11, the gate region 122A also generates a signal charge in response to the incident light. This signal charge generated by the gate region 122A produces a corresponding output in the signal Vout occurring at the source (node N1) of the JFET 122, and that corresponding output signal is referred to as Vout2.

The value of the electric signal Vout2 gradually increases while the shutter 1200C is open (t11 to t12). When the electric signal Vout2 reaches the reference value Vref at t12, the control signal SH supplied from the controller 1200D to the shutter 1200C is changed to the high level, and the shutter 1200C is closed (i.e., the exposure time ends).

If the intensity of the light incident to the gate region 122A is low, the value of the electric signal Vout2 increases with a gentle slope from t11 to t12, as shown in FIG. 6, and the time interval between t11 and t12 is relatively long, which means that the exposure time is long.

On the other hand, if the intensity of the light incident to the gate region 122A is high, the value of the electric signal Vout2 increases rapidly from t11 to t12, as shown in FIG. 7, and the electric signal Vout2 reaches the reference value Vref in a short time. Thus, the exposure time is short.

When the electric signal Vout2 representing the signal charge generated by the gate region 122A reaches the reference value Vref at t12, the shutter 1200C is closed (upon the change of the control signal SH to the high level), the driving pulse φRSG becomes low, and the driving pulse φRSD becomes the readout level (the constant voltage VGH).

Upon the change of the driving pulse φRSG to the low level, the reset transistor QRSG is turned on, and the reset drain 124B achieves the constant voltage VGH (reset action). At this time, the electric signal Vout at the source of the JFET 122 has the value of the reference signal voltage VD, which corresponds to the dark output.

At t13, the driving pulse φRSD is again changed to the low level, and the driving pulse φRSG is again changed to the high level. Although the gate region 122A of the JFET 122 is thus put into a floating state, the value of the electric signal Vout occurring at the node N1 remains at VD.

At t14, the driving pulse φTG is changed to the low level, and the transfer transistor QTG is turned on. When the transfer transistor QTG is turned on, the signal charge generated and accumulated in the photodiode 121 during the period from t11 to t12 is transferred to the gate region 122A of the JFET 122.

At t15, the driving pulse φTG is again changed to the high level, and the transfer transistor QTG is turned off. At this time, the value of the electric signal Vout1 occurring at the source (node N1) of the JFET 122 remains at Vs, which corresponds to the signal charge generated and accumulated in the photodiode 121.

At t20, the driving pulse φRSD again reaches the readout level (i.e., the constant voltage VGH), and the driving pulse φRSG is changed from the high level to the low level.

Upon the change of the driving pulse φRSG to the low level, the P-type reset transistor QRSG is turned on again. At the same time, upon the change of the driving pulse φRSD to the readout level (VGH), the constant voltage VGH is applied to the drain of the P-type reset transistor QRSG, and the value of the electric signal Vout occurring at the node N1 becomes the reference signal voltage VD, which corresponds to the dark output.

The operations from t10 through t20 (that is, one cycle of incident-light-detection operations) are repeated in the subsequent process.

The electric signal VD obtained in the period from t12 to t14 is stored and held by the sample-and-hold circuit 1291 shown in FIG. 4. The difference calculation circuit 1292 subtracts this value VD from the electric signal Vs obtained in the period from t14 to t20, yielding an electric signal Vp, from which the noise component VD, due to dark current fluctuation, is removed.

In the photoelectric conversion device 120 according to this first embodiment, light can strike the gate region 122A of the JFET 122, and the signal charge generated by the gate region 122A is output as an electric signal Vout from the source (node N) of the JFET 122.

Accordingly, if this photoelectric conversion device 120 is used as the light-receiving device 1200B of a photoelectric conversion apparatus 1200, an appropriate exposure time for the photodiode 121 can be set based on the signal charge generated by the gate region 122A. In other words, the brightness of the surroundings during the process of photographing is monitored based on the signal charge generated by the gate region 122A, and the electric signal Vout2 representing the signal charge generated by the gate region 122A is compared with the reference value Vref in order to adjust the shutter-open time of the shutter 1200C, whereby the optimal exposure time can be selected according to the brightness of the surroundings during the exposure.

Signal charges are generated in both the photodiode 121, which is the primary light-receiving element, and the gate region 122A of the JFET 122, which is the secondary light-receiving element. In this embodiment, a color filter (e.g., a blue filter) 125 is provided above the light-receiving surface of the photodiode 121, as shown in FIG. 3. By providing the color filter 125 above the light-receiving surface of the photodiode 121, the color component defined by the color filter 125 (i.e., the blue component in this example) is extracted from the incident light, and is detected by the photoelectric conversion device 120.

With the photoelectric conversion apparatus 1200 using the photoelectric conversion device 120, the exposure time is determined based on the signal charge (Vout2) generated by the gate region 122A. However, the light-receiving area of the gate region 122A is smaller than that of the photodiode 121 which is the primary light-receiving element.

For this reason, in the first embodiment, the color filter 125 is placed only above the photodiode 121 in order to allow the gate region 122A to receive a sufficient quantity of light. In this arrangement, the photosensitivity of the gate region 122A is improved in spite of the relatively small light-receiving area, resulting in an increased amount of signal charge generated in this region. Consequently, the exposure time is adjusted with a high degree of precision.

Of course, a color filter having a specific color (e.g., blue) may be placed above the light-receiving surfaces of both the photodiode 121 and the gate region 122A of the JFET 122. In this case, the gate region 122A can detect the same color component of the incident light as that detected by the photodiode 121. Thus, the signal charge generated by the photodiode 121 can be monitored by extracting a specific color component (e.g., the blue component) from the incident light, and the exposure time can be adjusted to the optimal value for detecting the intensity of light having a specific color component (e.g., blue).

As another alternative, color filters having different colors may be provided above the light-receiving surfaces of the photodiode 121 and the gate region 122A of the JFET 122. For example, a blue filter may be placed above the photodiode 121, and a red filter above the gate region 122A.

Providing color filters of different colors above the light-receiving surfaces of both the photodiode 121 and the gate region 122A of the JFET 122 has the advantage of allowing the spectral characteristics of the incident light to be detected.

Depending on the circumstances, a certain amount of the spectral characteristics (i.e., color information) of the incident light may be required when detecting light using the photoelectric conversion device 120. For example, in spectrophotometry, the properties of an object are measured by illuminating the object with light having a specific wavelength and detecting the radiation from the object.

For example, if the object is illuminated with red light, and if the object then radiates blue light, in addition to red light which is the same color as the incident light, the intensity ratio of the radiated red light to the radiated blue light may be obtained by use of the photoelectric conversion device 120.

For example, if the intensity of the radiated red light is strong, a blue filter is placed above the light-receiving surface of the photodiode which has a relatively large light-receiving area, and a red filter is placed above the light-receiving surface of the gate region 122A of the JFET 122, whereby the intensity ratio of the red spectral component to the blue spectral component can be detected with a high degree of accuracy.

As still another alternative, a color filter (for example, a red filter) may be placed only above the light-receiving surface of the gate region 122A of the JFET 122, without providing any color filters above the light-receiving surface of the photodiode 121.

In this case, the photodiode 121 detects the intensity of the incident light, which contains various color components, and the gate region 122A detects a specific color component of the incident light. The spectral characteristics (i.e., color information) of the incident light can be accurately obtained based on the known spectral sensitivities of the light detected by the photodiode 121 and the gate region 122A. At the same time, the exposure time can be controlled based on the signal charge generated by the gate region 122A.

First Modification of the First Example Embodiment

A first modification of the first example embodiment will now be described using the timing chart shown in FIG. 8.

In this modification, the driving pulses φTG, φRSG, and φRSD, which are supplied from the driving circuit (not shown) to the transfer transistor QTG, the gate electrodes of the reset transistor QRSG, and the reset drain 124B of the reset transistor QRSG of the photoelectric conversion device 120 of FIG. 4, respectively, have waveforms different from those shown in the timing chart of FIG. 6.

Figure 8:
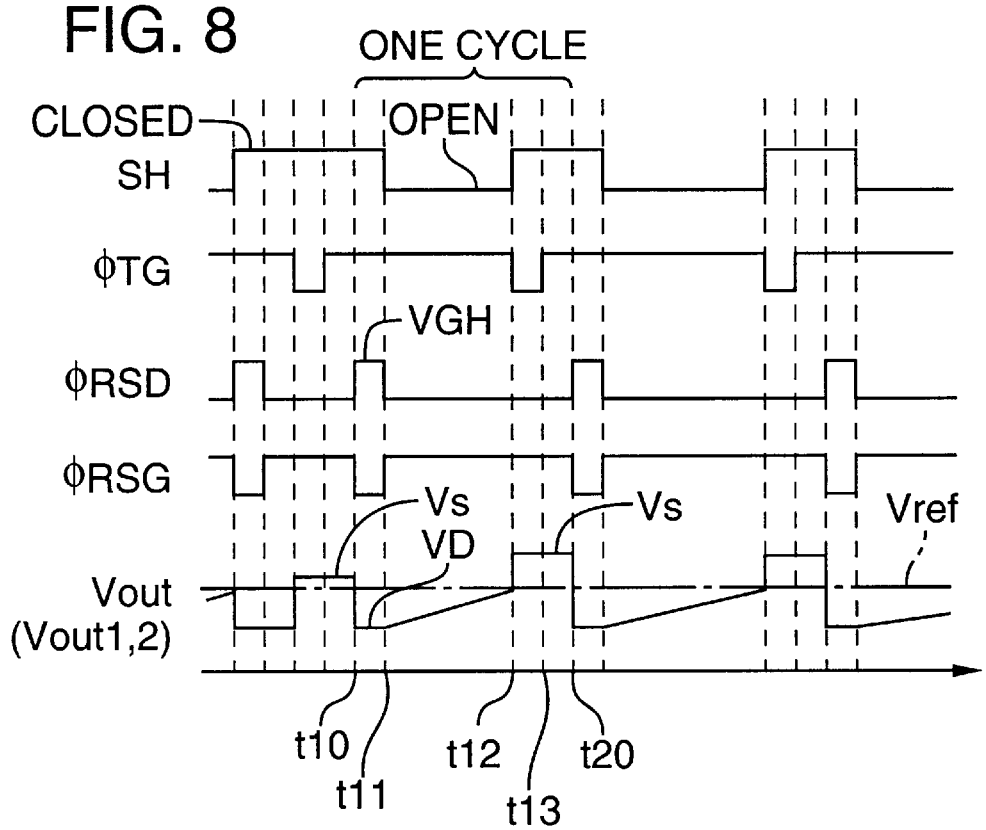
FIG. 8 is a timing chart showing the waveforms of driving pulses φTG, φRSG, and φRSD which are supplied to a modified version of the photoelectric conversion device 120 of FIG. 1.

With these driving pulses φTG, φRSG, and φRSD having the waveforms shown in FIG. 8, an electric signal Vout corresponding to the sum of the signal charge generated by the gate region 122A and the signal charge generated by the photodiode 121 is obtained at the source (node N1) of the JFET 122.

For ease of explanation, a single cycle of operation (t10 to t20) of this modified photoelectric conversion device 120 will be explained with reference to FIG. 8.

Just before t10, the shutter 1200C has been in the closed state based on the control signal SH supplied from the controller 1200D. The driving pulse φTG is at a high level, the driving pulse φRSD is at a low level, and the driving pulse φRSG is at a high level. The electric signal Vout occurring at the node N1 has a value Vs corresponding to the incident light of the previous cycle.

At t10, the driving pulse φRSD is raised to the readout level (VGH), and the driving pulse φRSG is changed from the high level to the low level.

Upon the change of the driving pulse φRSG to the low level, the P-type reset transistor QRSG is turned on. Upon the change of the driving pulse φRSD to the readout level (VGH), the constant voltage VGH is applied to the drain of the turned-on reset transistor QRSG. The electric signal Vout occurring at the node N1 then becomes the reference signal voltage VD, which corresponds to the dark output.

At t11, the control signal SH supplied from the controller 1200D becomes low, and the shutter 1200C is opened, whereby exposure starts. At this time, the driving pulse φRSD returns to the low level, and the driving pulse φRSG returns to the high level, whereby the gate region 122A of the JFET 122 is put into a floating state.

The driving pulse φTG remains high, and the transfer transistor QTG is still in the "OFF" state. Accordingly, the signal charge generated in the photodiode 121 upon the start of the exposure time is accumulated in the charge accumulation region of the photodiode 121, and it is not supplied to the gate region 122A of the JFET 122.

With the shutter 1200C open, both the photodiode 121 and the gate region 122A generate signal charges in response to the incident light. Accordingly, the electric signal Vout occurring at the source (node N1) of the JFET 122 becomes Vout2, which represents the signal charge generated in the gate region 122A during the exposure time.

The value of the electric signal Vout2 gradually increases while the shutter 1200C is open (t11 to t12). When the electric signal Vout2 reaches the reference value Vref at t12, the control signal SH supplied from the controller 1200D to the shutter 1200C is changed to the high level, and the shutter 1200C is closed (i.e., the exposure time ends). Thus, the period from t11 to t12 is the exposure time.

The photodiode 121 generates and accumulates a signal charge in response to the incident light during the exposure time.

When the electric signal Vout2, representing the signal charge generated by the gate region 122A, reaches the reference value Vref at t12, the shutter 1200C is closed (upon the change of the control signal SH to the high level), the driving pulse $\phi$TG becomes low, and the transfer transistor QTG is turned on.

Upon turning on the transfer transistor QTG, the signal charge generated and accumulated in the photodiode 121 in the period from t11 to t12 is transferred to the gate region 122A of the JFET 122.

Before the gate region 122A receives the signal charge supplied from the photodiode 121, the gate region 122A is holding the signal charge generated by the gate region 122A itself. Accordingly, at t12, the signal charge newly supplied from the photodiode 121 via the transfer transistor QTG is added to the signal charge generated in the gate region 122A, and the sum of both signal charges is stored in the gate region 122A.

At this time, the electric signal Vout occurring at the source (node N1) of the JFET 122 becomes Vs, which represents the sum of the signal charge generated by the photodiode 121 and the signal charge generated by the gate region 122A.

At t13, the driving pulse $\phi$TG is again changed to the high level, and the transfer transistor QTG is turned off. Although the gate region 122A of the JFET 122 is thus put into a floating state, the value of the electric signal Vout at the node N1 remains at Vs.

At t20, the driving pulse $\phi$RSD is again raised to the readout level, and the driving pulse $\phi$RSG is changed from the high level to the low level.

Upon the change of the driving pulse $\phi$RSG to the low level, the P-type reset transistor QRSG is turned on again. At the same time, upon the change of the driving pulse $\phi$RSD to the readout level (VGH), the constant voltage VGH is applied to the drain of the P-type reset transistor QRSG, and the gate region 122A of the JFET 122 is reset (i.e., the charge accumulated in the gate region 122A is removed). Consequently, the value of the electric signal Vout occurring at the node N1 becomes the reference signal voltage VD, which corresponds to the dark output.

By repeating the operations from t10 through t20, successive cycles of the detection operation are performed.

The electric signal VD obtained during the period t10 to t11, and the electric signal Vs obtained during the period t12 to t20 are supplied to the signal detection circuit 1290, and a signal corresponding to the difference between these two signals is output as a photosignal Vp, from which the noise component VD (caused, for example, by fluctuation) is removed.

In this first modification of the first example embodiment, the signal charge generated by the photodiode 121 and the signal charge generated by the gate region 122A are added up, and the sum is held in the gate region 122A. Accordingly, the electric signal Vout (that is, Vout1, which equals Vs) occurring at the source (node N1) of the JFET 122 represents this sum.

Thus, the signal charge generated by the gate region 122A is used to determine the exposure time (t11 to t12), based on a comparison with the reference value Vref, and at the same time it is also added to the signal charge generated by the photodiode 121 and contributes to the electric signal Vout which represents the intensity of the incident light during this exposure time. In the photoelectric conversion device 120 which operates in this manner, the gate region 122A functions as a photoelectric conversion element together with the photodiode 121, and the light-receiving area in each pixel is thus substantially increased.

Since the signal detection circuit 1290 removes the noise component (VD) from the electric signal Vs generated in response to the incident light, and outputs a photosignal Vp, accurate light detection can be achieved.

As in the unmodified first example embodiment (which operates according to the timing chart shown in FIG. 6), the shutter-open time (i.e., the exposure time) of the photoelectric conversion apparatus 1200 is controlled based on the electric signal Vout2 corresponding to the signal charge generated by the gate region 122A and, consequently, the optimum exposure time for a given exposure can be set even if the brightness of the surroundings changes during the exposure.

Second Modification of the First Example Embodiment

Figure 9:
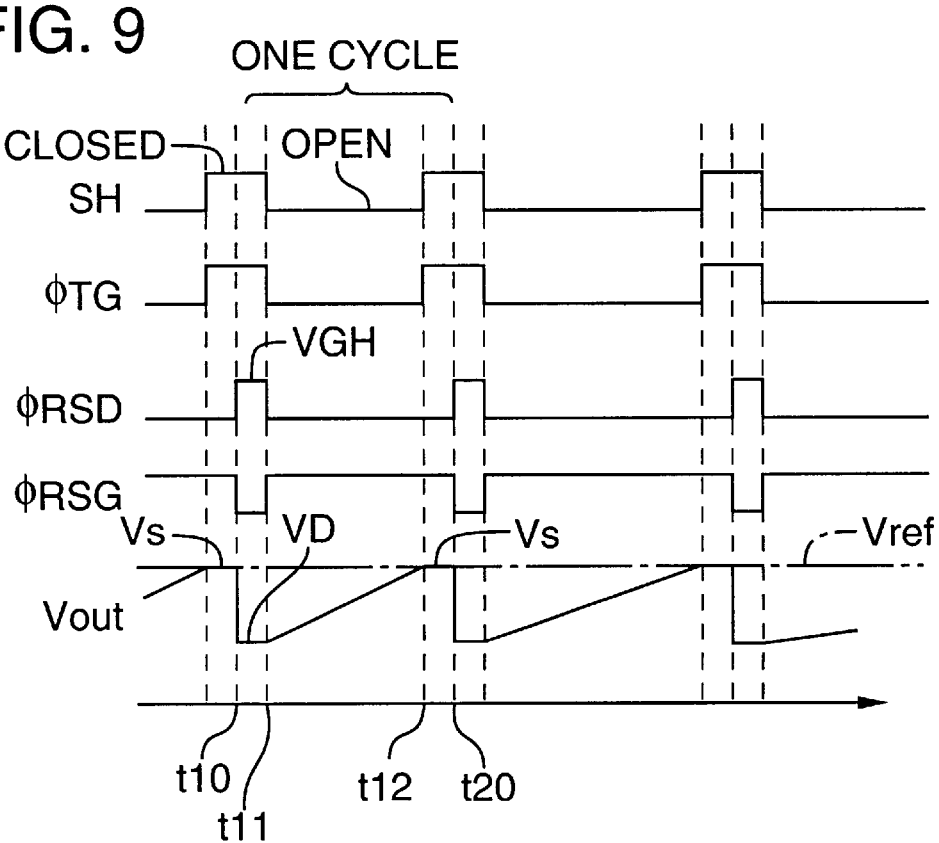
FIG. 9 is a timing chart showing the waveforms of driving pulses φTG, φRSG, and φRSD which are supplied to another modified version of the photoelectric conversion device 120 of FIG. 1.

A second modification of the first embodiment will now be described using the timing chart shown in FIG. 9.

In this modification, the driving pulses $\phi$TG, $\phi$RSG, and $\phi$RSD (FIG. 9), which are supplied respectively to the transfer transistor QTG, the gate electrodes of the reset transistor QRSG, and the reset drain 124B of the reset transistor QRSG of the photoelectric conversion device 120 of FIG. 4, have waveforms different from those shown in the timing charts of FIG. 6 and FIG. 8. By supplying the driving pulses $\phi$TG, $\phi$RSG, and $\phi$RSD of FIG. 9 to the transfer transistor QTG, the gate electrodes of the reset transistor QRSG, and the reset drain 124B of the reset transistor QRSG, respectively, the signal charge generated in the photodiode 121 is transferred to the gate region 122A during the exposure as it is generated, and is added to the signal charge generated by the gate region 122A. Accordingly, an electric signal Vout corresponding to the sum of these two signal charges is obtained. The opening time of the shutter 1200C (i.e., the exposure time) of the apparatus 1200 is controlled based on the electric signal Vout and, in addition, this electric signal Vout, representing the sum of the signal charges is used to produce the photosignal Vp.

For purposes of simplification, only a single cycle of operation from t10 to t20 will be explained, as in the previous examples.

Before t10, the shutter 1200C has been in the closed state based on the control signal SH supplied from the controller 1200D. The driving pulse $\phi$TG is at a high level, the driving pulse φRSD is at a low level, and the driving pulse φRSG is at a high level. The electric signal Vout occurring at the node N1 has a value Vs corresponding to the incident light of the previous cycle.

At t10, the driving pulse φRSG is changed from the high level to the low level, and the P-type reset transistor QRSG is turned on. At the same time, the driving pulse φRSD is raised to the readout level (VGH), and the constant voltage VGH is applied to the drain of the turned-on reset transistor QRSG, whereby the gate region 122A is reset. At this time, the electric signal Vout occurring at the node N1 becomes the reference signal voltage VD, which corresponds to the dark output.

At t11, the control signal SH supplied from the controller 1200D becomes low, and the shutter 1200C is opened, whereby exposure starts. At this time, the driving pulse φRSD returns to the low level, whereby the reset state of the gate region 122A is terminated, and the driving pulse φTG becomes low, whereby the transfer transistor QTG is turned on at the same time as the opening of the shutter 1200C.

Upon the start of the exposure time, light strikes both the photodiode 121 and the gate region 122A of the photoelectric conversion device 120, and the photodiode 121 and the gate region 122A start generating signal charges.

During the exposure time, the signal charge generated by the photodiode 121 is transferred directly to the gate region 122A via the turned-on transfer transistor QTG, and is added to the signal charge generated by the gate region 122A. Therefore, the value of the electric signal Vout occurring at the source (node N1) of the JFET 122 increases steeply as both the signal charge generated by the photodiode 121 and the signal charge generated by the gate region 122A increase in the time interval between t11 and t12 shown in FIG. 9.

When the electric signal Vout, representing the sum of the signal charge generated by the photodiode 121 and the signal charge generated by the gate region 122A, reaches the reference value Vref at t12, the control signal SH is changed to the high level, and the shutter 1200C is closed (i.e., the exposure time ends).

Also at t12, the driving pulse φTG is changed to the high level, and the transfer transistor QTG is turned off, whereby the electric connection between the gate region 122A of the JFET 122 and the photodiode 121 is cut off. As a result, the gate region 122A of the JFET 122 is put into a floating state; however, the value of the electric signal Vout occurring at the node N1 remains at Vs, which reflects the sum of the two signal charges.

At t20, the driving pulse φRSG is changed to the low level, and the P-type reset transistor QRSG is turned on again. At the same time, the driving pulse φRSD is raised to the readout level (i.e., the constant voltage VGH), and this constant voltage VGH is applied to the drain of the P-type reset transistor QRSG (reset action). Consequently, the value of the electric signal Vout occurring at the node N1 becomes the reference signal voltage VD, which corresponds to the dark output.

The operations from t10 through t20 are repeated to perform successive cycles of light detection.

The electric signal VD obtained during the period t10 to t11 and the electric signal Vs obtained during the period t11 to t20 are supplied to the signal detection circuit 1290, and a signal corresponding to the difference between these two signals is output as a photosignal Vp, which does not contain the noise component VD (caused, for example, by fluctuation).

In this second modification of the first example embodiment, in the manner described above, the exposure time (i.e., the shutter-open time) of the photoelectric conversion apparatus 1200 is controlled by the photoelectric conversion device 120 using both the signal charge generated by the gate region 122A and the signal charge generated by the photodiode 121. Accordingly, the degree of accuracy to which the exposure time is controlled for photography can be further improved.

As in the first modification of the first example embodiment, the electric signal Vout representing the sum of the signal charge generated by the photodiode 121 and the signal charge generated by the gate region 122A is output. Thus, the light-receiving area in each pixel is substantially increased.

Photoelectric Conversion Device Example Embodiment 2

Next, a photoelectric conversion device 130 and a photoelectric conversion apparatus according to a second example embodiment of the invention will be described with reference to FIGS. 10 and 11. Features substantially similar or the same as those described above have reference characters the same as those described above, but this a "3" as a first digit. Where no additional description is given, the above description applies to corresponding features of this example embodiment.

In this embodiment, the shutter-open time (i.e., the exposure time) is again controlled based on an electric signal Vout representing the signal charged generated by the gate region 132A of the JFET. Unlike the first embodiment, however, the electric signal Vout is output without keeping the JFET in the ON state all the time. Accordingly, the power consumption can be reduced, as compared with the photoelectric conversion device 120 of the first embodiment, in which the JFET 122 is kept turned on all the time.

Figure 10:
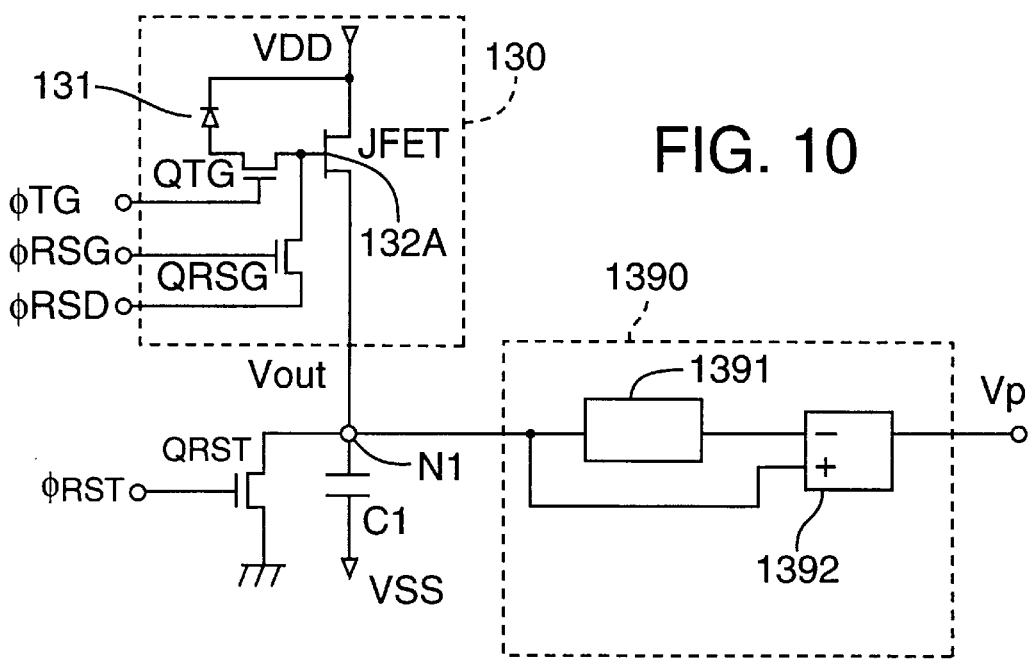
FIG. 10 is a circuit diagram showing a photoelectric conversion device 130 and a signal detection circuit 1390 according to a second embodiment of the invention.

As shown in the circuit diagram of FIG. 10, the photoelectric conversion device 130 according to the second embodiment comprises a photodiode 131 for generating a signal charge corresponding to the incident light; a JFET for outputting an electric signal (Vout) supplied to its gate region 132A; a P-type transfer transistor QTG for supplying or transferring the signal charge generated and accumulated in the photodiode 131 to the gate region 132A; and a P-type reset transistor QRSG for removing the signal charge supplied to the gate region 132A. The source (on the node N1 side) of the JFET is connected to the constant voltage source VSS via a capacitor C1. A second N-type reset transistor QRST is connected in series with the capacitor C1 to the source of the JFET so that a driving pulse φRST is supplied to the gate of this reset transistor QRST from the driving circuit (not shown).

As in the photoelectric conversion device 120 of the first embodiment, there is no blocking film provided above the gate region 132A of the JFET, in order to allow the JFET to function as a phototransistor and to allow its gate region 132A to generate a signal charge in response to the incident light. The structures of the major elements, including the JFET, of this photoelectric conversion device 130 are the same as those of the photoelectric conversion device 120 of the first embodiment, and detailed explanation of them will therefore be omitted.

With the photoelectric conversion apparatus using the photoelectric conversion device 130 according to this embodiment, an electric signal Vout1, which corresponds to the signal charge generated and accumulated in the photodiode 131, and an electric signal Vout2, which corresponds to the signal charge generated in the gate region 132A of the JFET, are separately output. The shutter-open (exposure) time is controlled based on the signal charge generated by the gate region 132A, thereby adjusting the exposure time of the photodiode 131.

More specifically, the electric signal Vout output from the JFET first takes on the value Vs corresponding to the signal charge generated by the photodiode 131, and then takes on the value VD (corresponding to a dark output) during the reset state of the gate region 132A, independently of each other. A signal detection circuit 1390 (FIG. 10) obtains the difference between Vs and VD, and outputs a photosignal Vp, from which the noise component VD, due to fluctuation, is removed.

The overall structure of a photoelectric conversion apparatus of this second example embodiment, except as discussed above, is the same as that of the photoelectric conversion apparatus 1200 of the first embodiment shown in FIG. 5, and a separate figure and detailed explanation is therefore omitted.

Operation of the photoelectric conversion device 130 will be explained with reference to the timing chart shown in FIG. 11. This timing chart represents the case where the intensity of the incident light is substantially the same over successive detection cycles. Again, only a single cycle of operation from t10 to t20 of the photoelectric conversion device 130 will be explained for purposes of simplification.

Before t10 the shutter 1200C has been in the closed state based on the control signal SH supplied from the controller 1200D. Also, before t10, the driving pulse φTG is at a high level, the driving pulse φRSD is at a low level, the driving pulse φRSG is at a high level, and the driving pulse φRST is at a low level. The electric signal Vout (that is, the potential difference between the two ends of the capacitor C1) occurring at the node N1 has a value Vs corresponding to the incident light of the previous cycle.

At t10, the driving pulse φRSG is inverted to the low level, and the P-type reset transistor QRSG is turned on. At the same time, the driving pulse φRSD reaches an intermediate level VGM, and the voltage VGM is applied to the turned-on reset transistor QRSG.

Also at t10, the driving pulse φRST becomes high, and the reset transistor QRST is turned on, whereby the charge accumulated in the capacitor C1 is removed. At this time, the electric signal Vout occurring at the node N1 becomes the ground level. In other words, the capacitor C1 is reset.

At t11, the control signal SH becomes low, and the shutter 1200C is opened, whereby exposure starts.

Also at t11, the driving pulse φRSG returns to the high level, and the reset transistor QRSG is turned off. The driving pulse φRSD also returns to the low level.) In addition, the driving pulse φRST returns to the low level, and the reset transistor QRST is also turned off.

Thus, even after the exposure time starts, the driving pulse φTG remains at the high level, and the transfer transistor QTG is still in the OFF state. Accordingly, the signal charge generated in the photodiode 131 upon the start of the exposure time is accumulated in the photodiode 131, and it is not supplied to the gate region 132A of the JFET.

Because the shutter 1200C is opened at t11, the gate region 132A also generates a signal charge in response to the incident light, and the amount of the charge gradually increases over time.

In this charge-increasing process, when the potential difference between the gate and the source of the JFET exceeds a threshold value (at t12), the JFET is turned on.

Figure 11:
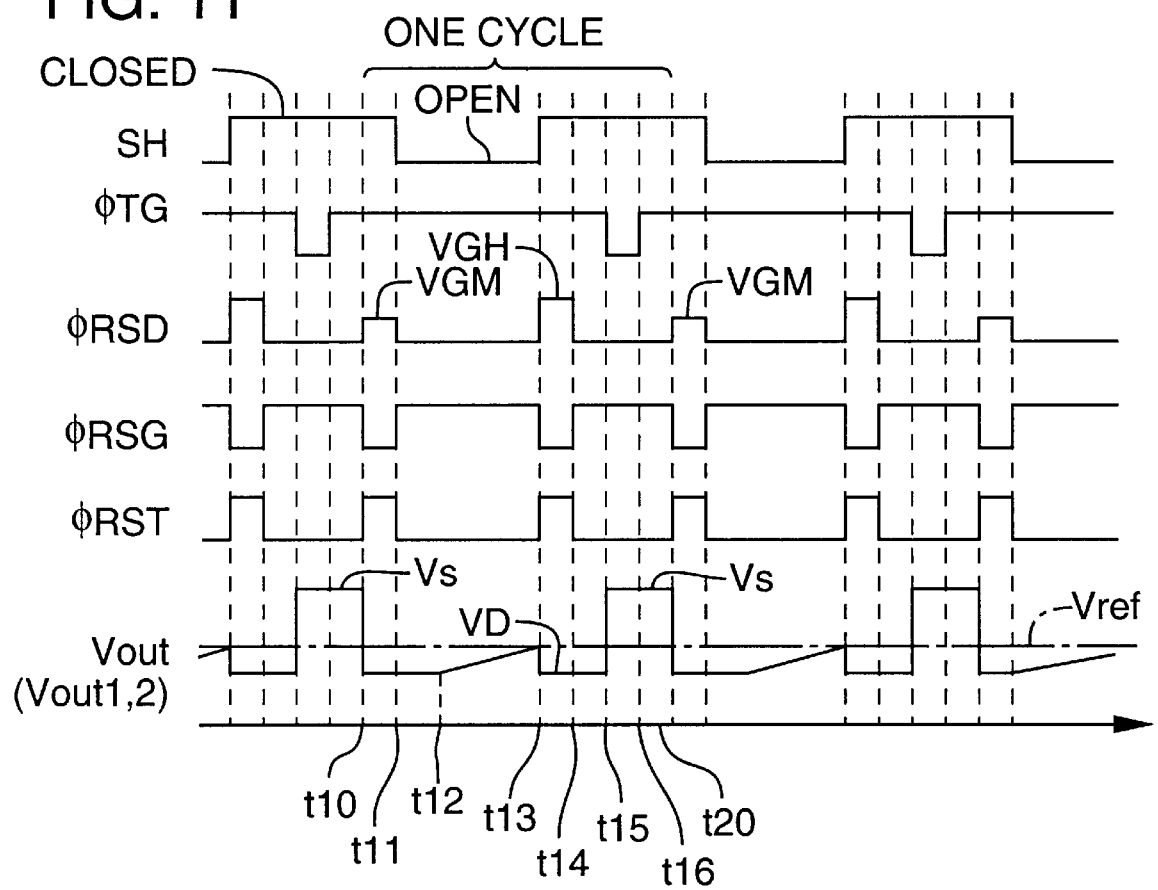
FIG. 11 is a timing chart showing the waveforms of driving pulses φTG, φRSG, and φRSD which are supplied to the photoelectric conversion device 130 of FIG. 10.

If the charge accumulated in the gate region 132A of the JFET is Qj, the gate capacitance is Cj, and the gate potential of the JFET is Vjg, then the gate potential Vjg may be expressed as $$Vjg = V_{GM} + Qj/Cj$$

where $V_{GM}$ represents the voltage of φRSD at t10 shown in FIG. 11.

As the charge generated in the gate region 132A of the JFET increases, when the value of Vjg reaches or exceeds a threshold voltage Vj of the JFET (Vjg≧Vj), the value of the electric signal Vout starts increasing (after t12).

When the JFET is turned on at t12, electric current flows into the capacitor C1 from the constant voltage source VDD via the JFET, whereby the capacitor C1 starts being charged.

The charging of the capacitor C1 continues until the potential difference between the gate and the source of the JFET reaches the value corresponding to the signal charge accumulated in the gate region 132A. In other words, the potential difference between the two ends of the capacitor C1 becomes the electric signal Vout, which corresponds to the signal charge accumulated in the gate region 132A of the JFET.

Since the signal charge generated in the photodiode 131 has not yet been transferred to the gate region 132A at the point in time t11, the electric signal Vout takes on the value Vout2, which corresponds to the signal charge generated in the gate region 132A.

This electric signal Vout2 is monitored in order to determine the exposure time. When Vout2 reaches the reference value Vref at t13, the control signal SH is changed to the high level, and the shutter is closed. (The exposure time ends.) Thus, the exposure time is from t11 to t13.

At t13, the driving pulse φRST is changed to the high level, and the capacitor C1 is reset, that is, the charge accumulated in the capacitor C1 is removed. At the same time, the driving pulse φRSG becomes low, which causes the reset transistor QRSG to be turned on, and the driving pulse φRSD reaches a peak (i.e., the readout level VGH), which causes the gate region 132A of the JFET to be reset.

Upon the application of this constant voltage VGH (i.e., the readout level) to the gate region 132A, the value of the electric signal Vout occurring at the source (node N1) of the JFET becomes the reference signal voltage VD, which corresponds to the dark output.

At t14, the driving pulse φRSD is again changed to the low level, and the driving pulse φRSG is changed to the high level. The gate region 132A of the JFET is thus put into a floating state, while the electric signal Vout occurring at the source (node N1) remains at VD.

At this time, t14, the driving pulse φRST is changed to the low level, and the reset state of the capacitor C1 is terminated. Thus, the capacitor C1 is prepared to be charged.

At t15, the driving pulse φTG is changed to the low level, and the transfer transistor QTG is turned on, whereby the signal charge generated and accumulated in the photodiode during the period from t11 to t12 is transferred to the gate region 132A of the JFET.

At this time, the value of the electric signal Vout occurring at the source (node N1) of the JFET becomes Vs, which corresponds to the signal charge generated and accumulated in the photodiode 131.

At t16, the driving pulse φTG is changed to the high level, the transfer transistor QTG is turned off, and the gate region 132A of the JFET is put into a floating state, while the value of the electric signal Vout occurring at the node N1 remains at Vs, corresponding to the signal charge generated in the photodiode 131.

At t20, the driving pulse φRSG becomes low, and the P-type reset transistor QRSG is turned on again. Also, the driving pulse φRSD again reaches the intermediate level (i.e., the constant voltage VGM), and the voltage VGM is applied to the gate region 132A of the JFET. The driving pulse φRST is changed to the high level (which causes the reset transistor QRST to be turned on), and the charge accumulated in the capacitor C1 is removed. At this time, the electric signal at the source (node N1) of the JFET becomes ground level.

The operations from t10 through t20 are then repeated in the subsequent processes in order to perform successive cycles of light detection.

Both the electric signal VD obtained in the period t13 to t15 and the electric signal Vs obtained in the period t15 to t20 are supplied to the signal detection circuit 1390 shown in FIG. 10, and a photosignal Vp representing the difference of these two electric signals Vs and VD is finally output.

Thus, in the photoelectric conversion apparatus according to the second embodiment, the exposure time of the photoelectric conversion device 130 (or more particularly, of the photodiode 131) is controlled based on the signal charge generated by the gate region 132A, which represents the brightness of the surroundings. In particular, the electric signal Vout2, representing the signal charge generated by the gate region 132A, is compared with the reference value Vref, and the shutter opening time is controlled based on the comparison result, whereby photography may be performed with the optimal exposure time, even if the brightness of the surroundings changes during the exposure.

A significant feature of this second example embodiment is that, unlike the first embodiment, here the JFET of the photoelectric conversion device 130 does not have to be kept in the ON state. The JFET is turned on only when the signal charge accumulated in the gate region 132A exceeds a predetermined value. In addition, the capacitor C1 is charged by an amount corresponding to the amount of signal charge generated in the gate region 132A and, consequently, the power consumption can be reduced, as compared with the photoelectric conversion device 120 of the first embodiment.

Photoelectric Conversion Device Example Embodiment 3

Next, a photoelectric conversion device 140 and a photoelectric conversion apparatus 1400 according to a third example embodiment of the invention will be described with reference to FIGS. 12–17. Features corresponding to those described in the embodiments above are shown with similar reference characters, but with a "4" for the first digit. Where no additional description is given, the above description applies to corresponding features.

In this embodiment, the photoelectric conversion device 140 is designed so that light strikes the gate region (i.e., control electrode) 142A of the JFET 142 and one of the main electrodes (i.e., the reset drain 144B) of the reset transistor 144, as well as the photodiode 141. Signal charges generated in both the gate region 142A and the reset drain 144B in response to the incident light are output.

The signal charges generated by the gate region 142A and the reset drain 144B are compared with the reference value Vref, and the controller 1400D (FIG. 16), which receives the comparison result, controls the open-time of the shutter 1400C (i.e., the exposure time).

Figure 12:
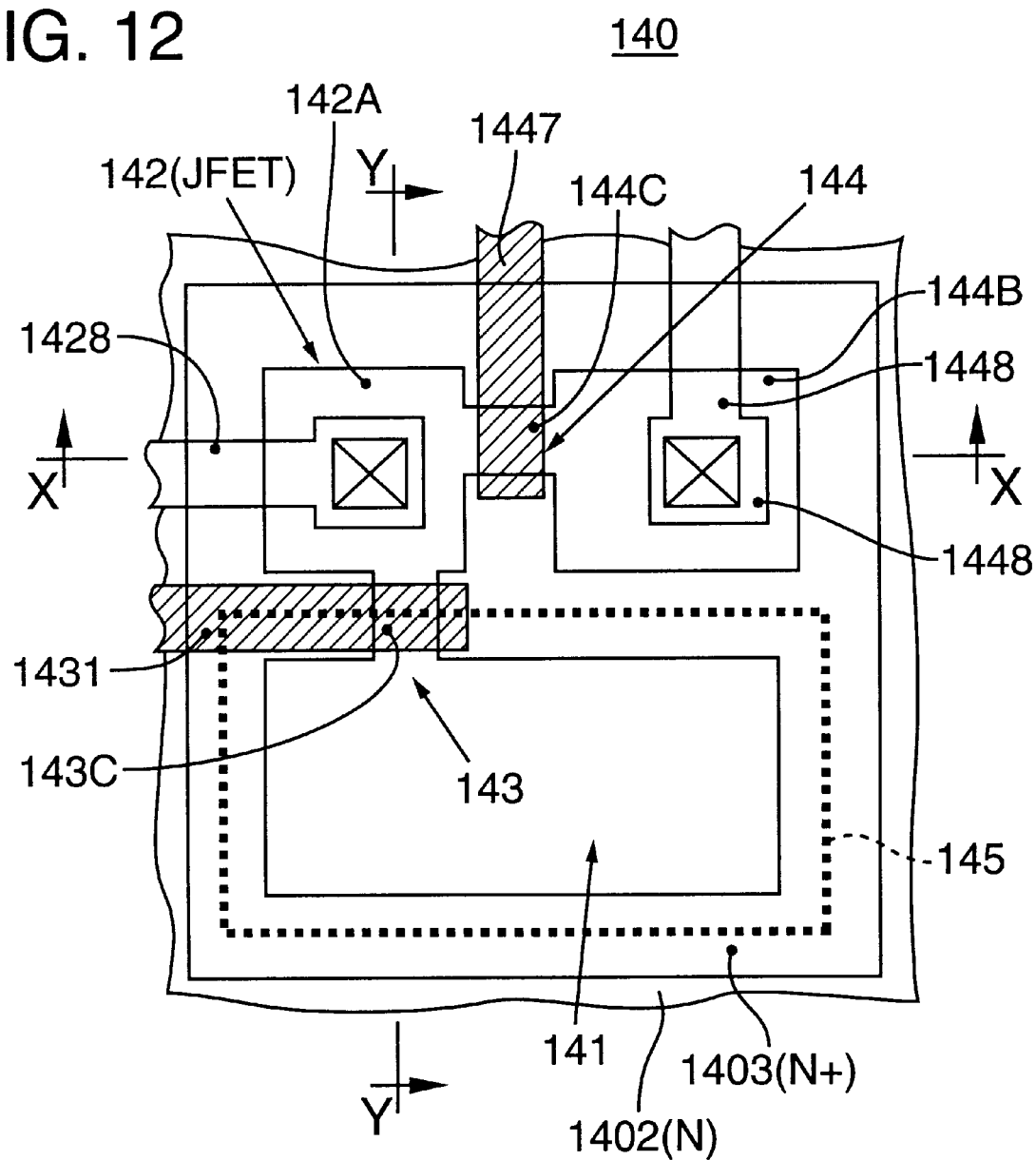
FIG. 12 is a plan view showing the structure of a photoelectric conversion device 140 according a third embodiment of the invention.
Figure 13:
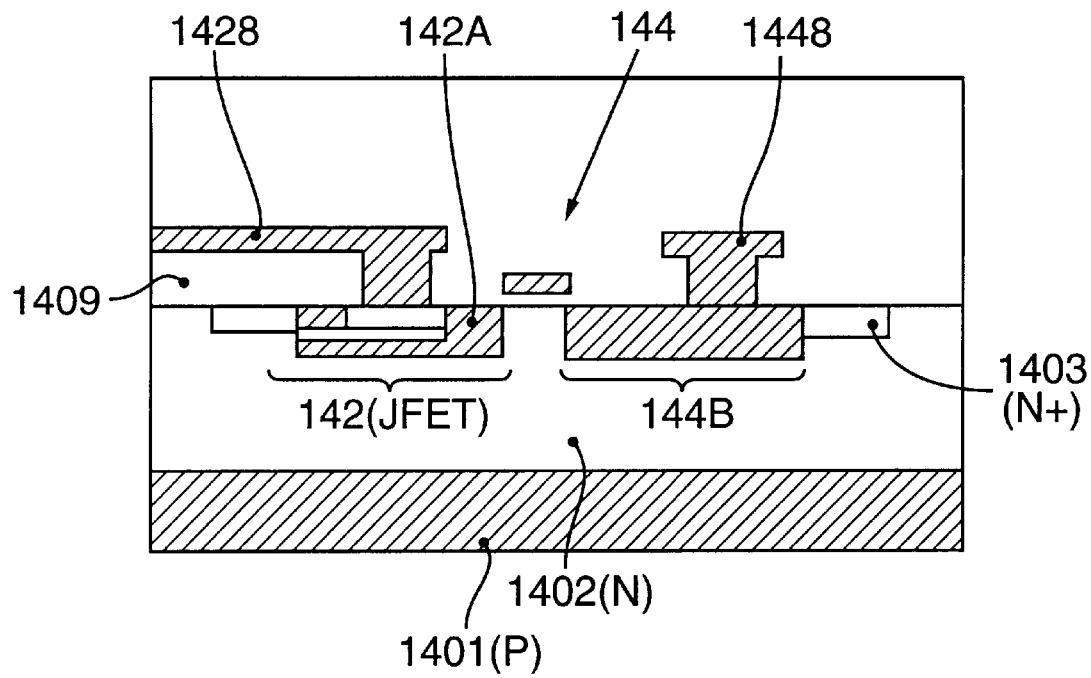
FIG. 13 is a cross-sectional view taken along the line X—X shown in FIG. 12.
Figure 14:
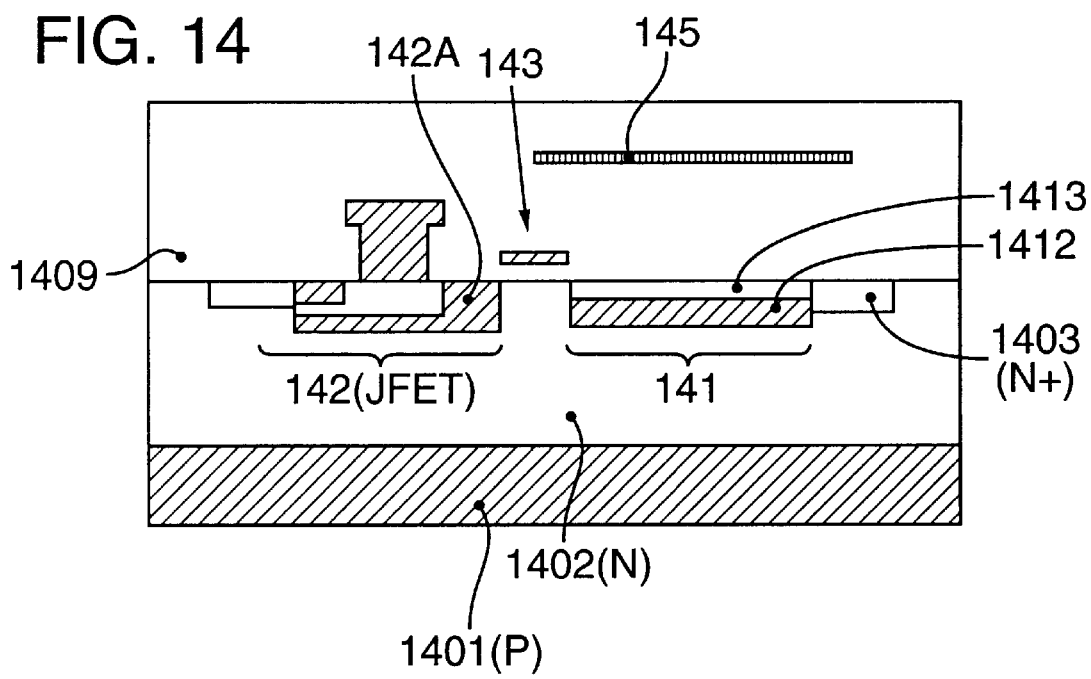
FIG. 14 is a cross-sectional view taken along the line Y—Y shown in FIG. 12.

As shown in FIGS. 12 through 14, the photoelectric conversion device 140 comprises a photodiode (i.e., a photoelectric conversion element) 141 for generating a signal charge corresponding to incident light; an amplification transistor (JFET) 142 for outputting an electric signal (Vout) supplied to its gate region 142A; a P-type transfer transistor 143 for supplying or transferring the signal charge generated and accumulated in the photodiode 141 to the gate region 142A; and a P-type reset transistor 144 for removing the signal charge supplied to the gate region 142A.

A light-blocking aluminum layer that typically covers the area of the photoelectric conversion device except for the photodiode 141, is removed from above the gate region 142A and the reset drain 144B, in order to allow these regions to generate signal charges corresponding to the incident light. The absence of any light-blocking aluminum layer above these regions may be seen, for example in FIGS. 13 and 14.

The signal charge generated by the gate region 142A and the signal charge generated by the reset drain 144B are combined. The combined charge is supplied to the photocurrent integrator 1470 (FIG. 15), which produces a corresponding output in the form of an amplified electric signal Vip. This process will be described in more detail below.

The electric signal Vip corresponding to the sum of the signal charges generated by the gate region 142A and the reset drain 144B is compared with the reference value Vref. The open-time of the shutter 1400C (i.e., the exposure time) of the photoelectric conversion apparatus 1400 is determined based on the comparison result.

As for the structure of the photoelectric conversion device 140, the shape of the reset drain interconnection 1448 differs from its counterpart in the photoelectric conversion device 120 of the first example embodiment shown in FIGS. 1 through 3.

In the photoelectric conversion device 120, the reset drain interconnection 1248 is formed so as to cover the light-receiving surface of the reset drain 124B for the purpose of blocking light. In contrast, in this third example embodiment, the reset drain interconnection 1448 is narrowed above the reset drain 144B in order to allow the incident light to strike the reset drain 144B. Thus, the photoelectric conversion device 140 is designed so that the photodiode 141, the gate region 142A, and the reset drain 144B, all of which are semiconductor regions, generate signal charges in response to incident light.

The rest of the structures of the photoelectric conversion device 140, including the JFET 142, the transfer transistor 143, and the reset transistor 144, are the same as their counterparts with similar reference characters in the photoelectric conversion device 120 of the first embodiment, and detailed explanation of them will therefore be omitted.

As shown in FIGS. 12 through 14, the photoelectric conversion device 140 also includes a transfer gate 143C, a reset gate 144C, a color filter 145, a vertical signal line 1428, a transfer gate interconnection 1431, a reset gate interconnection 1447, and a reset drain interconnection 1448.

Figure 15:
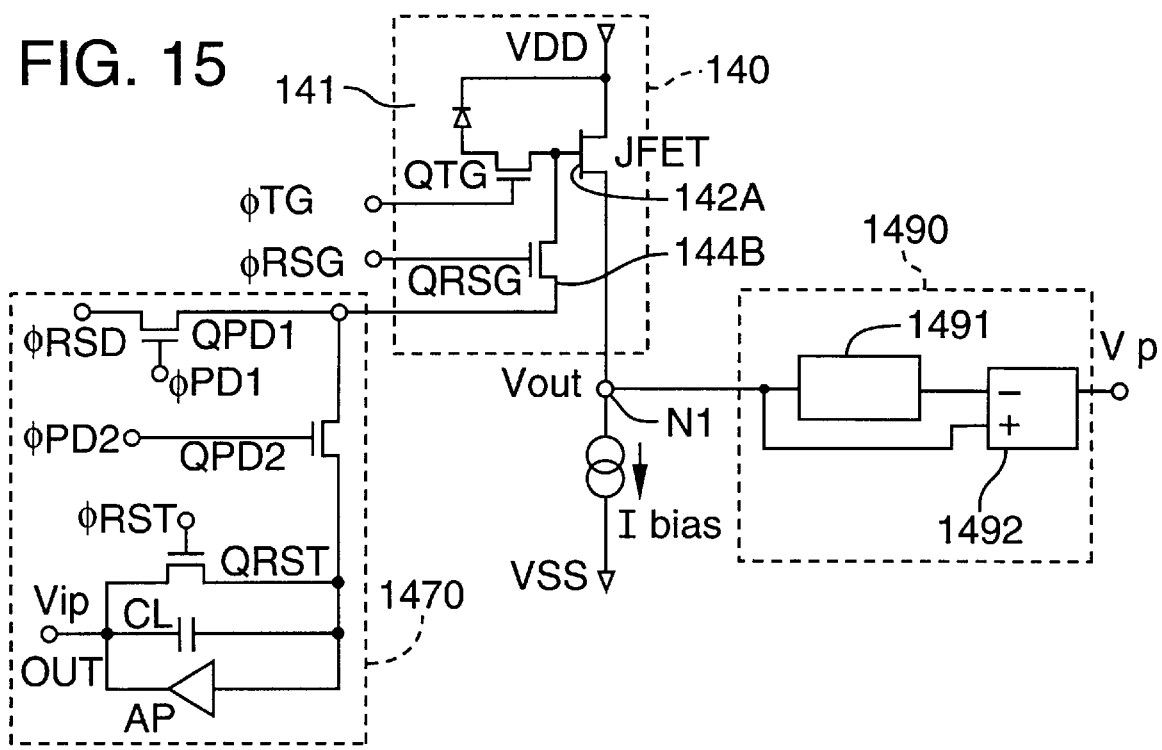
FIG. 15 is a circuit diagram showing the photoelectric conversion device 140 and a signal detection circuit 1490.
Figure 16:
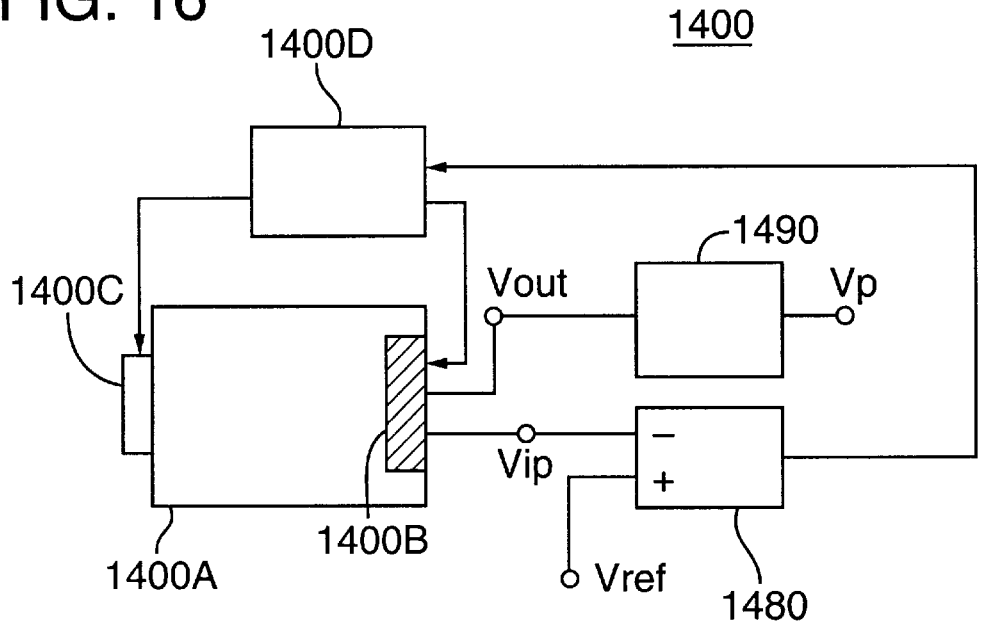
FIG. 16 is a schematic block diagram of a photoelectric conversion apparatus 1400 which uses the photoelectric conversion device 140 as a light-receiving device 1400B.

FIG. 15 shows the circuit structure of the photoelectric conversion device 140 and the signal detection circuit 1490 connected to the photoelectric conversion device 140. FIG. 16 shows the structure of a photoelectric conversion apparatus 1400 using the photoelectric conversion device 140 as the light-receiving device 1400B, the operation of which is shown in the timing chart of FIG. 17.

As shown in FIG. 15, one of the main electrodes (i.e., the reset drain 144B) of the reset transistor QRSG is connected to the photocurrent integrator 1470. This feature is different from the circuit structure of the photoelectric conversion device 120 of the first example embodiment.

This photocurrent integrator 1470 will now be explained in more detail.

The photocurrent integrator 1470 comprises two P-type MOS transistors QPD1 and QPD2 connected in parallel to the reset drain 144B of the reset transistor QRSG, an N-type MOS second reset transistor QRST, a capacitor CL, and an inverting amplifier AP. The N-type MOS transistor QRST, the capacitor CL, and the inverting amplifier AP are connected in parallel between the drain of the P-type MOS transistor QPD2 and the output terminal OUT.

When signal charges generated by the gate region 142A and the reset drain 144B are input to the photocurrent integrator 1470, these signal charges are integrated by the actions of the inverting amplifier AP and the capacitor CL, and the value corresponding to the integral result occurs as the potential difference (Vip) between the two ends of the capacitor CL. The reset transistor QRST resets the capacitor CL to remove the potential difference which has accumulated in the capacitor CL.

During operation of the photoelectric conversion device 140 connected to this photocurrent integrator 1470, an electric signal Vout, which corresponds to the signal charge generated by the photodiode 141, occurs at the source of the JFET 142 due to its source-follower action and, at the same time, an electric signal (i.e., a voltage) Vip, which represents the integral value of the signal charges generated by the gate region 142A and the reset drain 144B, occurs at the output terminal OUT of the photocurrent integrator 1470.

As in the photoelectric conversion apparatus 1200 of the first embodiment, a signal detection circuit 1490 is connected to the node N1, at which the electric signal Vout occurs. This signal Vout generated by the source-follower action of the JFET 142 is compared with the electric signal VD representing the dark output, and a photosignal Vp, from which the noise component VD due to fluctuation is removed, is produced. The photosignal Vp takes on a value corresponding to the intensity of the incident light on the photodiode 141. A sample-and-hold circuit 1491 and a difference calculation circuit 1492 are included in the signal detection circuit 1490.

FIG. 16 is a block diagram showing the overall structure of the photoelectric conversion apparatus 1400 using the photoelectric conversion device 140.

In the photoelectric conversion apparatus 1400 of the third embodiment, a light-receiving device 1400B, which comprises the photoelectric conversion device 140 and a driving circuit (not shown), outputs two electric signals Vout and Vip. While Vout is supplied to the signal detection circuit 1490, Vip is supplied to the comparator 1480, which differs from the way the photoelectric conversion apparatus 1200 of the first example embodiment functions.

With the photoelectric conversion apparatus 1400, a photosignal Vp is generated by the signal detection circuit 1490 by subtracting the reference signal voltage VD corresponding to the dark output from the electric signal Vout corresponding to the signal charge generated by the photodiode 141.

A control signal SH for controlling the opening time (i.e., the exposure time) of the shutter 1400C built into the dark box 1400A is supplied from the controller 1400D based on whether or not the electric signal Vip, which corresponds to the signal charges generated by the gate region 142A and the reset drain 144B, is smaller than the reference value Vref.

Figure 17:
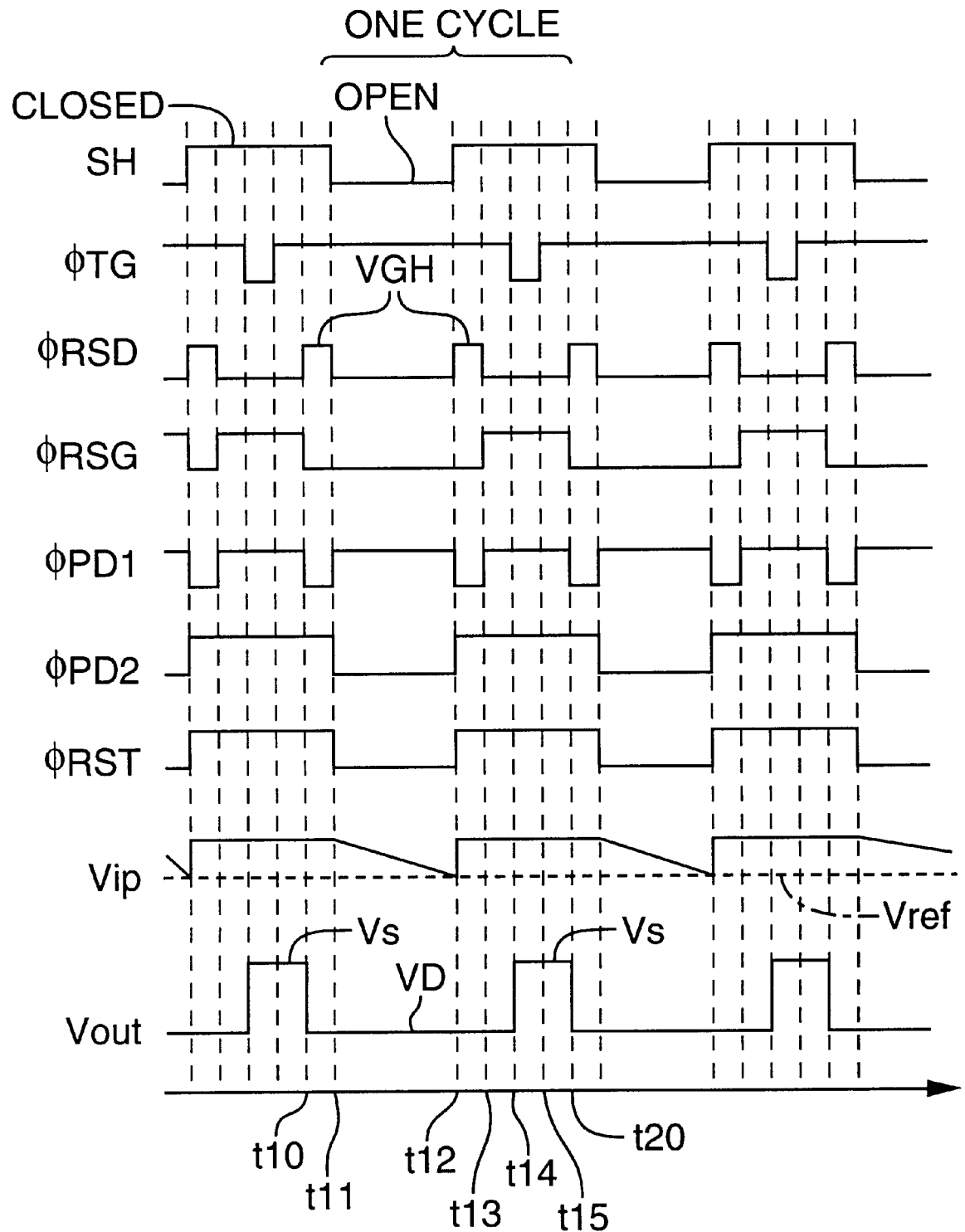
FIG. 17 is a timing chart showing the waveforms of driving pulses φTG, φRSG, and φRSD which are supplied to the photoelectric conversion device 140 of FIG. 12.

Next, a cycle of the light detection operation of the photoelectric conversion device 140 will be explained using the timing chart of FIG. 17, which shows the driving pulses used in the case where the intensity of the incident light is substantially constant over multiple cycles. For ease of explanation, a single cycle of operation from t10 to t20 will be explained.

Before t10, the shutter 1400C has been in the closed state based on the control signal SH supplied from the controller 1400D, the driving pulse φTG is at a high level, the driving pulse φRSD is at a low level, and the driving pulse φRSG is at a high level. In addition, the driving pulses φPD1, φPD2, and φRST are at high levels.

Before t10, the value of the electric signal Vout at the node N1 is Vs, corresponding to the incident light of the previous cycle, and the electric signal Vip occurring at the output terminal OUT of the photocurrent integrator 1470 is at a predetermined level (that is, in the reset state) because the reset transistor QRST is in the ON state with the driving pulse φRST at the high level. Also at this time, both the MOS transistors QPD1 and QPD2 are in the OFF state (with the driving pulses φPD1 and φPD2 high).

At t10, the driving pulse φRSG is changed to the low level, and the P-type reset transistor QRSG is turned on. The driving pulse φPD1 also becomes low, and the MOS transistor QPD1 is turned on. Also, the driving pulse φRSD reaches the readout level (i.e., the constant voltage VGH), and this constant voltage VGH is applied to the gate region 142A of the JFET 142 via the turned-on MOS transistor QPD1 and the reset transistor QRSG.

Upon the application of the constant voltage VGH to the gate region 142A of the JFET 142, the electric signal Vout occurring at the node N1 becomes the reference signal voltage VD, which corresponds to the dark output.

At t11, the control signal SH supplied from the controller 1400D becomes low, and the shutter 1400C is opened, whereby exposure starts. At this time, the driving pulse φPD1 returns to the high level, and the MOS transistor QPD1 is turned off. The driving pulse φRSD also returns to the low level.

Because the shutter 1400C is opened at t11, not only the photodiode 141, but also the gate region 142A and the reset drain 144B start generating signal charges in response to incident light. Since the MOS transistor QPD1 is in the OFF state, the voltage of the driving pulse φRSD is not applied to the reset drain 144B via the MOS transistor QPD1.

Also at t11, the driving pulse φRST is changed to the low level, and the reset state of the photocurrent integrator 1470 is ended. The driving pulse φPD2 also becomes low, and the MOS transistor QPD2 is turned on, which allows the photocurrent integrator 1470 to receive a signal charge from the reset drain 144B.

Beginning at t11, the signal charges generated by the gate region 142A and the reset drain 144B are supplied to the capacitor CL via the turned-on reset transistor QRSG and the turned-on MOS transistor QPD2, and an electric signal Vip corresponding to the potential difference between the two ends of the capacitor CL is produced at the output terminal OUT.

The value of the electric signal Vip occurring at the output terminal OUT gradually decreases during the time t11 to t12 when the shutter 1400C is open (that is, during the time when light is incident on the gate region 142A and the reset drain 144B).

The value of the electric signal Vip is compared with the reference value Vref by the comparator 1480 shown in FIG. 16. When the value of the electric signal Vip becomes equal to or less than Vref (at t12), the control signal SH supplied from the controller 1400D to the shutter 1400C is changed to the high level, and the shutter 1400C is closed. Thus, the exposure time is between t11 and t12.

The photodiode 141 generates and accumulates a signal charge in response to the incident light over the course of the exposure time.

When the electric signal Vip corresponding to the signal charge generated by the gate region 142A and the reset drain 144B reaches the reference value Vref, and when the shutter 1400C is closed based on the control signal SH being raised to the high level at t12, the driving pulse φRSD is raised to the high level (that is, to the constant voltage VGH).

Also at t12, the driving pulse φPD1 becomes low, which causes the MOS transistor QPD1 to be turned on, and the voltage of the reset drain 144B and the voltage of the gate region 142A become the constant voltage VGH of the driving pulse RSD via the turned-on MOS transistor QPD1. Thus the gate region 142A is reset.

Additionally at t12, the driving pulse φPD2 becomes high, which causes the MOS transistor QPD2 to be turned off, and the reset drain 144B is disconnected from the photocurrent integrator 1470. At this time, the driving pulse φRST is also raised to the ON (high) level, and the photocurrent integrator 1470 is reset. Also at this time, the electric signal Vip occurring at the output terminal OUT becomes the reset level, and the electric signal Vout occurring at the source 142B of the JFET 142 remains at the reference signal voltage VD corresponding to the dark output.

During the period from t11 to t12, the driving pulse φTG is kept at the high level, and the transfer transistor QTG is kept in the OFF state. Therefore, the signal charge which began to be generated at the photodiode 141 at the start of the exposure time is accumulated in the charge accumulation region (i.e., the P-type impurity diffusion layer 1412), and it is not transferred to the gate region 142A of the JFET 142.

At t13, the driving pulse φRSD is again changed to the low level, the driving pulse φRSG is changed to the high level, and the MOS transistor QPD1 is turned off with the driving pulse φPD1 going high.

The gate region 142A of the JFET 142 is thus put into a floating state, while the electric signal Vout occurring at the source (node N1) remains at VD.

At t14, the driving pulse φTG is changed to the low level, and the transfer transistor QTG is turned on.

Upon turning on the transfer transistor QTG, the signal charge generated and accumulated in the photodiode 141 during the period from t11 to t12 is transferred to the gate region 142A of the JFET 142.

Since the gate region 142A has been reset (and the shutter 1400 has been closed) before t14, the value of the electric signal Vout occurring at the source 142B (node N1) of the JFET 142 becomes Vs, which corresponds to the signal charge generated and accumulated in the photodiode 141.

At t15, the driving pulse φTG is again changed to the high level, the transfer transistor QTG is turned off, and the gate region 142A of the JFET 142 is put into a floating state, while the value of the electric signal Vout occurring at the node N1 remains at Vs, corresponding to the signal charge generated in the photodiode 141.

At t20, the driving pulse φRSD is raised to the readout level (i.e., the constant voltage VGH), and the driving pulses φRSG and φPD1 are changed from the high level to the low level.

Upon the change of the driving pulse φRSG to the low level, the P-type reset transistor QRSG is again turned on, while upon the change of the driving pulse φPD1 to the low level, the MOS transistor QPD1 is again turned on. Then, the driving pulse φRSD at the readout level VGH is applied to the drain of the reset transistor QRSG and the gate region 142A via these transistors QRSG and QPD1. Thus the gate region 142A is reset. At this time, the electric signal Vout occurring at the node N1 returns to the reference signal voltage VD corresponding to the dark output.

The operations from t10 through t20 are then repeated in the subsequent process in order to perform successive cycles of light detection.

Both the electric signal VD obtained in the period t10 to t14 and the electric signal Vs obtained in the period t14 to t20 are supplied to the signal detection circuit 1490 shown in FIG. 15, and a photosignal Vp representing the difference of these two electric signals Vs and VD is produced.

Thus, with the photoelectric conversion device 140, the intensity of the incident light to the photodiode 141 is monitored using the electric signal Vip which represents the sum of the signal charges generated by the gate region 142A and the reset drain 144B. The value of Vip gradually decreases, and when Vip becomes equal to or less than Vref, the shutter 1400C is closed, so that the optimal exposure time is selected according to the brightness of the surroundings during the actual exposure time.

In this example embodiment, the photoelectric conversion device 140 is designed so that three semiconductor regions, namely, the photodiode 141, the gate region 142A of the JFET 142, and the reset drain 144B, generate and accumulate signal charges in response to the incident light. A color filter (e.g., a blue filter) 145 is provided above the light-receiving surface of the photodiode 141.

By providing the color filter 145 above the light-receiving surface of the photodiode 141, the color component defined by the color filter 145 (i.e., the blue component in this example) is extracted from the incident light using the photoelectric conversion device 140.

Although in this embodiment the signal charges generated by the gate region 142A and the reset drain 144B are used only to determine the exposure time, these signal charges can also be added to the signal charge generated by the photodiode 141, as in the first modification of the first example embodiment above, so as to contribute to the photosignal Vp output from the photoelectric conversion device 140.

In this case, another color filter having the same color as the color filter 145 may be provided above the light-receiving surfaces of the gate region 142A and the reset drain 144B.

With the color filters of the same color, the gate region 142A and the reset drain 144B detect the same light component as the photodiode detects. Accordingly, by monitoring the intensity of this color component, the exposure time can be adjusted more accurately. In addition, by adding the signal charges generated in these regions 142A and 144B to the signal charge generated by the photodiode 141, the photoelectric conversion efficiency can be improved.

As an alternative, a color filter having a different color from the color filter 145 may be provided above the light-receiving surfaces of the gate region 142A of the JFET 142 and the reset drain 144B. For instance, a blue filter may be provided above the photodiode 141, and a red filter above the gate region 142A and the reset drain 144B.

With this arrangement (using color filters of different colors), the same effect can be achieved as is achieved by the first embodiment.

That is, for example, when an object is illuminated with red light and radiates blue light in addition to red light in return, the intensity ratio of red light to blue light may be detected. If the intensity of the radiated red light is strong, a blue filter is provided above the light-receiving surface of the photodiode 141 which has a relatively large light-receiving area, and a red filter is provided above the light-receiving surfaces of the gate region 142A of the JFET 142 and the reset drain 144B, whereby the intensity ratio of the red spectral component detected by the gate region 142A and the reset drain 144B to the blue spectral component detected by the photodiode 141 can be detected with a high degree of accuracy.

As still another alternative, a color filter (for example, a red filter) may be provided only above the light-receiving surfaces of the gate region 142A of the JFET 142 and the reset drain 144B, without providing any color filter above the light-receiving surface of the photodiode 141.

In this case, the photodiode 141 detects the intensity of the incident light, which contains various color components, while the gate region 142A and the reset drain 144B detect a specific color component of the incident light. The spectral characteristics (i.e., color information) of the incident light can be accurately obtained from the known spectral sensitivity of the detected light, based on the intensity of the specific light component detected by the gate region 142A and the reset drain 144B.

In this embodiment, the signal charges generated in the gate region 142A and the reset drain 144B are integrated by the photocurrent integrator 1470, and then the resultant signal is output from the output terminal OUT. However, if desired, the original signal charges may be output without integrating them.

Photoelectric Conversion Device Example Embodiment 4

Next, a photoelectric conversion device 150 and a photoelectric conversion apparatus 1500 according to a fourth example embodiment of the invention will be described with reference to FIGS. 18–22. Features corresponding to features of previously described embodiments are given similar reference characters, but with a "5" for the first digit. Where no specific description is given, the corresponding description above applies.

As in the photoelectric conversion device 140 of the third embodiment, the photoelectric conversion device 150 is designed so that light strikes the gate region 152A and the reset drain 154B, as well as the photodiode 151. However, unlike the third embodiment, an electric signal Vout2 corresponding to the signal charge generated by the gate region 152A is output from the source 152B of the JFET 152. An electric signal Vip corresponding to the signal charge generated by the reset drain 154B is output from the output terminal OUT of the photocurrent integrator 1570.

The electric signal Vout2 corresponding to the signal charge generated by the gate region 152A is compared with the reference value Vref1. The electric signal Vip corresponding to the signal charge generated by the reset drain 154B is compared with the reference value Vref2. If either Vout2 or Vip exceeds its associated reference value, then the shutter 1500C is closed.

Figure 18:
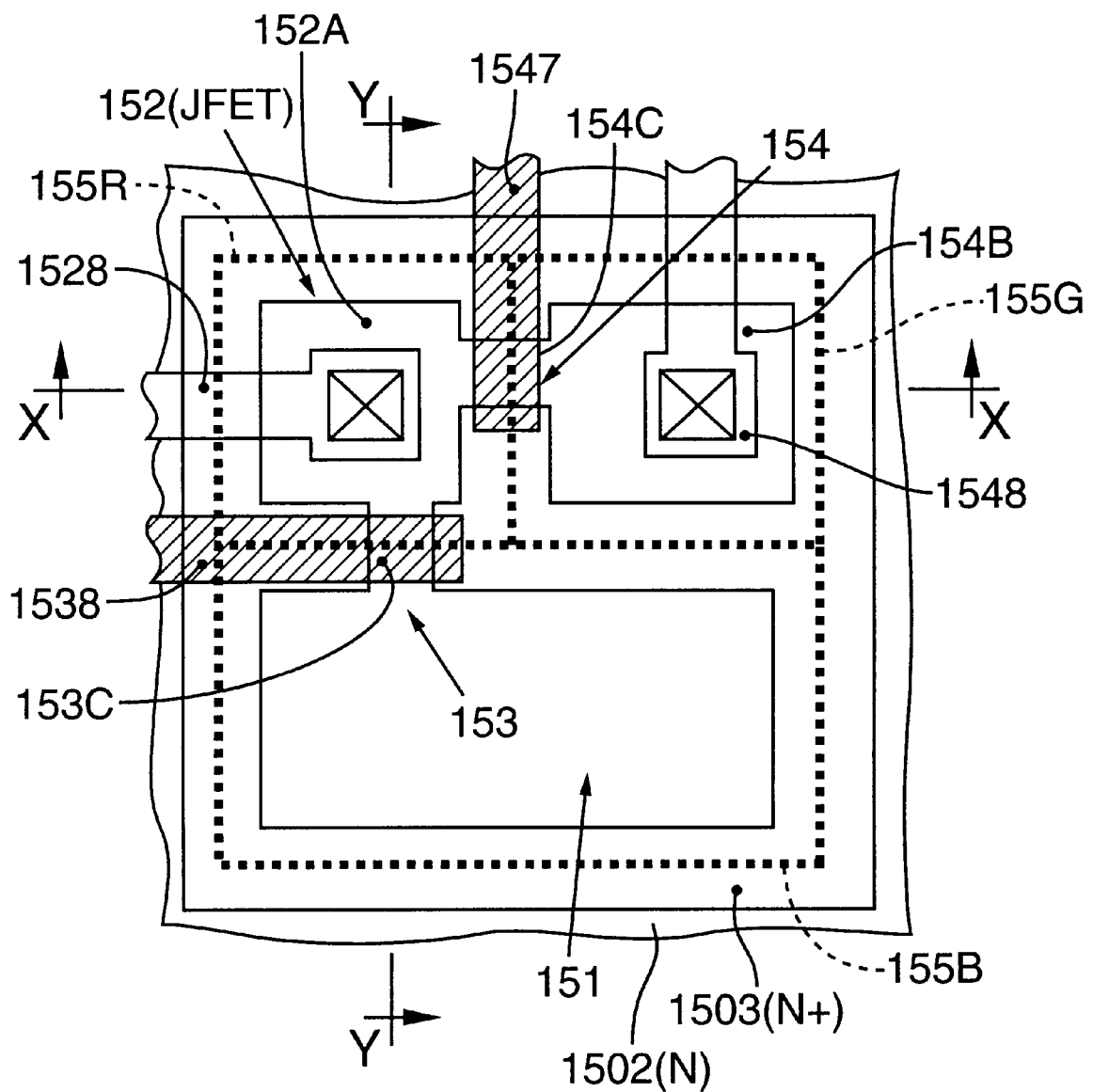
FIG. 18 is a plan view showing the structure of a photoelectric conversion device 150 according to a fourth embodiment of the invention.
Figure 19:
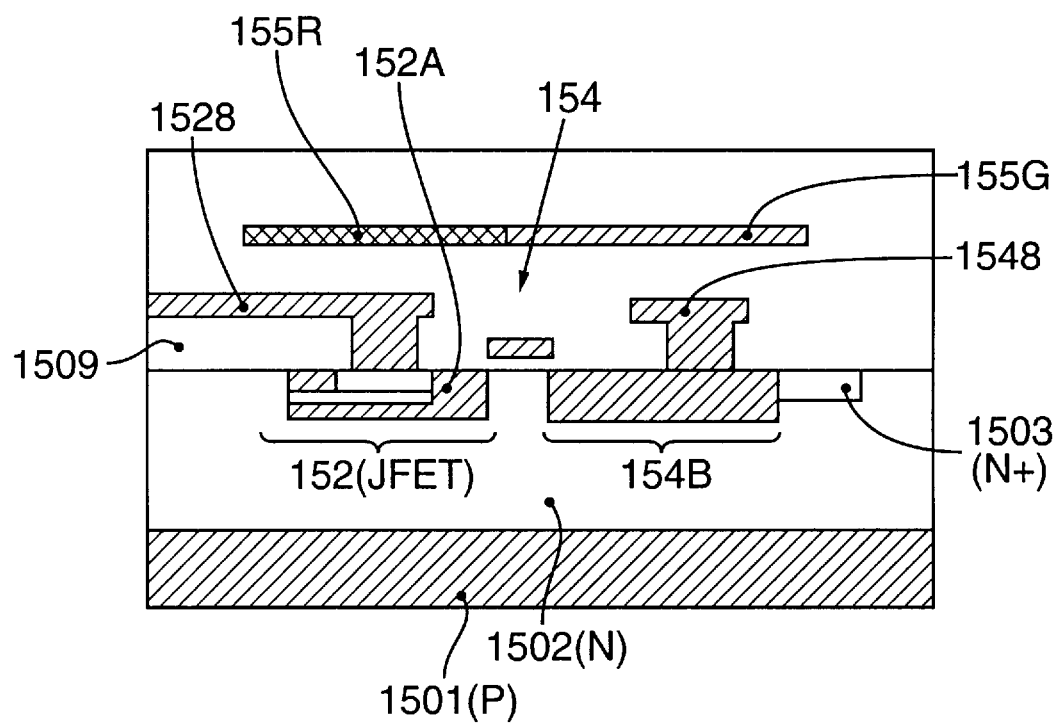
FIG. 19 is a cross-sectional view taken along the line X—X shown in FIG. 18.
Figure 20:
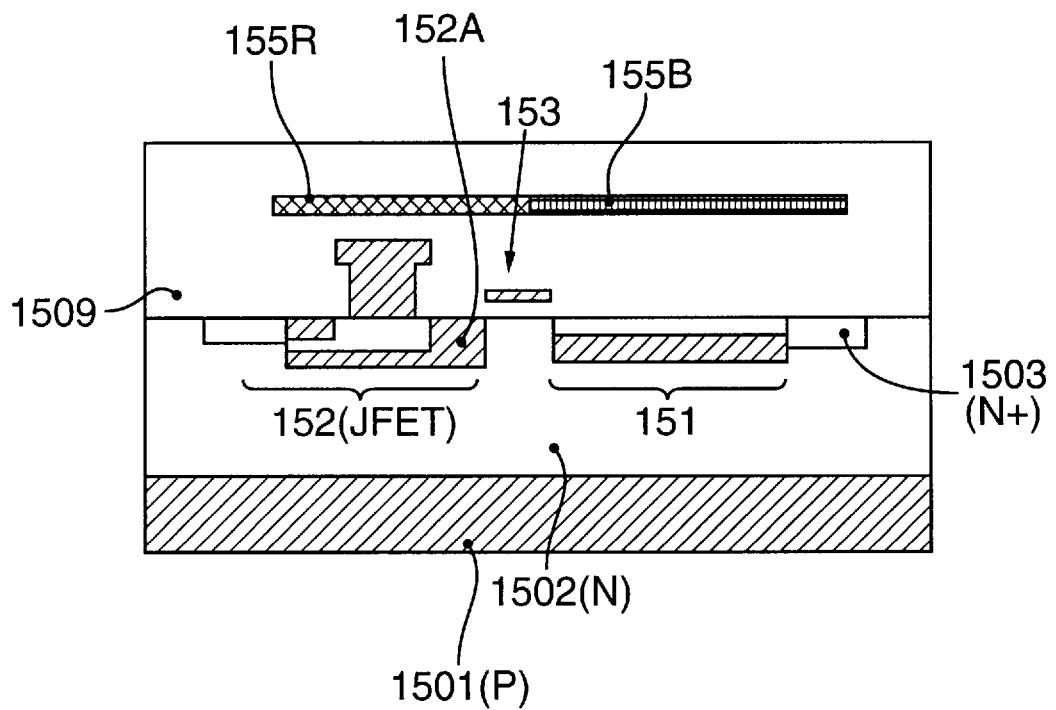
FIG. 20 is a cross-sectional view taken along the line Y—Y shown in FIG. 18.

FIGS. 18 through 20 illustrate the structure of the photoelectric conversion device 150 of this embodiment. Similar to the photoelectric conversion device 140 of the third embodiment, the photoelectric conversion device 150 comprises a photodiode 151 for generating a signal charge corresponding to the incident light; an amplification transistor (JFET) 152 for outputting an electric signal (Vout) supplied to its gate region 152A; a P-type transfer transistor 153 for supplying or transferring the signal charge generated and accumulated in the photodiode 151 to the gate region 152A; and a P-type reset transistor 154 for removing the signal charge supplied to the gate region 152A.

As shown in FIGS. 19 and 20, no blocking film is provided at least above the gate region 152A of the JFET 152 and the reset drain 154B of the reset transistor 154, in order to allow the gate region 152A and the reset drain 154B to generate signal charges in response to the incident light.

The signal charge generated by the gate region 152A occurs as an electric signal Vout directly at the source of the JFET 152. On the other hand, the signal charge generated by the reset drain 154B occurs as an electric signal Vip at the output terminal OUT of the photocurrent integrator 1570.

In this photoelectric conversion device 150, a color filter 155B is provided above the photodiode 151, a color filter 155R is provided above the gate region 152A, and a color filter 155G is provided above the reset drain 154B. Only this part of the arrangement differs from the photoelectric conversion device 140 of the third embodiment; the rest of the structure is the same.

Figure 21:
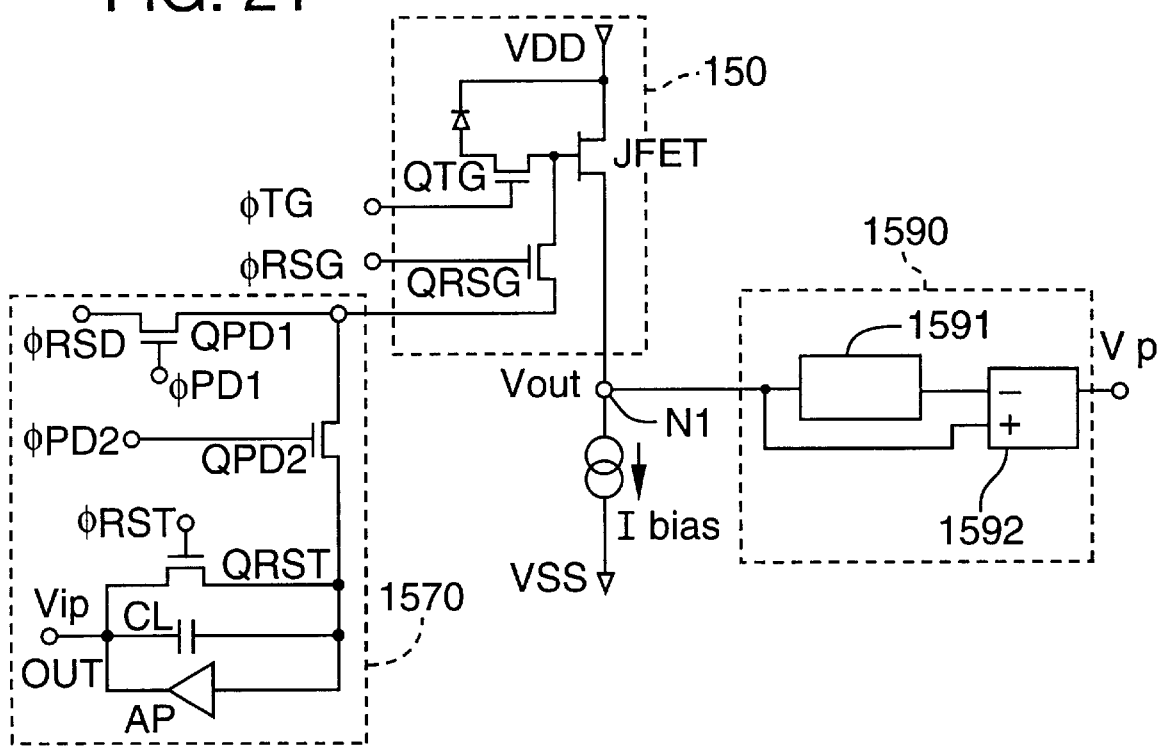
FIG. 21 is a circuit diagram showing the photoelectric conversion device 150 and a signal detection circuit 1590.
Figure 22:
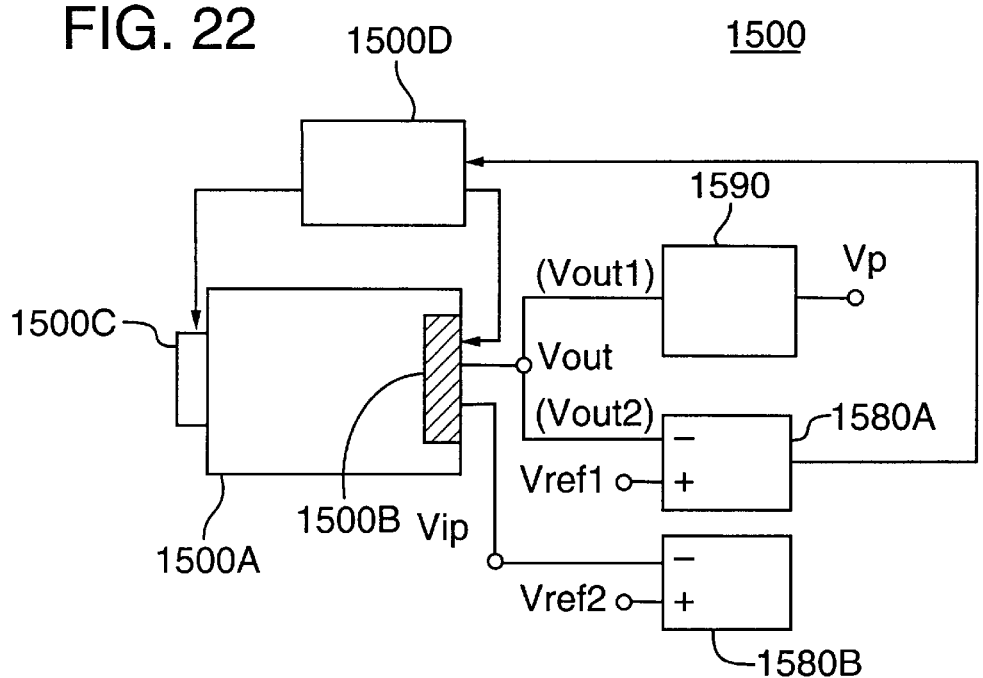
FIG. 22 is a schematic block diagram of a photoelectric conversion apparatus 1500 which uses the photoelectric conversion device 150 as a light-receiving device 1500B.
Figure 23:
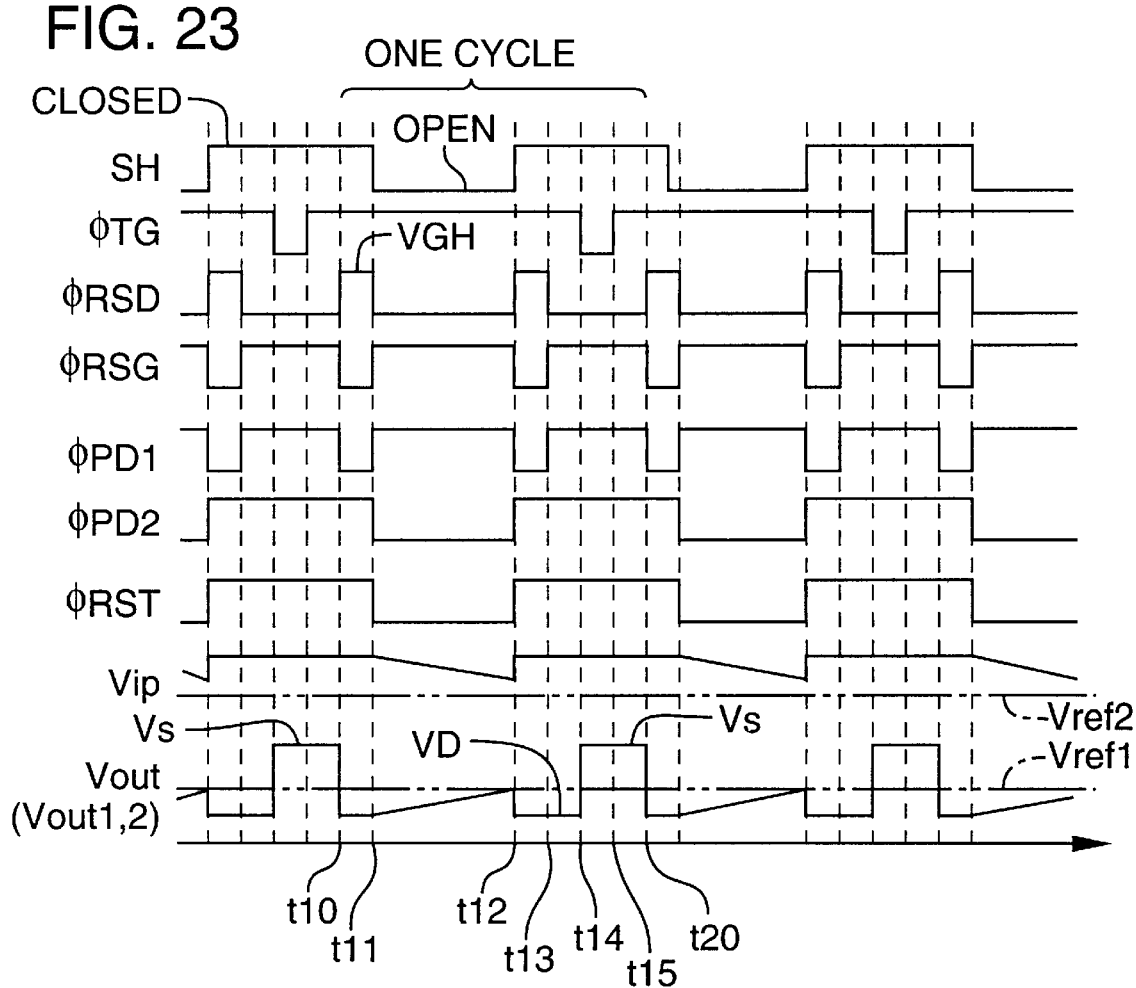
FIG. 23 is a timing chart showing the waveforms of driving pulses φTG, φRSG, and φRSD which are supplied to the photoelectric conversion device 150 of the fourth embodiment.
Figure 24:
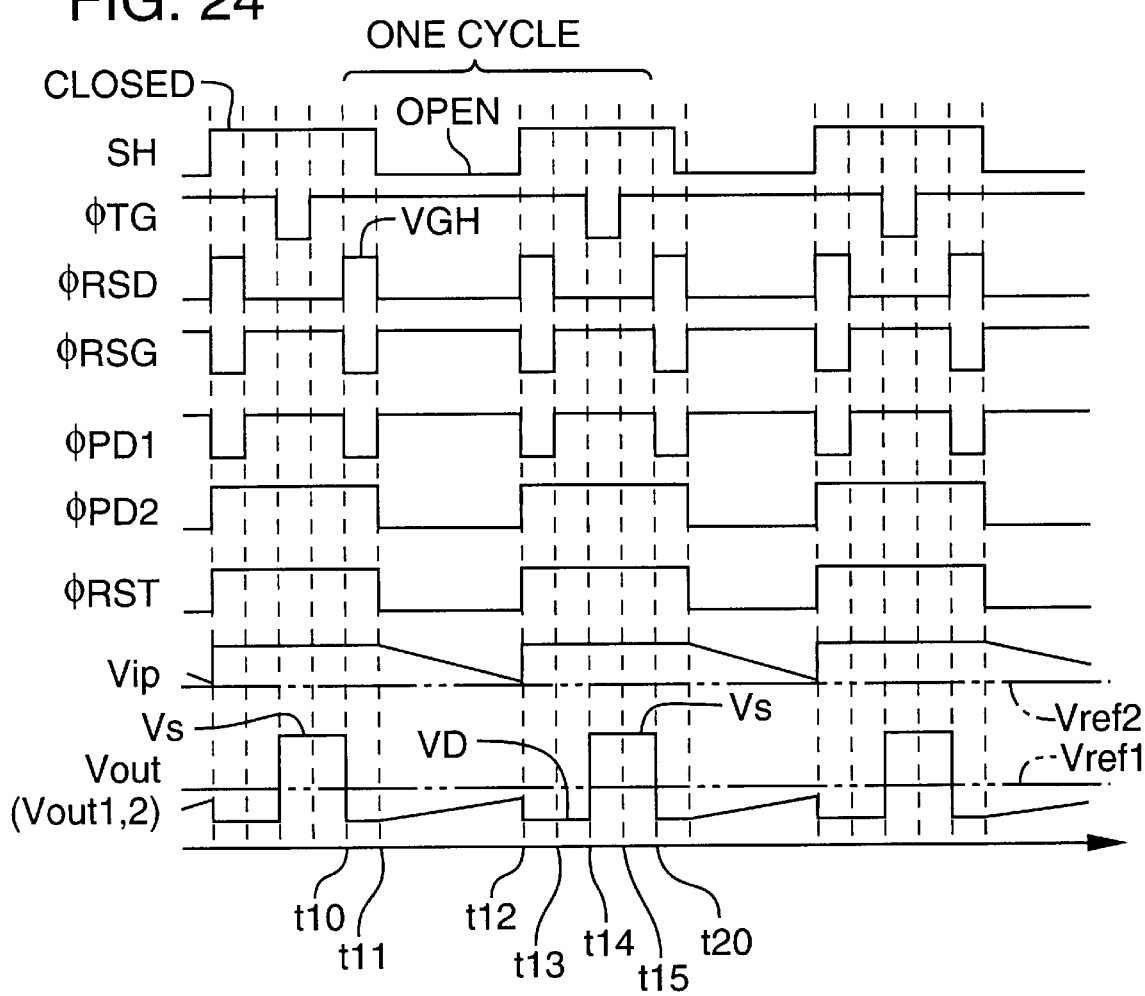
FIG. 24 is a timing chart showing the waveforms of driving pulses φTG, φRSG, and φRSD which are supplied to the photoelectric conversion device 150 of FIG. 18.

FIG. 21 is a circuit diagram showing the photoelectric conversion device 150 and the signal detection circuit 1590 connected to the photoelectric conversion device 150. FIG. 22 illustrates the photoelectric conversion apparatus 1500 using the photoelectric conversion device as a light-receiving device. FIGS. 23 and 24 are timing charts used for explaining the operation of the photoelectric conversion device 150.

In the photoelectric conversion device 150 having the circuit structure shown in FIG. 21, the electric signal Vout1, corresponding to the signal charge generated by the photodiode 151, and the electric signal Vout2, corresponding to the signal charge generated by the gate region 152A, occur at the source of the JFET 152 at different times because of the source-follower action of the JFET 152. The electric signal Vip corresponding to the signal charge generated by the reset drain 154B occurs at the output terminal OUT of the photocurrent integrator 1570. The structure and the operation of the photocurrent integrator 1570 are the same as those of the photocurrent integrator 1470 used in the third embodiment, and detailed explanation will therefore be omitted here.

FIG. 22 is a block diagram showing the overall structure of the photoelectric apparatus 1500 using the photoelectric conversion device 150 as a light-receiving device 1500B.

As shown in this figure, three signals Vout1, Vout2, and Vip are output from the light-receiving device 1500B, which comprises the photoelectric conversion device 150 and a driving circuit (not shown). The electric signal Vout1 is supplied to the signal detection circuit 1590, the electric signal Vout2 is supplied to the comparator 1580A, and the electric signal Vip is supplied to the comparator 1580B. This arrangement differs from the photoelectric apparatus 1400 of the third example embodiment.

With this arrangement, the signal detection circuit 1590 subtracts the reference signal voltage VD, which corresponds to the dark output, from the electric signal Vout1, which corresponds to the signal charge generated by the photodiode 151. The signal detection circuit 1590 outputs a resulting photosignal Vp.

The electric signal Vout2 corresponding to the signal charge generated by the gate region 152A is compared with the reference value Vref1, while the electric signal Vip corresponding to the signal charge generated by the reset drain 154B is compared with the reference value Vref2. The controller 1500D outputs a control signal SH for controlling the opening time (i.e., the exposure time) of the shutter 1500C built into the dark box 1500A based on the comparison results.

The light-detection operation of the photoelectric conversion device 150 will now be explained using the timing chart of FIG. 23, which shows the driving pulses used in the case where the intensity of the incident light is substantially constant over multiple cycles. For ease of explanation, a single cycle of operation from t10 to t20 will be explained.

Before t10 the shutter 1500C has been in the closed state based on the control signal SH supplied from the controller 1500D. The driving pulse φTG is at a high level, the driving pulse φRSD is at a low level, and the driving pulse φRSG is at a high level. In addition, the driving pulses φPD1, φPD2, and φRST are at high levels.

The value of the electric signal Vout occurring at the node N1 is Vs, corresponding to the incident light of the previous cycle, and the electric signal Vip occurring at the output terminal OUT of the photocurrent integrator 1570 is at ground level (that is, in the reset state).

At t10, the driving pulse φRSG is changed to the low level, which causes the P-type reset transistor QRSG to be turned on. The driving pulse φPD1 also becomes low, which causes the MOS transistor QPD1 to be turned on.

The driving pulse φRSD reaches the readout level (i.e., the constant voltage VGH). This constant voltage VGH is applied to the reset drain 154B of the reset transistor QRSG via the turned-on MOS transistor QPD1. The potential of the reset drain 154B is further supplied to the gate region 152A of the JFET 152.

At t11, the control signal SH supplied from the controller 1500D becomes low, and the shutter 1500C is opened, whereby exposure starts. Upon the opening of the shutter 1500C, the gate region 152A and the reset drain 154B, as well as the photodiode 151, start generating signal charges in response to incident light.

Also at t11, the driving pulse φRSD is changed to the low level, the driving pulse φRSG is changed to the high level, the driving pulse φPD1 is changed to the high level, the driving pulse φPD2 is changed to the low level, and the driving pulse φRST is changed to the low level.

Upon the change of the driving pulse φRSG to the high level, the reset transistor QRSG is turned off. Consequently, the signal charge generated by the gate region 152A of the JFET 154 is accumulated in this gate region 152A alone, and the electric signal Vout2 occurring at the source of the JFET 152 takes on a value corresponding to this signal charge. The value of the electric signal Vout2 gradually increases during the time when the shutter 1500C is open (t11 to t12).

In addition, at t11, the change of the driving pulse φRST to the low level terminates the reset state of the photocurrent integrator 1570. The change of the driving pulse φPD2 to the low level causes the MOS transistor QPD2 to be turned on, whereby the signal charge generated by the reset drain 154B starts being integrated by the photocurrent integrator 1570.

Thus, beginning at t11, the signal charge generated by the reset drain 154B is integrated by the photocurrent integrator 1570 via the turned-on MOS transistor QPD2, and the electric signal Vip corresponding to the integral value occurs at the output terminal OUT. At this time, the MOS transistor QPD1 is in the OFF state with the driving pulse φPD1 at the high level.

The value of the electric signal Vip occurring at the output terminal OUT gradually decreases during the time when the shutter 1500C is open (t11 to t12).

The gradually varying electric signals Vout2 and Vip are compared with the reference values Vref1 and Vref2, respectively, by the comparators 1580A and 1580B shown in FIG. 22. When either Vout2 or Vip exceeds its associated reference value (Vref1 or Vref2), the comparison result is supplied to the controller 1500D. The timing chart of FIG. 23 shows the case in which the electric signal Vout2 exceeds the reference value Vref1, and the timing chart of FIG. 24 shows the case in which the electric signal Vip exceeds the reference value Vref2.

Upon receiving the comparison result, the controller 1500D changes the control signal SH to the high level in order to close the shutter 1500C. The exposure time thus ends.

At t12, at which time either Vout2 or Vip exceeds the associated reference value Vref1 or Vref2, the driving pulse φRSD is raised to the readout level VGH, and the driving pulses φRSG and φPD1 are changed to the low level.

The change of the driving pulse φPD1 to the low level causes the MOS transistor QPD1 to be turned on. The change of the driving pulse φRSG to the low level causes the reset transistor QRSG to be turned on.

The readout voltage VGH is supplied to the reset drain 154B via the turned-on MOS transistor QPD1. The readout voltage VGH is further supplied to the gate region 152A of the JFET 152 via the turned-on MOS transistor QPD1 and the reset transistor QRSG, whereby the gate region 152A is reset.

The voltage VGH supplied to the gate region 152A causes the electric signal Vout occurring at the source of the JFET 152 to reach the reference signal voltage VD, which corresponds to the dark output.

In addition, the change of the driving pulse φPD2 to the high level causes the MOS transistor QPD2 to be turned off. At this time, the driving pulse φRST is changed to the high level, and the photocurrent integrator 1570 is reset.

During the period from t11 to t12, the driving pulse φTG is kept at the high level, and the transfer transistor QTG is kept in the OFF state. Therefore, the signal charge which begins accumulating in the photodiode 151 at the start of the exposure time is accumulated in photodiode 151 alone, without being transferred to the gate region 152A of the JFET 152.

At t13, the driving pulse φRSD is again changed to the low level, and the driving pulse φRSG is changed to the high level. At this time, the gate region 152A of the JFET 152 is put into a floating state, while the electric signal Vout at the source (node N1) remains at VD.

At t14, the driving pulse φTG is changed to the low level, and the transfer transistor QTG is turned on.

Upon turning on the transfer transistor QTG, the signal charge generated and accumulated in the photodiode 151 during the period from t11 to t12 is transferred to the gate region 152A of the JFET 152. Because the gate region 152A has already been reset to the readout level, and because the shutter 1500C has already been closed before t14, the value of the electric signal Vout occurring at the source (i.e., the node N1) of the JFET 152 becomes Vs, corresponding to the signal charge generated and accumulated in the photodiode 151.

At t15, the driving pulse φTG is changed to the high level, the transfer transistor QTG is turned off, and the gate region 152A of the JFET 152 is put into a floating state, while the value of the electric signal Vout at the node N1 remains at Vs.

At t20, the driving pulses φRSG and φPD1 are changed from the high level to the low level, and the driving pulse φRSD is raised to the high level (to VGH).

Upon the change of the driving pulse φRSG to the low level, the P-type reset transistor QRSG is again turned on. Upon the change of the driving pulse φPD1 to the low level, the MOS transistor QPD1 is again turned on. The driving pulse φRSD at the readout level VGH is thus applied to the drain of the reset transistor QRSG and the gate region 152A via the turned-on transistors QRSG and QPD1, whereby the gate region 152A is reset. At this time, the electric signal Vout at the node N1 returns to the reference signal voltage VD corresponding to the dark output.

The operations from t10 through t20 are then repeated in order to perform successive cycles of light detection.

Both the electric signal VD obtained in the period t10 to t14 and the electric signal Vs obtained in the period t14 to t20 are supplied to the signal detection circuit 1590. A photosignal Vp representing the difference of these two electric signals Vs and VD is produced.

Thus, with the photoelectric conversion device 150, the electric signals Vout2 and Vip, which correspond to the signal charges generated by the gate region 152A and the reset drain 154B, respectively, are compared with the reference values Vref1 and Vref2 by the comparators 1580A and 1580B, respectively. The intensity of the incident light is monitored based on the comparison results in order to control the open-time of the shutter 1500C, whereby the optimal exposure time can be determined and employed. In other words, the exposure time is controlled based on the signal charges generated by the gate region 152A and the reset drain 154B. Thus an object can be photographed with an exposure time that is optimal in relative to the brightness of the surroundings, as represented by these signal charges.

In this fourth example embodiment, the photoelectric conversion device 150 is designed so that three semiconductor regions, namely, the photodiode 151, the gate region 152A of the JFET 152, and the reset drain 154B, generate and accumulate signal charges in response to incident light. A blue filter 155B is provided above the light-receiving surface of the photodiode 151, a red filter 155R is provided above the light-receiving surface of the gate region 152A of the JFET 152, and a green filter 155G is provided above the light-receiving surface of the reset drain 154B.

By providing the color filters 155B, 155R and 155G above the light-receiving surfaces of the photodiode 151, the gate region 152A of the JFET 152, and the reset drain 154B, respectively, the spectral characteristics (i.e., the color information) of the incident light can be obtained in more detail.

The photoelectric conversion device 150 using color filters of different colors has the same effect and advantages in measuring the properties of an object as in the third example embodiment described above.

In the fourth embodiment, the signal charge generated by the reset drain 154B is integrated by the photocurrent integrator 1570, and then it is output from its output terminal OUT. However, if desired, this signal charge can be output without being integrated.

As has been described above, in the photoelectric conversion apparatuses using the photodiodes 121, 131, 141, and 151 according to the first through fourth example embodiments, the exposure time is determined based on the signal charges generated by the gate regions 122A, 132A, 142A, and 152A and/or the signal charges generated by the reset drains 144B and 154B, respectively. However, as an alternative, the time during which the shutters 1200C, 1400C, and 1500C are held open (i.e., the exposure time) may be fixed in order to obtain color information based on the signal charges generated by the gate regions 122A, 132A, 142A, and 152A, and/or the reset drains 144B and 154B during this fixed exposure time. In this case, the color information is added to the intensity information obtained from the light intensity detected by the photodiodes 121, 131, 141, and 151, whereby more precise detection of the spectral components can be achieved.

Although, in the third and fourth embodiments, the signal charges generated by the reset drains 144B and 154B in response to the incident light are output from the photocurrent integrator 1470 and 1570, these signal charges can also be transferred to the gate regions 142A and 152A of the JFETs 142 and 152, respectively. In that case, electric signals corresponding to these signal charges are output from the source (i.e., the node N1) of the JFETs 142 and 152, respectively.

This arrangement can be achieved by turning on the reset transistors QRSG (144 and 154) during the generation of the signal charges in the reset drains 144B and 154B in order to make the potentials of the reset drains 144B and 154B equal to the potentials of the gate regions 142A and 152A of the JFETs 142 and 152, respectively. As a result, electric signals corresponding to the signal charges generated by the reset drains 144B and 154B occur at the sources of the JFETs 142 and 152, respectively.

In this case, electric signals corresponding to the signal charges generated by the gate regions 142A and 152A of the JFETs 142 and 152 may be output from the sources of the JFETs 142 and 152 independently from the electric signals corresponding to the signal charges generated by the reset drains 144B and 154B, or alternatively, the signal charges generated by the gate regions 142A and 152A of the JFETs 142 and 152 may be added to the signal charges generated by the reset drains 144B and 154B, respectively, and electric signals representing the sum of these signal charges may be output from the sources (i.e., the nodes N1) of the JFETs 142 and 152. This can be achieved by appropriately adjusting the high/low switching timing of the driving pulse φRSG supplied to the gates 144C and 154C of the reset transistors QRSG (144 and 154).

As another alternative, the electric signal corresponding to the signal charge generated by the gate region 142A (or 152A in the fourth embodiment), and the electric signal corresponding to the signal charge generated by the reset drain 144B (or 154B), which are output independently of each other, may be added to or output separately from the electric signal corresponding to the signal charge generated by the photodiode 121. In the former case, the sum is output from the source (i.e., the node N1) of the JFET 142 (or 152), while, in the latter case, the three independent electric signals are output from the source of the JFET 142 (or 152).

In the third and fourth embodiments, the photoelectric conversion devices 140 and 150 are designed so that both the gate regions 142A and 152A of the JFET 142 and 152, and the reset drains 144B and 154B generate signal charges in response to the incident light. However, the gate regions 142A and 152A of the JFETs 142 and 152 may be covered, for example, with the reset drain interconnection (e.g., aluminum interconnection), so that only the reset drains 144B and 154B generate signal charges.

In this case, the signal charges generated by the reset drains 144B and 154B are transferred to the gate regions 142A and 152A of the JFETs 142 and 152, respectively, and are output from the sources (i.e., the nodes N1) of the JFETs 142 and 152. Alternatively, they may be output from the drain of the reset transistor QRSG (124).

Although, in the first through fourth embodiments, the structures and operations of the photoelectric conversion devices 120, 130, 140, and 150 were explained on the assumption that a single unit is used, a plurality of photoelectric conversion devices may be arranged in an array in order to form an image sensor.

In the first, third and fourth embodiments, two-valued driving pulses φRSD having a high level (i.e., the readout level VGH) and a low level, are supplied to the reset drains 124B, 144B and 154B of the photoelectric conversion devices 120, 140 and 150. However, the photoelectric conversion devices 120, 140, and 150 may be designed so that constant level (i.e., high level VGH) signals are supplied to the reset drains 124B, 144B, and 154B.

In the second embodiment, a three-valued driving pulse φRSD having a peak (VGH), an intermediate level VGM, and a low level is supplied to the reset drain of the photoelectric conversion device 130. However, the photoelectric conversion device 130 may be configured so that a two-valued driving pulse φRSD is supplied to the reset drain, as in the first embodiment. Alternatively, the photoelectric conversion device 130 may be configured so that a constant level (VGH) signal is supplied to the reset drain.

In the first through fourth embodiments, the time during which the shutter is held open (i.e., the exposure time) is controlled based on the signal charge generated by the secondary light-receiving elements (i.e., the gate region and the reset drain). However, the signal charges generated by these secondary light-receiving elements (i.e., the gate region and the reset drain) may be simply output from the photoelectric conversion device when exposure-time control is not performed.

In the photoelectric conversion devices 120, 130, 140 and 150 according to the first through fourth embodiments of the invention, a transfer transistor is positioned between the photodiode, which is a photoelectric conversion element, and the amplification transistor, which is an output unit. However, the invention also encompasses a photoelectric conversion device having no transfer transistor, in which the photodiode and the control electrode of the amplification transistor are electrically connected directly to each other, or the photodiode and the amplification transistor are integratedly formed as a single unit. In this case, the photodiode or the phototransistor is used as a primary light-receiving element, and the reset drain of the reset transistor is used as a secondary light-receiving element.

As has been described above, the control electrode (gate) of the amplification transistor, in addition to the photoelectric conversion element, can generate a signal charge in response to incident light. The total light-receiving area of the photoelectric conversion device is thus substantially increased, and the photoelectric conversion rate of each pixel is improved.

A light component having a specific wavelength can be efficiently detected based on the spectral component of the incident light. The color information of the incident light can also be detected precisely.

Because the brightness of the surroundings of the photoelectric conversion apparatus is monitored based on the signal charge generated by the control electrode, and because the exposure time is automatically adjusted based on the monitoring result, a clear image can always be obtained.

One of the main electrodes of the reset transistor can also generate a signal charge in response to the incident light, in addition to the photoelectric conversion element. Consequently, the total light-receiving area of the photoelectric conversion device can be increased, and the photoelectric conversion rate of each pixel can be improved.

Furthermore, both the control electrode of the amplification transistor and one of the main electrodes of the reset transistor can generate signal charges in response to the incident light, in addition to the photoelectric conversion element. Consequently, the total light-receiving area of the photoelectric conversion device can be increased, and the photoelectric conversion rate of each pixel can be improved.

The photoelectric conversion devices of the present invention are particularly useful as pixels in an image sensor array, and particularly as pixels in a fixed-image image sensor array, such as useful in digital photography. In such an array, not every pixel need be of the inventive type, i.e., not every pixel need have multiple light-sensitive elements in order to provide the important advantage of directly monitoring exposure light during the exposure. Fourteen example pixel forms useful in such a fixed-image image sensor array are described below, particularly in terms of their differences from known pixels for use in such arrays as described above with reference to FIGS. 54 and 55. Both pixels with multiple light sensitive elements and pixels with single light sensitive elements are described.

Pixel 1

Figure 25A:
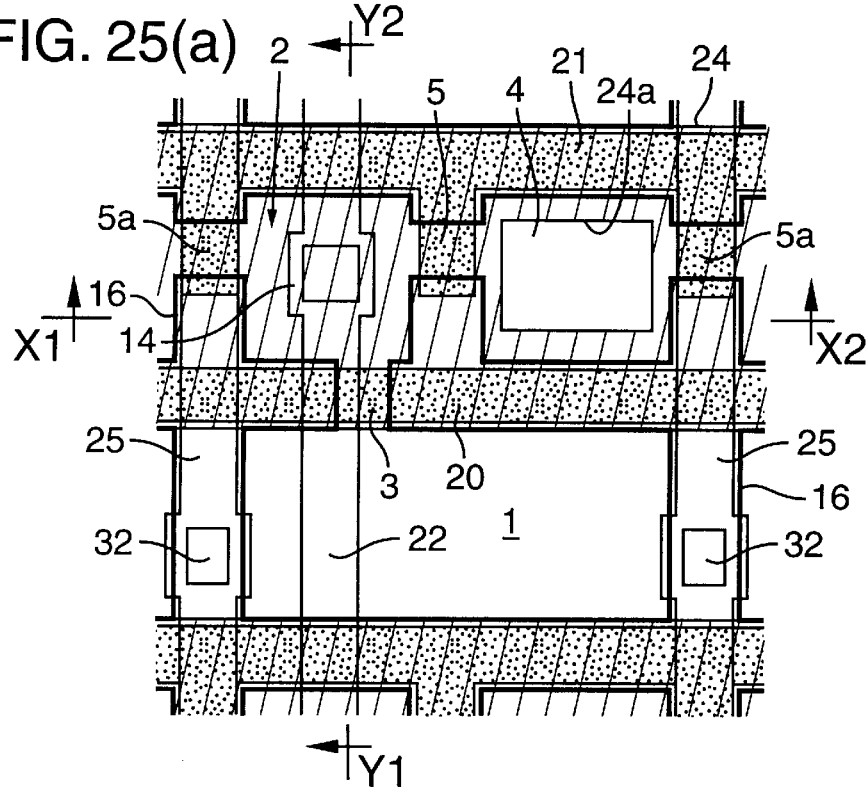
FIG. 25(a) is a plan view.
Figure 25B:
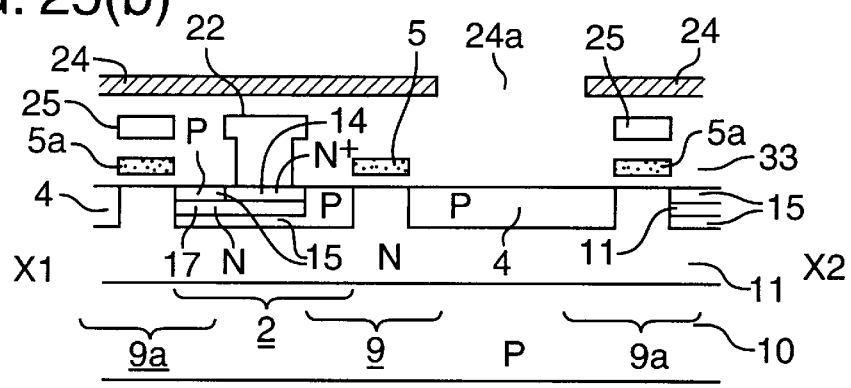
FIG. 25(b) is a cross-sectional view taken along the line X1–X2 in FIG. 25(a)
Figure 25C:
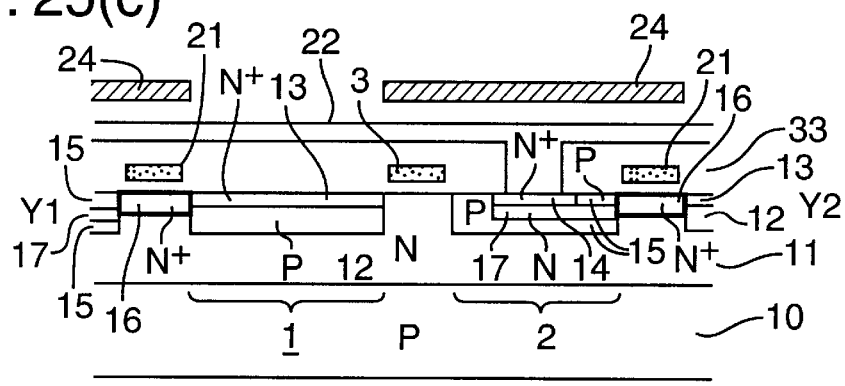
FIG. 25(c) is a cross-sectional view taken along the line Y1–Y2 in FIG. 25(a).
Figure 26A:
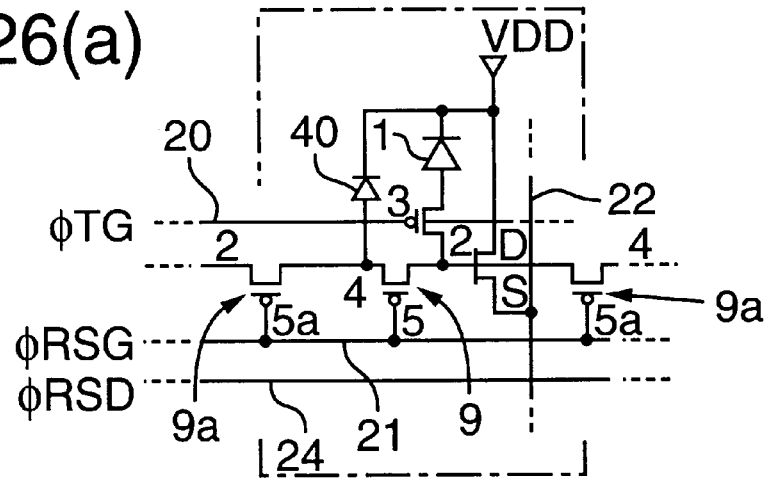
FIG. 26(a) corresponds to the pixel of FIG. 25, and FIGS. 26(b) and 26(c) to modifications thereof.

FIG. 25 shows a first pixel example. FIG. 25(a) is a plan view, FIG. 25(b) is a cross-sectional view taken along the X1–X2 line in FIG. 25(a), and FIG. 25(c) is a cross-sectional view taken along the Y1–Y2 line in FIG. 25(a). FIG. 26(a) is a circuit diagram showing the equivalent circuits of this first pixel.

Figure 54A:
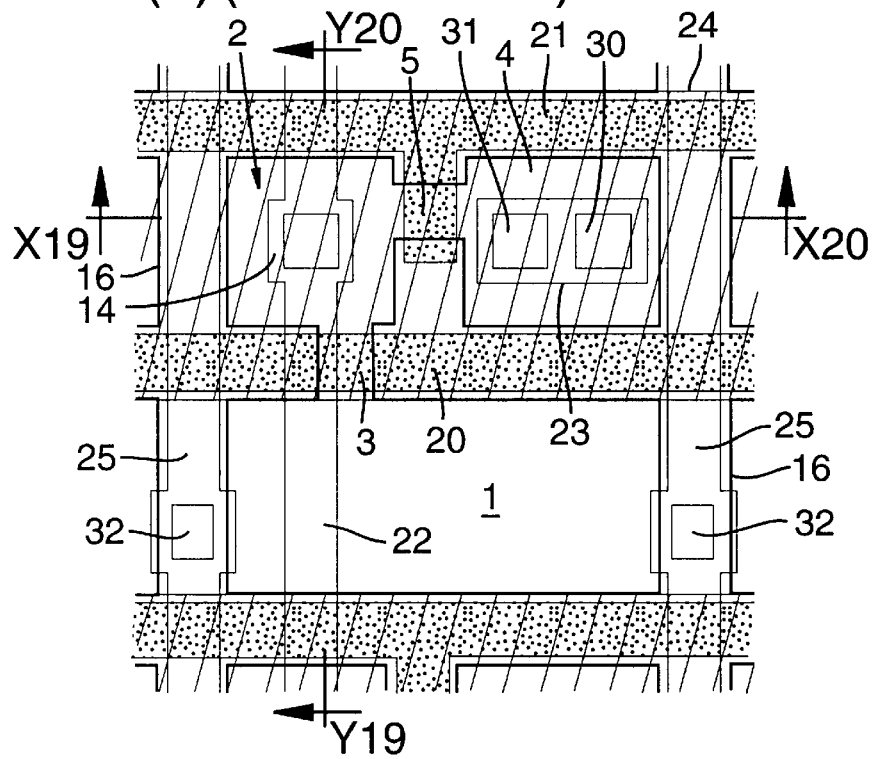
FIG. 54(a) is a plan view.
Figure 54B:
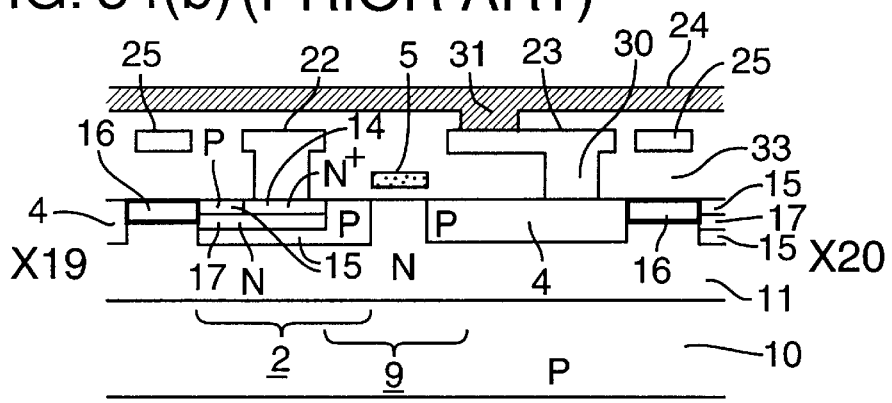
FIG. 54(b) is a cross-sectional view taken along the line X19–X20 in FIG. 54(a)
Figure 54C:
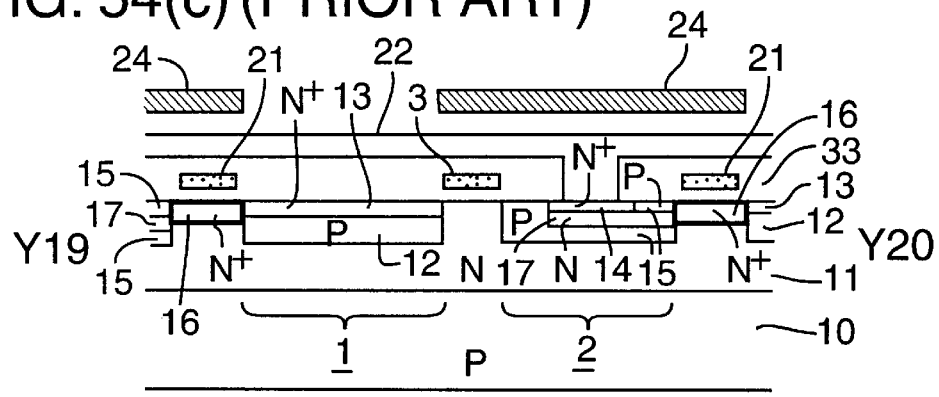
FIG. 54(c) is a cross-sectional view taken along the line Y19–Y20 in FIG. 54(a).
Figure 55:
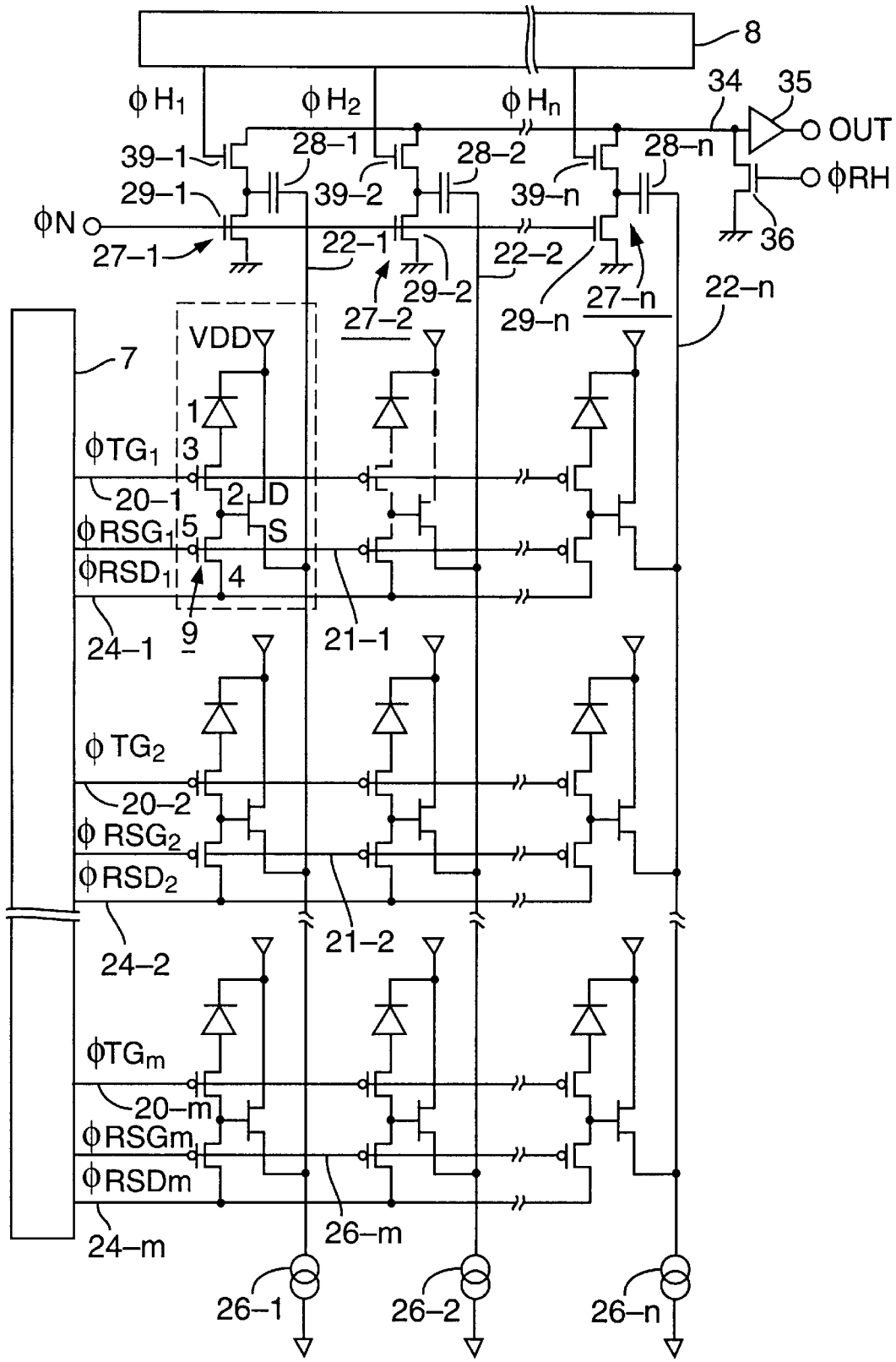
FIG. 55 (prior art) is a circuit diagram of an equivalent circuit of an image sensor array employing pixels such as the pixel of FIG. 54.
Figure 56A:
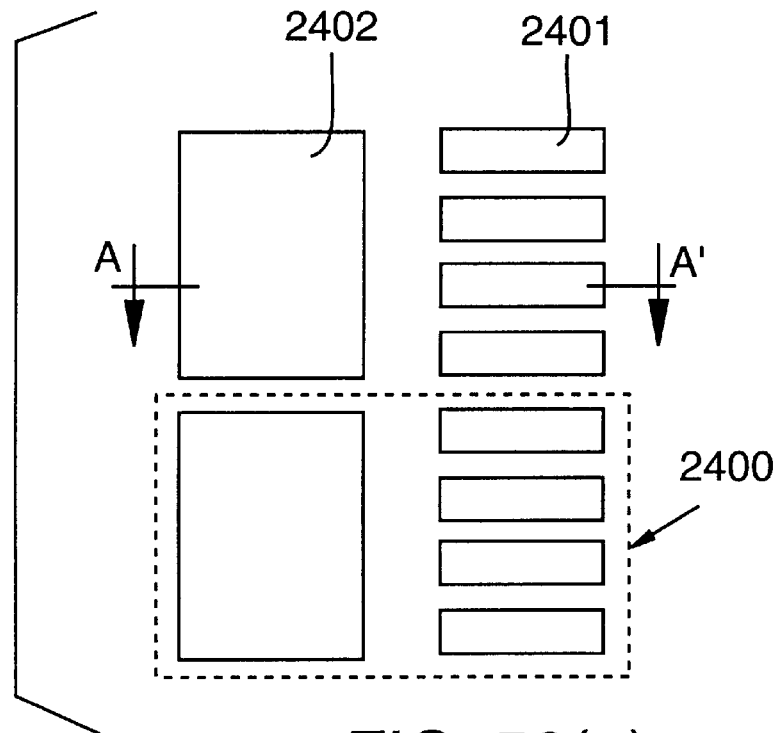
FIG. 56(a) is a plan view.
Figure 56B:
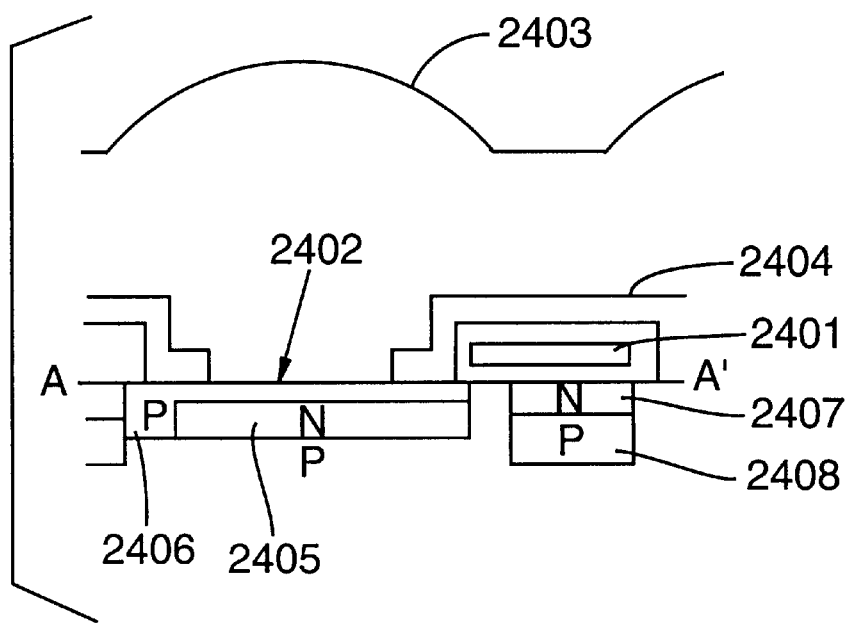
FIG. 56(b) is a cross-sectional view taken along the line A-A' in FIG. 56(a).

In FIG. 25 and FIG. 26(a), identical or corresponding elements in FIGS. 54 and 55 are assigned the same reference characters. Note that left-right orientation of FIG. 25(a) and 25(b) is reversed from that of FIG. 26(a).

This first pixel differs from the pixel shown in FIG. 54 in the following respects.

In the pixel shown in FIG. 54, reset drain interconnect 24, which also functions as a light shielding film, also shields light from the reset drain 4 area. However, in this first pixel, aperture 24a is formed on the area of reset drain 4 where reset drain interconnect 24 is located, making it possible for a portion of reset drain 4 to receive incoming light. Reset drain 4 is a P-type semiconductor area, with an N-type semiconductor area 11 (of opposite conductivity) below. Since reset drain 4 and N-type semiconductor area 11 are constantly in inverse bias (VDD>φRSD), the reset drain 4 in this first pixel functions as photodiode 40, separately from the photodiode 1 that serves as the photoelectric conversion element. This photodiode 40 generates photoelectric current in the form of signal charges (in this example, holes) generated in proportion to the light entering aperture 24a. In other words, in pixel 1, the exposed area of reset drain 4 generates a signal charge proportional to the incoming light.

As an additional difference, in the pixel shown in FIG. 54, reset drain 4 (P-type semiconductor area) is directly connected electrically to reset drain interconnect 24 via contact 30, relay 23, and relay contact 31. However, in the first pixel, these are removed, and reset drain 4 is not directly connected electrically to reset drain interconnect 24. Removing relay 23, etc., from the first pixel increases the aperture ratio of said photodiode 40.

Furthermore, in the pixel shown in FIG. 54, reset drain 4 and JFET 2 gate 15 serve respectively as primary electrode areas for one another, together forming part of a P-channel MOSFET 9, a reset transistor for which reset gate electrode 5 serves as a control electrode. There is no switching element between the adjacent pixels on either side in the row direction (in the horizontal scan direction, left-to-right in the figure). In other words, there is no inter-pixel switching element.

In contrast, the first pixel is equipped with gate electrodes 5a on both sides of the pixel (left and right in the figures), in addition to reset gate electrode 5 near the center of the pixel. The gate electrode 5a on the left in FIGS. 25(a) and 25(b) is located in the boundary area between P-type gate area 15 of the pixel and a reset drain 4 of an adjacent pixel in the row direction (to the left in the figures). The gate electrode 5a on the right in FIGS. 25(a) and 25(b) is located in the boundary area between reset drain 4 of the pixel and a P-type gate area 15 of an adjacent pixel in the row direction (to the right in the figures). The gate electrodes 5a are formed of polysilicon and are separated from the underlying semiconductor material by a layer of an insulating material 33, as is reset gate electrode 5. Gate electrodes 5a and reset gate 5 are connected in common by a reset gate interconnection 21.

The first pixel does not have the high-density N-type drain area 16 that functions as a pixel separator area in the pixel of FIG. 54. The corresponding area, is left as N-type semiconductor in the form of N-type semiconductor area 11.

Pixel 2

Figure 26B:
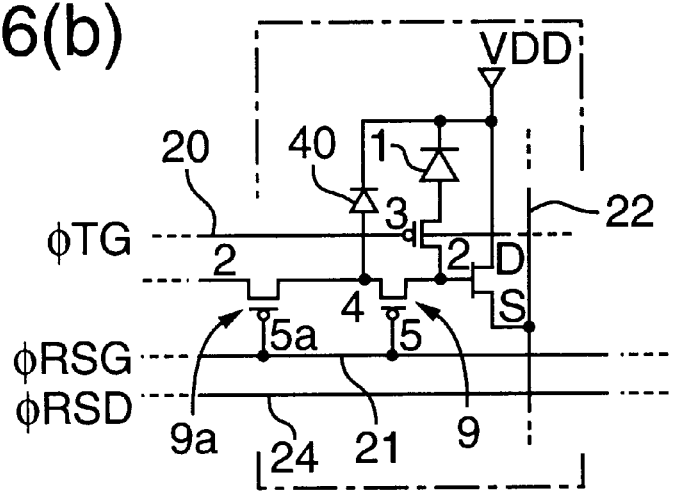
FIG. 26 comprises circuit diagrams of equivalent circuits of pixels useful in the context of the present invention.

FIG. 26(b), which is a circuit diagram of the equivalent circuits in a second example pixel useful with image sensor arrays of the present invention.

This second pixel is fundamentally the same as the first pixel shown in FIGS. 25(a)–25(c) and 26(a). It has the capability not only of obtaining image signals but also of monitoring the quantity of light during exposure. The only differences between this second pixel and the first pixel are that inter-pixel gate electrode 5a on the left side in FIGS. 25(a) and 25(b) is removed, so that it lacks the P-channel MOSFET 9a on the left side in FIGS. 25(a) and 25(b). (Note that left-right orientation of FIG. 25(a) and 25(b) is reversed from that of FIG. 26(b).)

Pixel 3

Figure 26C:
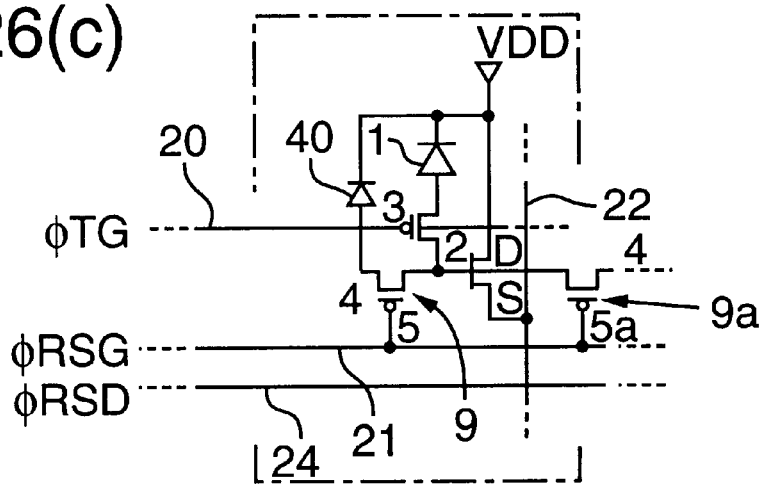

FIG. 26(c) is a circuit diagram of the equivalent circuits of a third example pixel useful in image sensors of the present invention.

This third pixel is fundamentally the same as the first pixel shown in FIGS. 25(a)–25(c) and 26(a). It has the capability not only of obtaining image signals but also of monitoring the quantity of light during exposure. The only differences between this third pixel and the first pixel is that the inter-pixel gate electrode 5a shown on the right side in FIGS. 25(a) and 25(b) is not present in the third pixel, and it thus lacks the P-channel MOSFET 9a on the right side in FIGS. 25(a) and 25(b). (Note that the left-right orientation of FIGS. 25(a) and 25(b) is reversed from that of FIG. 26(c).)

Pixel 4

Figures 27A, 27B, 27C:
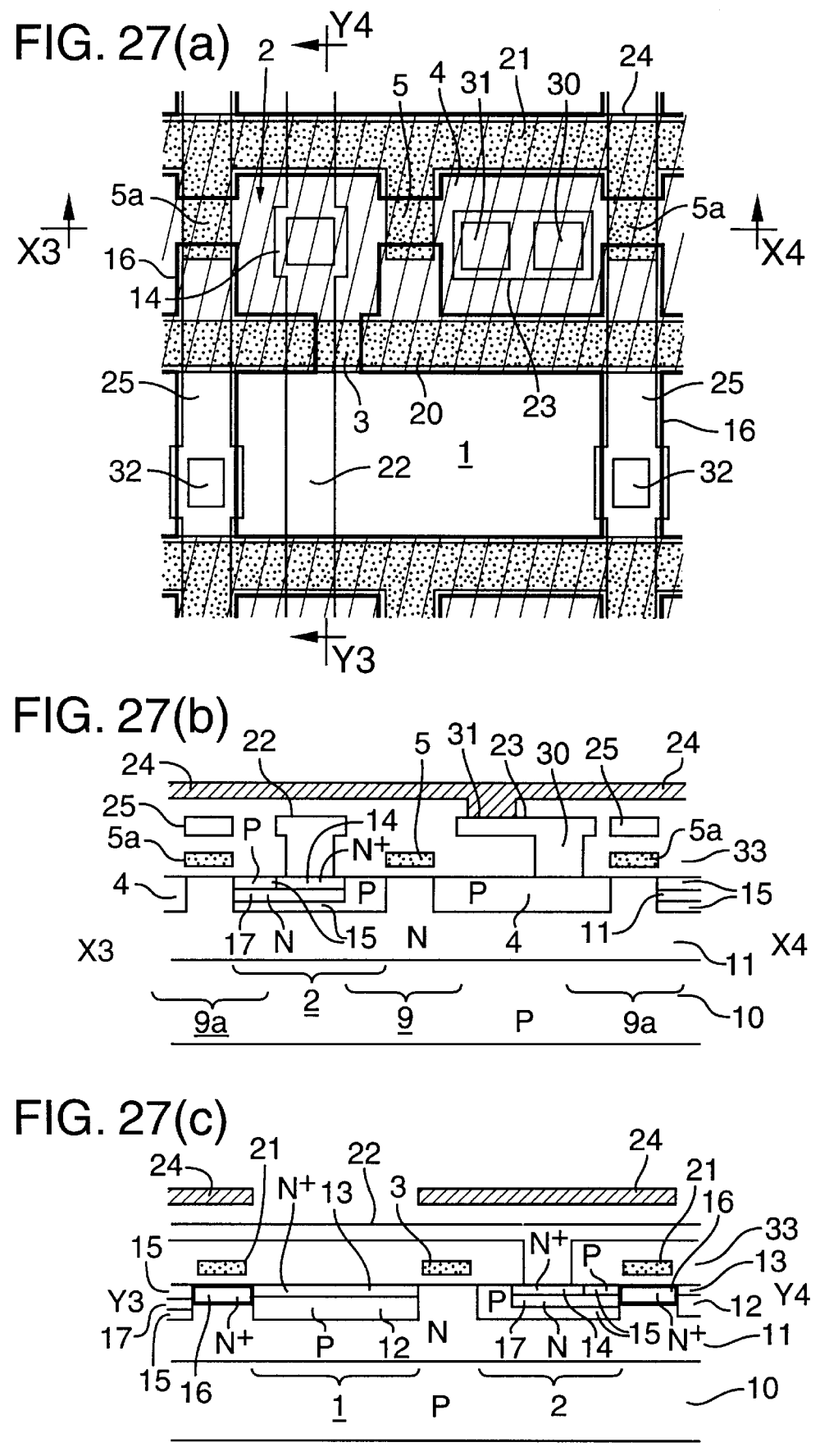
Figure 28A:
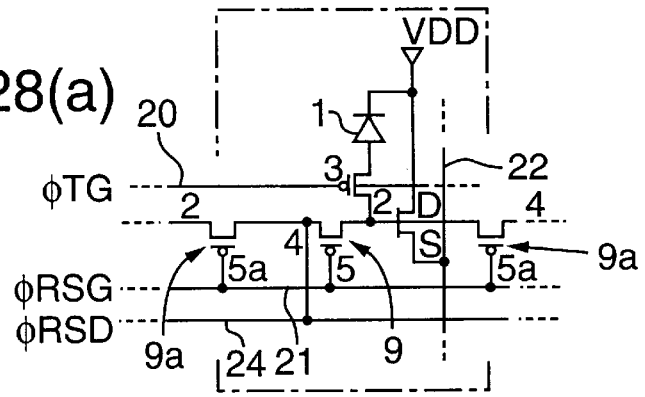
FIG. 28(a) corresponds to the pixel of FIG. 27, and FIGS. 28(b), 28(c), and 28(d) correspond to modifications thereof.

FIG. 27 illustrates a fourth example pixel useful in the context of the present invention. FIG. 27(a) is a plan view, FIG. 27(b) is a cross-sectional taken along the X3–X4 line in FIG. 27(a), and FIG. 27(c) is cross-sectional view taken along the Y3–Y4 line in FIG. 27(a). FIG. 28(a) is a circuit diagram which shows an equivalent circuit for this fourth pixel. In FIGS. 27(a)–27(c) and 28(a), the items identical or corresponding to items in FIGS. 25 and 26 are assigned the same reference characters, and the corresponding description will not be duplicated. Note that left-right orientation of FIGS. 27(a) and 27(b) is reversed from that of FIG. 28(a).

This fourth pixel lacks the capability of monitoring the quantity of light during exposure, but the element structure is fundamentally the same as the first pixel shown in FIGS. 25 and 26(a). The only differences between this fourth pixel and said first pixel are first, that there is no aperture 24a in the reset drain interconnection 24 in the area where reset drain 4 is located. Light is thus shielded from reset drain 4 by reset drain interconnection 24. Second, reset drain 4 is directly connected electrically to reset drain interconnect 24 by contact hole 30, relay 23, and relay contact 31.

Pixel 5

Figure 28B:
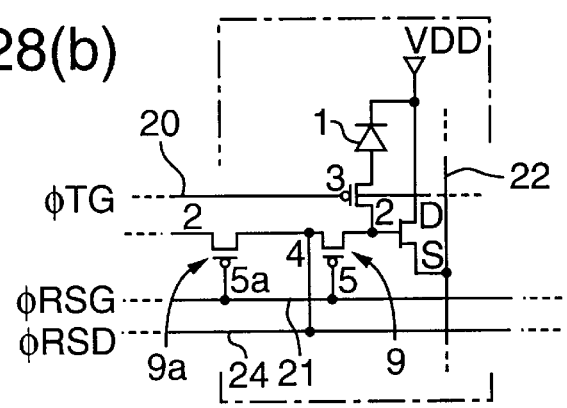
FIG. 28 comprises circuit diagrams of equivalent circuits of pixels useful in the context of the present invention.

FIG. 28(b) is a circuit diagram showing the equivalent circuit of a fifth example pixel useful in connection with the present invention.

This fifth pixel is fundamentally the same as the fourth pixel shown in FIGS. 27 and 28(a), and has no capability of monitoring the quantity of light during exposure. The only differences between this fifth pixel and said fourth pixel are that inter-pixel gate electrode 5a on the left hand side of FIGS. 27(a) and 27(b) is removed in this fifth pixel, such that there is no P-channel MOSFET 9a on the left of FIGS. 27(a) and 27(b). Note that the left-right orientation of FIGS. 27(a) and 27(b) is reversed from that of FIG. 28(b).

Pixel 6

Figure 28C:
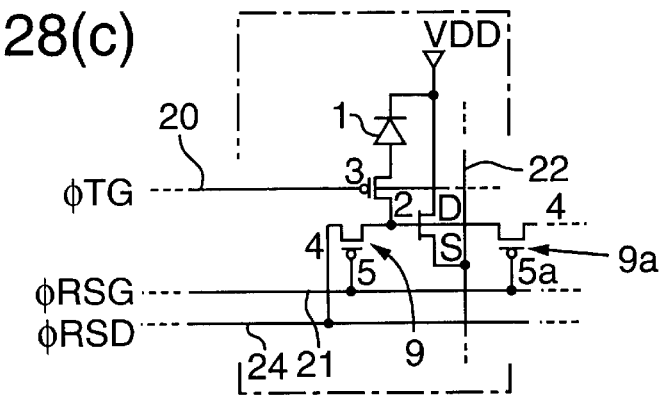

FIG. 28(c) is a circuit diagram of the equivalent circuit of a sixth example pixel useful in the context of the present invention.

This sixth pixel is fundamentally the same as the fourth pixel shown in FIGS. 27(a)–27(c) and 28(a), and has no capability of monitoring the quantity of light during exposure. The only differences between this sixth pixel and the fourth pixel are that inter-pixel gate electrode 5a on the right hand side of FIGS. 27(a) and 27(b) is not present in this sixth pixel, meaning that there is no P-channel MOSFET 9a on the right side of the pixel as in FIGS. 27(a) and 27(b). Note that left-right orientation of FIGS. 27(a) and 27(b) is reversed from that of FIG. 28(c).

Pixel 7

Figure 28D:
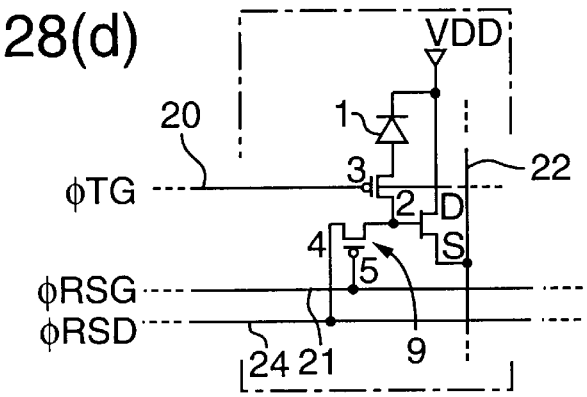

FIG. 28(d) is a circuit diagram showing an equivalent circuit of a seventh example pixel useful in the context of the present invention.

This seventh pixel is fundamentally the same as the fourth pixel shown in said FIGS. 27 and 28(a), and has no capability of monitoring the quantity of light during exposure. The only differences between this seventh pixel and said fourth pixel are that the inter-pixel gate electrodes 5a on both sides of FIGS. 27(a) and 27(b) are not present in the seventh pixel, and there is thus no P-channel MOSFET 9a on either side of the pixel. This seventh pixel is thus essentially identical to the pixel shown in FIG. 54. Note that left-right orientation of FIGS. 27(a) and 27(b) is reversed from that of FIG. 28(d).

Pixel 8

Figure 29A:
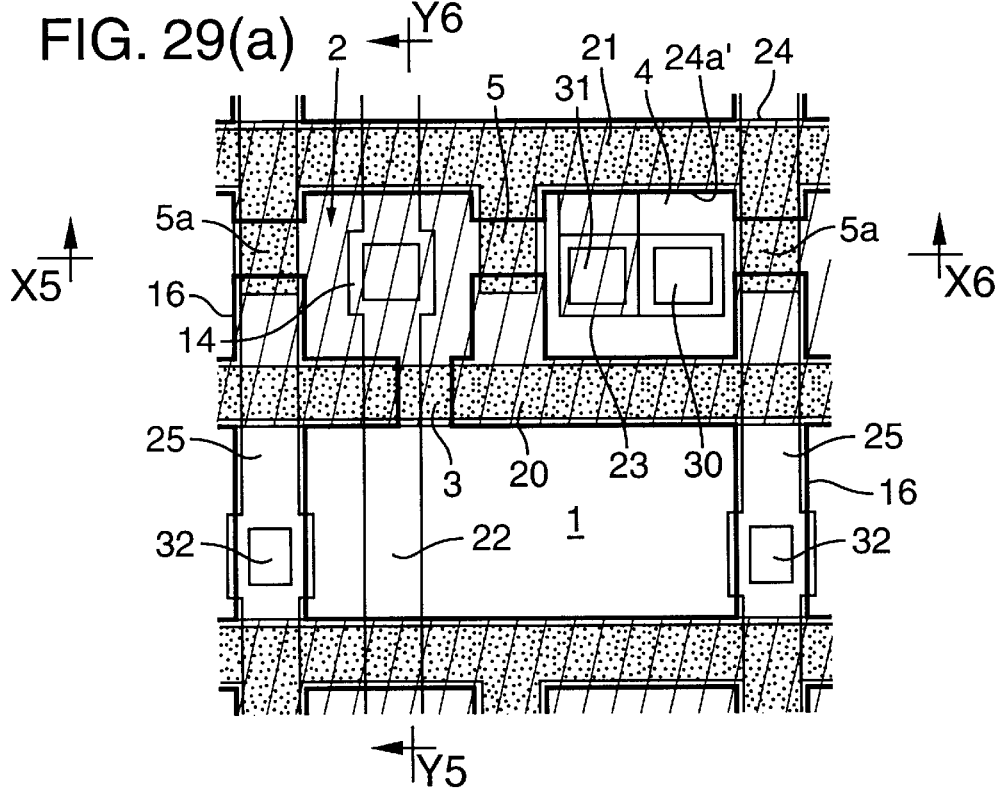
FIG. 29(a) is a plan view.
Figure 29B:
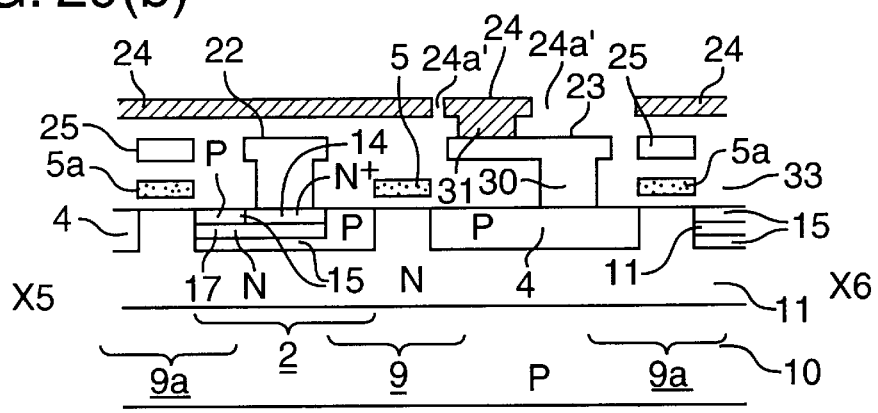
FIG. 29(b) is a cross-sectional view taken along the line X5–X6 in FIG. 29(a)
Figure 29C:
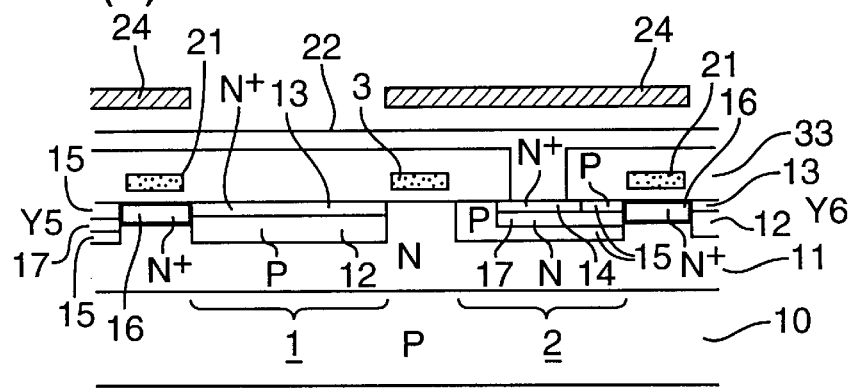
FIG. 29(c) is a cross-sectional view taken along the line Y5–Y6 in FIG. 29(a).
Figure 30A:
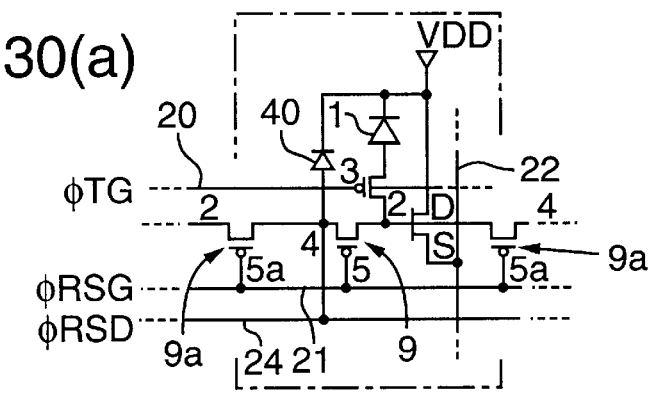
FIG. 30(a) corresponds to the pixel of FIG. 29, and FIGS. 30(b), 30(c), and 30(d) correspond to modifications thereof.

FIG. 29 shows an eighth example pixel useful with the present invention. FIG. 29(a) is a plan view, FIG. 29(b) is a cross-sectional view taken along the X5–X6 line in FIG. 29(a), and FIG. 29(c) is a cross-sectional view taken along the Y5–Y6 line in FIG. 29(a). FIG. 30(a) is a circuit diagram of an equivalent circuit of this eighth pixel. In FIG. 29 and FIG. 30(a), elements identical or corresponding to elements in FIG. 25 and FIG. 26 are assigned the same reference characters, description of which is not duplicated. Note that the left-right orientation of FIGS. 29(a) and 29(b) is opposite that of FIG. 30(a).

This eighth pixel has the capability of monitoring the quantity of light during exposure, and the fundamental structure is the same as the first pixel shown in FIGS. 25(a)–25(c) and 26(a). The differences between this eighth pixel and the first pixel are that relay 23, reset drain interconnect 24, via contact hole 30, and relay contact 31 are present over reset drain 4. Aperture 24a' is formed over the portion of reset drain 4 where reset drain interconnect 24 is located, and it is formed so that a portion of the reset drain 4 can receive incoming light. However, as shown in FIGS. 29(a) and 29(b), this aperture 24a' differs from aperture 24a on said first pixel in that reset drain interconnect 24 is partially left in place on sections of reset drain, 4 so that relay 23 and reset drain interconnect 24 are connected. In this eighth pixel, the aperture ratio of the photodiode 40, which comprises the exposed portion of reset drain 4, is smaller than that of the first pixel.

Unlike the first pixel, since a portion of the reset drain interconnect 24 and the relay 23 remain in this eighth pixel, reset drain 4 is directly connected electrically to reset drain interconnect 24.

Pixel 9

Figure 30B:
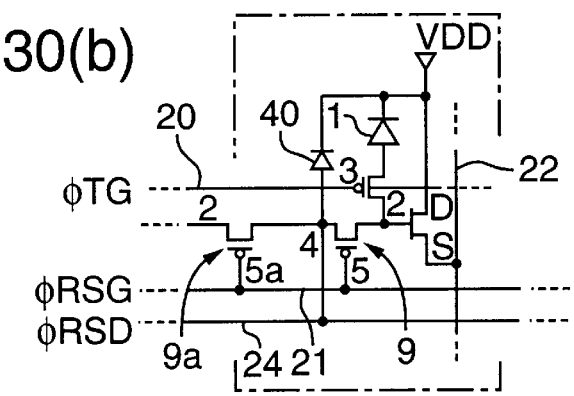
FIG. 30 comprises circuit diagrams of equivalent circuits of pixels useful in the context of the present invention.
FIG. 30(c) is a cross-sectional view taken along the line Y7–Y8 in FIG. 30(a).

FIG. 30(b) is a circuit diagram of the equivalent circuit of a ninth example pixel useful in the context of the present invention.

This ninth pixel is fundamentally the same as the eighth pixel shown in FIGS. 29(a)–29(c) and 30(a), and it has the capability of monitoring the quantity of light during exposure. The only differences between the ninth pixel and the eighth pixel are that the ninth pixel has no inter-pixel gate electrode 5a such as that shown on the left hand side of FIGS. 29(a) and 29(b), and there is consequently no P-channel MOSFET 9a in the ninth pixel, as found on the left of FIGS. 29(a) 29(b). Note that the left-right orientation of FIGS. 29(a) and 29(b) is reversed from that of FIG. 30(b).

Pixel 10

Figure 30C:
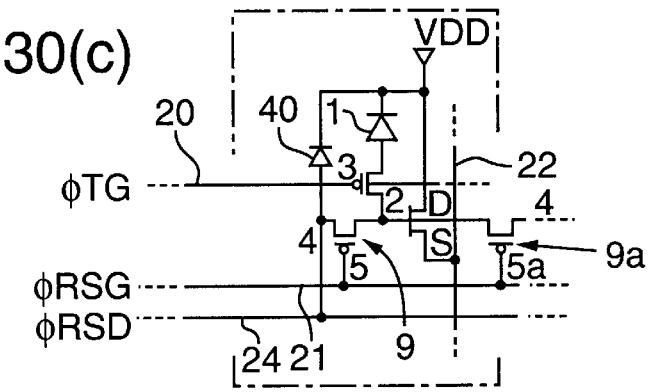

FIG. 30(c) is a circuit diagram of the equivalent circuit of a tenth example pixel useful in the context of the present invention.

This tenth pixel is fundamentally the same as the eighth pixel shown in FIGS. 29(a)–29(c) and FIG. 30(a), and it has the capability of monitoring the quantity of light during exposure. The only difference between this tenth pixel and the eighth pixel is that this tenth pixel has no inter-pixel gate electrode on the right side of the pixel, corresponding to the inter-pixel gate electrode 5a on the right side of FIGS. 29(a) and 29(b) in the eighth pixel, and there is thus no P-channel MOSFET 9a on the right of the tenth pixel as shown on the right of FIGS. 29(a) and 29(b) in the eighth pixel. Note that the left-right orientation of FIGS. 29(a) and 29(b) is reversed from that of FIG. 30(c).

Pixel 11

Figure 30D:
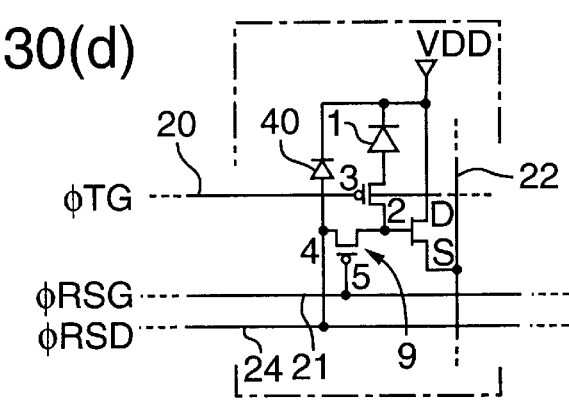

FIG. 30(d) is a circuit diagram of an equivalent circuit of an eleventh example pixel useful in the context of the present invention.

This eleventh pixel is fundamentally the same as the eighth pixel shown in FIGS. 29(a)–29(c) and 30(a), and it has the capability of monitoring the quantity of light during exposure. The only difference between this eleventh pixel and the eighth pixel are that there are no inter-pixel gate electrodes on either side of the eleventh pixel corresponding to inter-pixel gate electrodes 5a on the left and right sides of FIGS. 29(a) and 29(b), and thus there are no P-channel MOSFETs on either side of the eleventh pixel corresponding to P-channel MOSFETs 9a on either side of FIGS. 29(a) and 29(b). Note that the left-right orientation of FIGS. 29(a) and 29(b) is reversed from that of FIG. 30(d).

Pixel 12

Figure 31A:
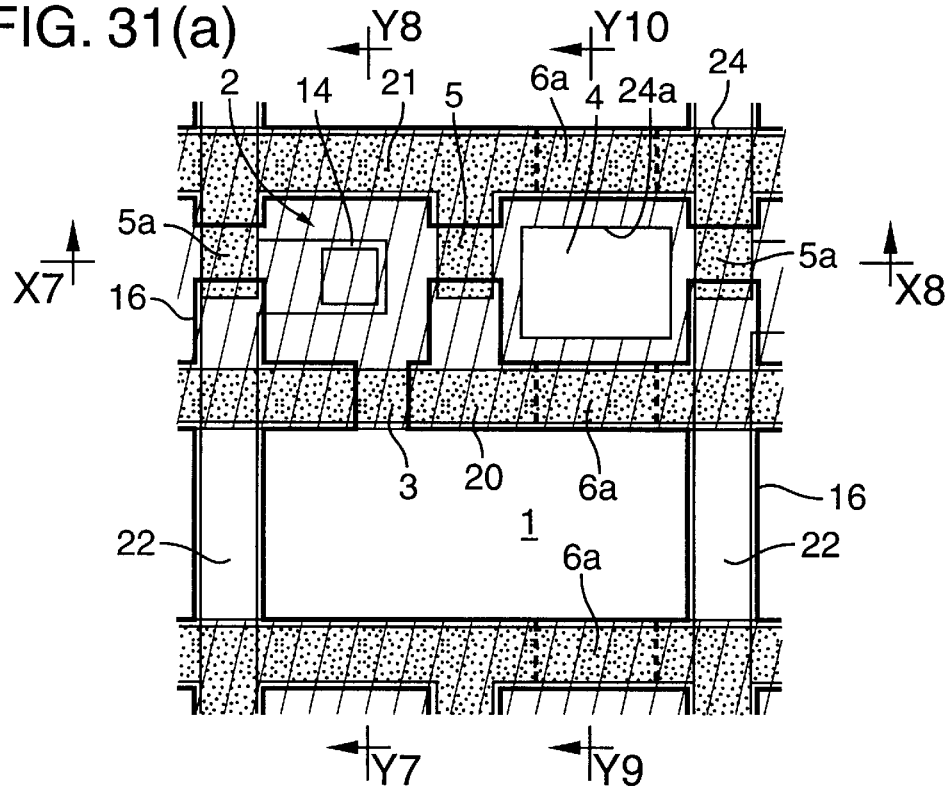
FIG. 31(a) is a plan view.
Figure 31B:
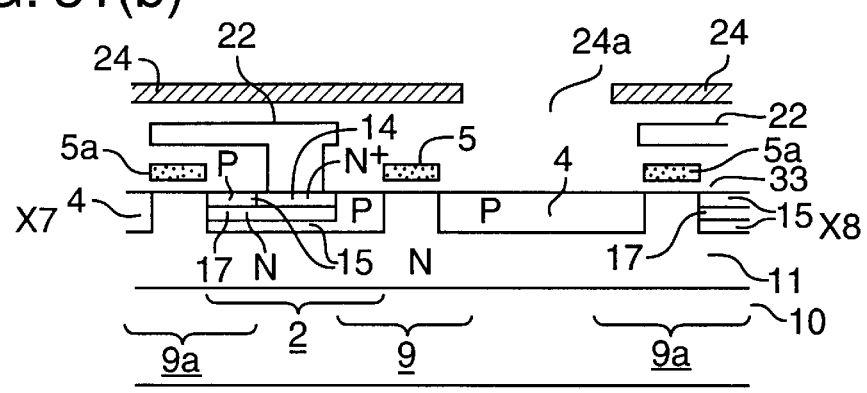
FIG. 31(b) is a cross-sectional view taken along the line X7–X8 in FIG. 30(a)
Figure 31C:
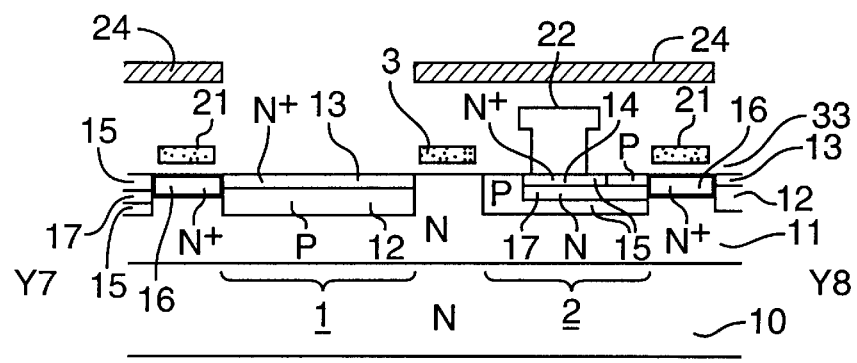
FIG. 31 shows yet another example embodiment of a single pixel of an image sensor array useful in the context of the present invention.
Figure 32:
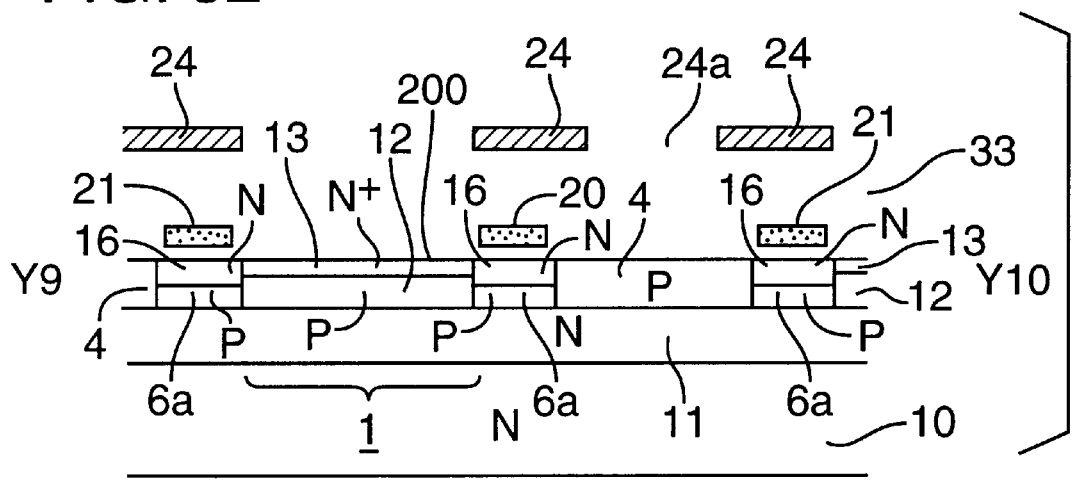
FIG. 32 is a cross-sectional view taken along the line Y9–Y10 in FIG. 30(a).

FIGS. 31 and 32 show the structure of a twelfth example pixel useful in the context of the present invention. FIG. 31(a) is a plan view, FIG. 31(b) is a cross-sectional view taken along the X7–X8 line in FIG. 31(a), and FIG. 31(c) is a cross-sectional view taken along the Y7–Y8 line in FIG. 31(a). FIG. 32 is a cross-sectional view taken along the Y9–Y10 line in FIG. 31(a). In FIGS. 31 and 32, elements identical or corresponding to elements in FIGS. 25 and 26 are assigned the same reference characters, and the corresponding descriptions will not be repeated.

The twelfth pixel has the same light monitoring capability as the first pixel shown in FIGS. 25 and 26(a), and it has the same fundamental structure as the first pixel.

The twelfth pixel differs from the first pixel in the following ways.

First, the substrate 10 of the first pixel is a P-type semiconductor substrate, whereas the substrate 10 of the twelfth pixel is an N-type semiconductor substrate.

Second, the twelfth pixel has no drain interconnect corresponding to drain interconnect 25 shown in FIG. 25. In the twelfth pixel, the vertical signal line (JFET source interconnect) 22 is positioned in the place occupied by drain interconnect 25 in the first pixel, increasing the aperture ratio of the twelfth pixel relative to that of the first pixel.

Third, the twelfth pixel is equipped with overflow control areas 6a to convey excess charges generated by the photodiodes 1 to the reset drains 4. Overflow control area 6a is composed of the P-type charge storage area 12 in the photodiode 1 and a P-type semiconductor area formed within the semiconductor layer 11 in the boundary area with reset drain 4. The overflow control areas 6a control overflow by conducting excess charges generated in the photodiodes 1 to the adjacent reset drains 4.

A high-density N-type semiconductor area 16 (similar to N-type drain area 16) is formed along the semiconductor surface above overflow control area 6a. In other words, P-type charge storage area 12 in photodiode 1, P-type overflow control area 6a, and reset drain 4 serve respectively as a source area, a channel area, and a drain area, while high-density N-type semiconductor area 16 and N-type semiconductor layer 11 serve as a gate area, effectively forming a P-channel JFET 200 (FIG. 32). This P-channel JFET 200 is in cutoff mode (disconnected) when the photodiode 1 is operating normally, but when strong light enters the photodiode 1 and charge in excess of a certain amount (in this case, a positive charge from the generation of holes) is stored in P-type charge storage area 12, P-channel JFET 200 turns on. In other words, P-channel JFET 200 is designed to turn on when the potential of P-type charge storage area 12 rises above a certain level. Therefore, excess charges generated by photodiodes 1 flow to reset drains 4 via overflow control areas 6a. The excess charges are then conducted away via reset drain interconnect 24.

The high-density N-type semiconductor area 16 formed along the semiconductor surface above overflow control area 6a (a continuation or extension of N-type drain area 16 of JFET 2 [see FIG. 31(c)]) is formed continuously along high-density N-type semiconductor area 13 of photodiode 1, which is formed along the surface of photodiode 1. Consequently, the vicinity of the semiconductor surface for the P-type charge storage area 12 of photodiode 1, including the surrounding areas, is covered by high-density N-type semiconductor areas (13 and 16), making photodiode 1 a buried photodiode. There is no structurally formed high-density N-type semiconductor area (13 or 16) at the transfer gate 3 of photodiode 1, but the photodiode is able to maintain its performance as a buried photodiode. This is because during the time when photodiode 1 is executing the signal charge storage operation by photoelectric conversion, the high-density N-type semiconductor area applies a high-level pulse voltage when transfer gate 3 is off, resulting in induction of electrons into the semiconductor surface in the area of transfer gate 3. Thus, photodiode 1 is a buried photodiode equipped with a JFET-type lateral overflow drain structure.

As is the case with a buried photodiode with a vertical overflow structure, the overflow structure makes it possible to suppress blooming, smearing and other types of charge overflow phenomena. Also, because it is a buried photodiode, evacuated layers that occur in the P/N junction not reach the semiconductor surface, which suppresses dark current. In addition, after the charges have been transferred, no charges remain in the photodiodes (due to complete charge transfer or complete evacuation), as a result, the apparatus yields ideal characteristics in terms of minimizing after-images and reset noise.

The equivalent circuits for this twelfth pixel are the same as the equivalent circuits for said first pixel, and are as shown in FIG. 26(*a*).

Pixel 13

Figure 34:
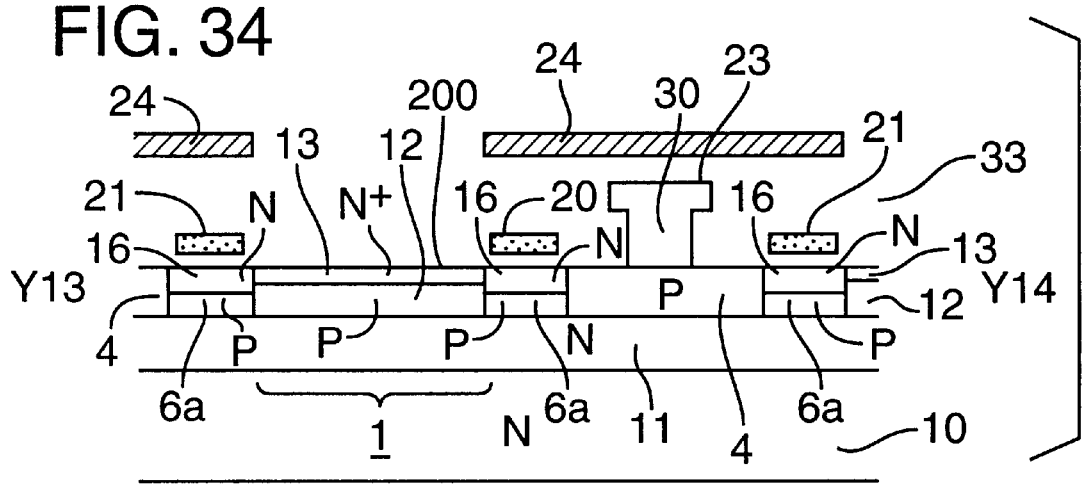
FIG. 34 is a cross-sectional view taken along the line Y13–Y14 in FIG. 33(a).
Figure 33A:
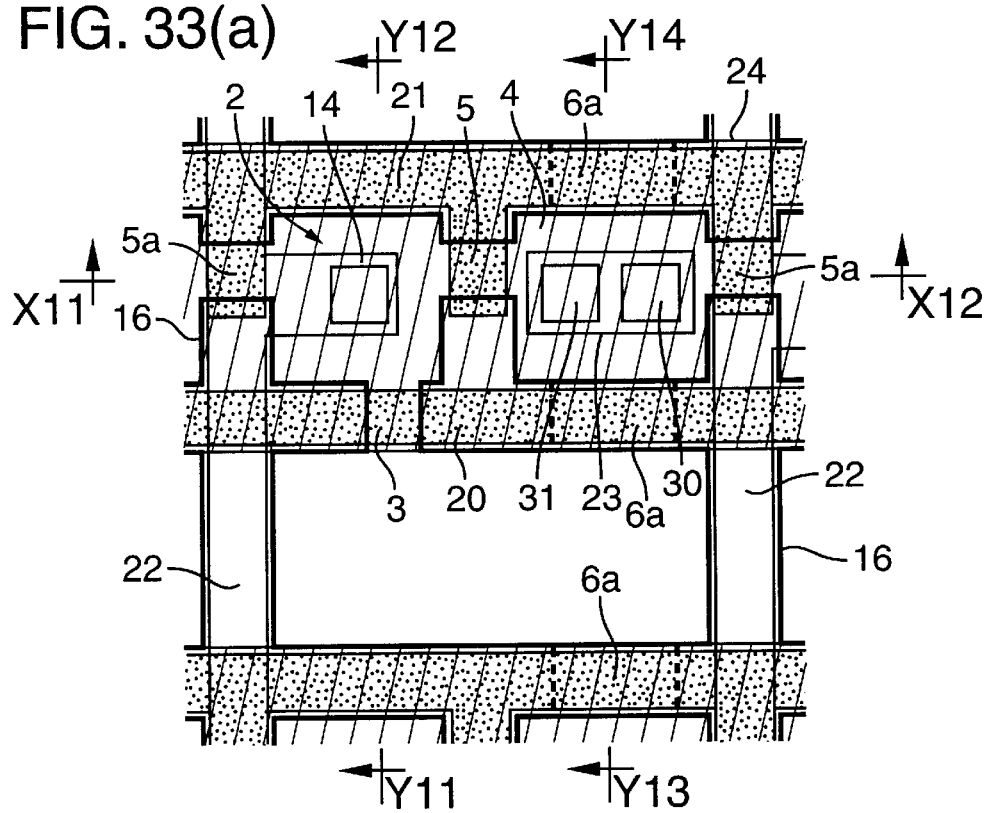
FIG. 33(a) is a plan view.
Figure 33B:
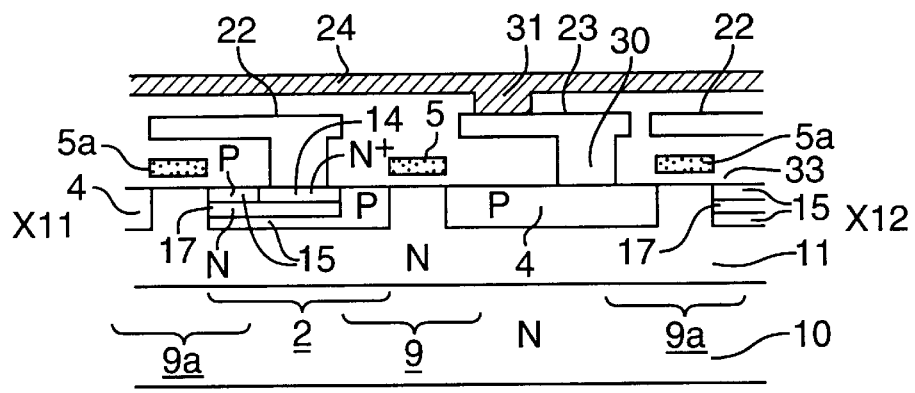
FIG. 33(b) is a cross-sectional view taken along the line X11–X12 in FIG. 33(a)
Figure 33C:
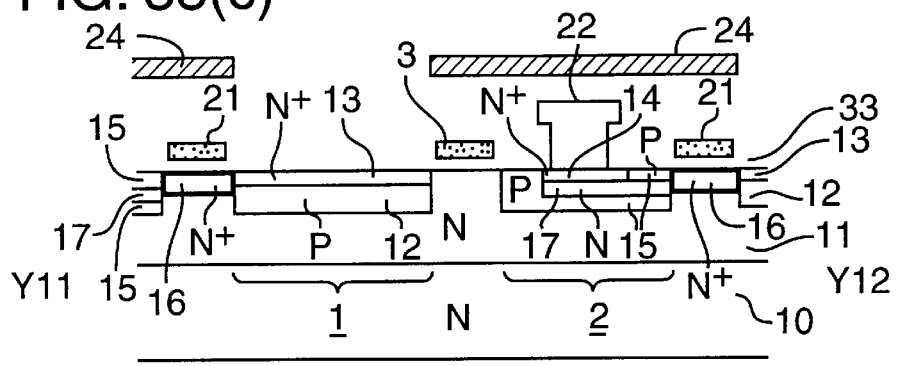
FIG. 33(c) is a cross-sectional view taken along the line Y11–Y12 in FIG. 30(a).

FIGS. 33 and 34 show a thirteenth example pixel useful in the context of the present invention. FIG. 33(*a*) is a plan view, FIG. 33(*b*) is a cross-sectional view taken along the X11–X12 line in FIG. 33(*a*), and FIG. 33(*c*) is a cross-sectional view taken along the Y11–Y12 line in FIG. 33(*a*). FIG. 34 is a cross-sectional view taken along the Y13–Y14 line in FIG. 33(*a*). In FIGS. 33 and 34, elements identical or corresponding to elements in FIGS. 25, 26, 31, and 32 are assigned the same reference characters, and the description thereof will not be repeated.

This thirteenth pixel lacks light quantity monitoring capabilities, as does the fourth pixel shown in FIGS. 27 and 28. The fundamental element structure is the same as the fourth pixel of FIGS. 27 and 28(*a*).

The thirteenth pixel differs from said fourth pixel in same ways as those in which the twelfth pixel differs from the first pixel. That is, whereas the fourth pixel utilizes a P-type semiconductor substrate as substrate 10, an N-type semiconductor substrate is used as substrate 10 in this thirteenth pixel. Also, this thirteenth pixel omits the drain interconnect 25 shown in FIG. 27, and vertical signal line (JFET 2 source interconnect) 22 is put in place of drain interconnect 25. Furthermore, the thirteenth pixel is equipped with overflow control areas 6*a* to conduct excess charges generated by photodiodes 1 to reset drains 4.

The equivalent circuit for this thirteenth pixel is the same as the equivalent circuit for the fourth pixel as shown in FIG. 28(*a*).

Pixel 14

Figure 36:
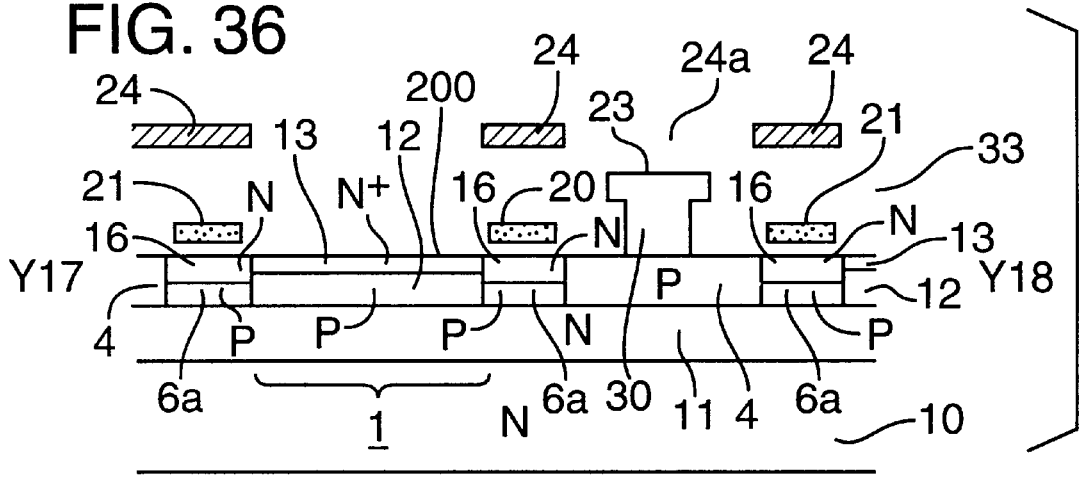
FIG. 36 is a cross-sectional view taken along the line Y17–Y18 in FIG. 35(a).
Figure 35A:
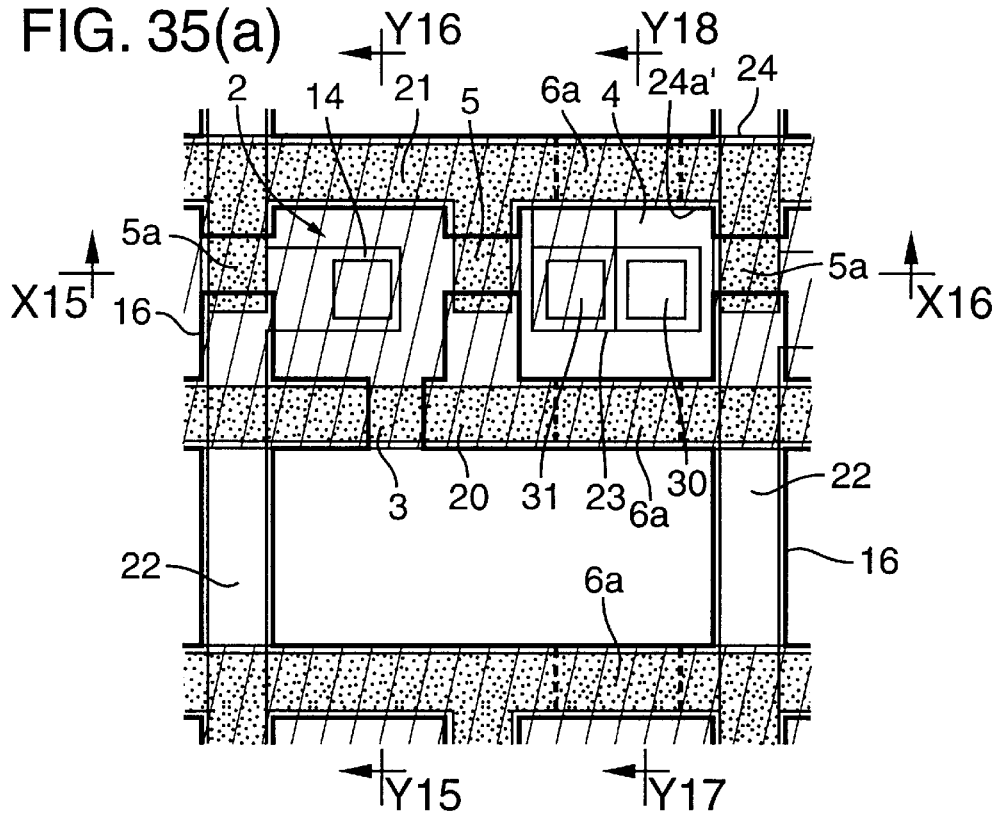
FIG. 35(a) is a plan view.
Figure 35B:
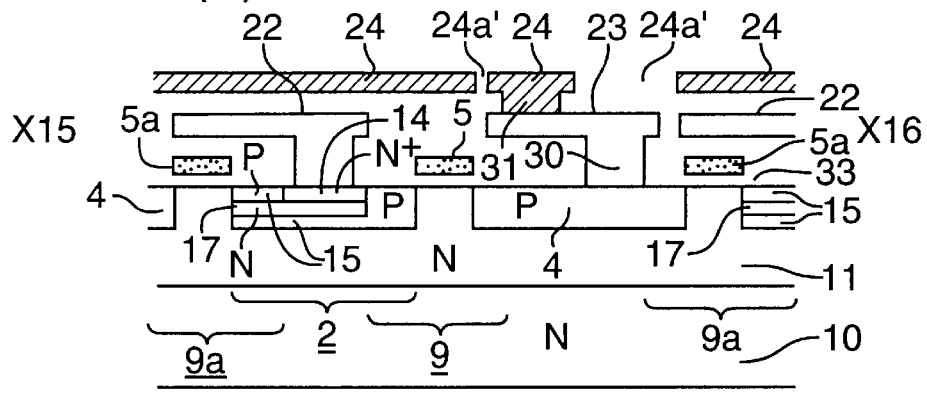
FIG. 35(b) is a cross-sectional view taken along the line X15–X16 in FIG. 33(a)
Figure 35C:
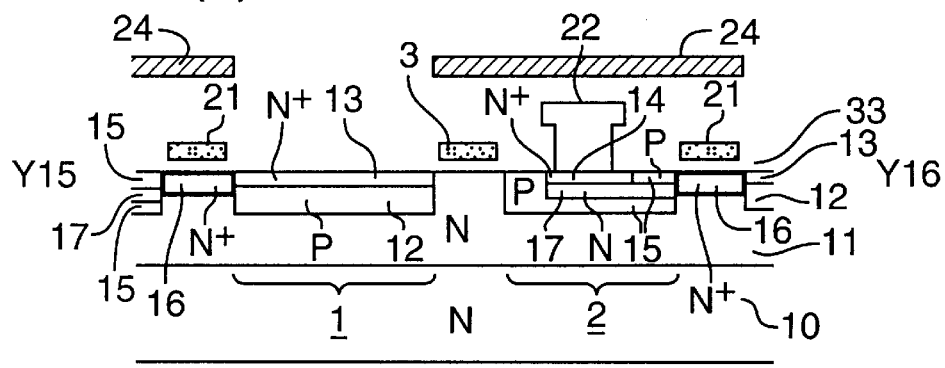
FIG. 35 is shows still another example embodiment of a single pixel of an image sensor array useful in the context of the present invention.

FIGS. 35 and 36 show a fourteenth example pixel useful in the context of the present invention. FIG. 35(*a*) is a plan view, FIG. 35(*b*) is a cross-sectional view taken along the X15–X16 line in FIG. 35(*a*), and FIG. 35(*c*) is a cross-sectional view taken along the Y15–Y16 line in FIG. 35(*a*). FIG. 36 is a cross-sectional view taken along the Y17–Y18 line in FIG. 35(*a*). In FIGS. 35 and 36, elements identical or corresponding to elements in FIGS. 25, 26, 31, and 32 are assigned the same reference characters, and the description thereof will not be repeated.

This fourteenth pixel has the same light quantity monitoring capabilities as the eighth pixel shown in FIGS. 29 and 30, and its fundamental element structure is the same as that of the eighth pixel of FIG. 30(*a*). The fourteenth pixel differs from the eighth pixel in the same ways in which the twelfth pixel differs from the first pixel. That is, the eighth pixel utilizes a P-type semiconductor substrate as substrate 10, whereas the fourteenth pixel uses an N-type semiconductor substrate as substrate 10. Also, the fourteenth pixel eliminates the drain interconnect 25 shown in FIG. 29, and vertical signal line (JFET 2 source interconnect) 22 is put in place of drain interconnect 25. Furthermore, the fourteenth pixel is equipped with overflow control areas 6*a* to convey excess charges generated by photodiodes 1 to reset drains 4.

The equivalent circuit of this fourteenth pixel is the same as the equivalent circuit for the eighth pixel shown in FIG. 30(*a*).

Other Pixels

Just as the first pixel is modified to obtain the second and third pixels, the fourth to obtain the fifth through seventh, and the eighth to obtain the ninth through eleventh, as described above, so too is it possible to obtain a variety of pixels by similarly modifying the twelfth, thirteenth, and fourteenth pixels.

Image Sensor Array Example Embodiment 1

Figure 37:
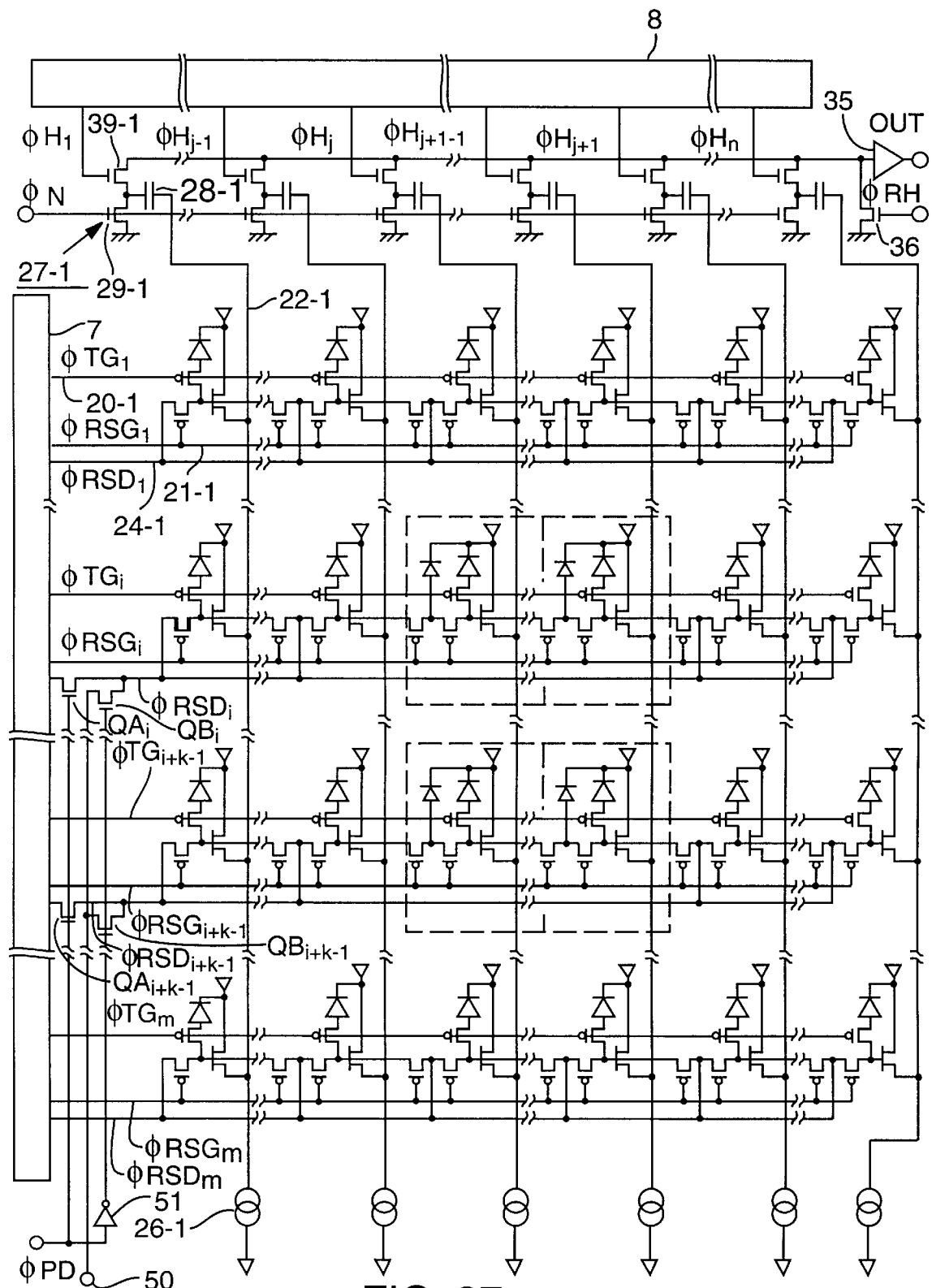
FIG. 37 is a circuit diagram of an equivalent circuit of an example embodiment of an image sensor array of the present invention.

FIG. 37 is a circuit diagram of an example embodiment of a fixed-image image sensor array for an image capture apparatus.

In this embodiment, the array comprises a two-dimensional matrix (m×n) of the first pixel as described above and shown in FIGS. 25 and 26(*a*), and of the fourth pixel as described above and shown in FIGS. 27 and 28(*a*). At or near the center of the matrix is a two-dimensional matrix (k×1) of first pixels, surrounded by fourth pixels. In FIG. 37, the first pixels are shown enclosed in the dashed line.

In each matrix row of this embodiment, reset drain 4 and gate area 15 of JFET 2 alternate in the row direction (the horizontal scan direction). Between each pixel is the gate electrode 5*a* forming the gate of the P-channel MOSFET 9*a*. All of the reset gates 5 in the pixels of a row and the inter-pixel gate electrodes 5*a* of that row are connected in common by reset gate interconnect 21. The P-channel MOSFETs 9 and 9*a*, which serve as switching elements for the row, thus turn on and off simultaneously in that row.

As a result, as is evident from FIG. 37, when all the MOSFETs 9 and 9*a* for a given row are on, all the gate areas 15 of the JFETs 2 and all the reset drains 4 of the pixels of that row are electrically connected to the reset drain interconnect 24 for that row, and all the gate areas 15 of the JFETs 2 and all the reset drains 4 for that row are electrically connected by the inter-pixel P-channel MOSFETs 9*a*. Thus, the gate areas 15 of JFETs 2 of the first pixels, in which reset drain 4 is not directly connected to reset drain interconnect 24, are electrically connected to reset drain interconnect 24 for that row via the P-channel MOSFETs 9*a* and reset drains 4 of the fourth pixels in that row.

Conversely, when all MOSFETs 9 and 9*a* for a particular row are off, the gate areas 15 of the JFETs 2 for all pixels of that row are electrically disconnected from the reset drain interconnect 24 of that row.

A vertical scan circuit applies a drive signal RSD to the gate areas 15 of JFETs 2 on all the pixels in a particular row in order to move the charge from the gate areas 15 to the reset drain interconnect 24 for that row. The potential of the gate areas 15 may thus be controlled for each row as a row by the vertical scan circuit. The fixed-image image sensor array of FIG. 37 thus is operated in same way as the prior-art array described above and shown in FIGS. 54 and 55.

In rows that include first pixels (which have the capability of monitoring light quantity), when all P-channel MOSFETs 9 and 9a for that row are on, all the gate areas 15 of JFETs 2 and all the reset drains 4 for that row are electrically connected by the inter-pixel P-channel MOSFETs 9a. The reset drains 4 on the first pixels in that row are thus electrically connected to the reset drain interconnect 24 for that row via the P-channel MOSFETs 9a and the reset drains 4 on said fourth pixels for that row. It is therefore possible to output, from the reset drain interconnect 24 for a particular row, photoelectric current based on the signal charge (in this embodiment, the hole) generated in proportion to the incident light entering the apertures 24a in the first pixels.

As may be understood from the foregoing, in the rows that include first pixels, reset drains 4, which constitute the photodiodes 40 on the first pixels, are not directly connected electrically to the reset drain interconnect 24 for that row. Instead, the on/off condition of all the P-channel MOSFETs 9 and 9a for that row determine whether the reset drains 4 on these first pixels are electrically connected or cut off from the reset drain interconnect 24 for that row.

This embodiment of a fixed-image image sensor array includes peripheral circuitry comprising sort-processing circuit 27, vertical scan circuit 7, and horizontal scan circuit 8. This peripheral circuitry is the same as that of the prior-art fixed-image image sensor array, described above and shown in FIGS. 54 and 55, except that in this embodiment, in rows that include first pixels, the reset drain interconnect 24 for is connected to an output terminal 50 via a switch QB, and to the vertical scan circuit 7 via a switch QA. A drive pulse ϕPD is applied to the gate electrodes of each switch QA, and pulse resulting from the inversion, by inverter 51, of the drive pulse ϕPD pulse is applied to the gate electrodes of each switch QB. The switches QA and QB thus constitute a switching element that switches between a condition in which the charges in the gate areas 15 in each pixel in a particular row are discharged onto reset drain interconnect 24 and supplied with a drive signal ϕRSD to control the potential of the gate areas 15, and a condition in which the signal that emerges in the interconnect 24 is output via output terminal 50. Consequently, this embodiment is capable of outputting at output terminal 50 the photoelectric current Ip generated by the reset drains 4 of the first pixels.

Image Capture Apparatus Example Embodiment 1

Figure 38:
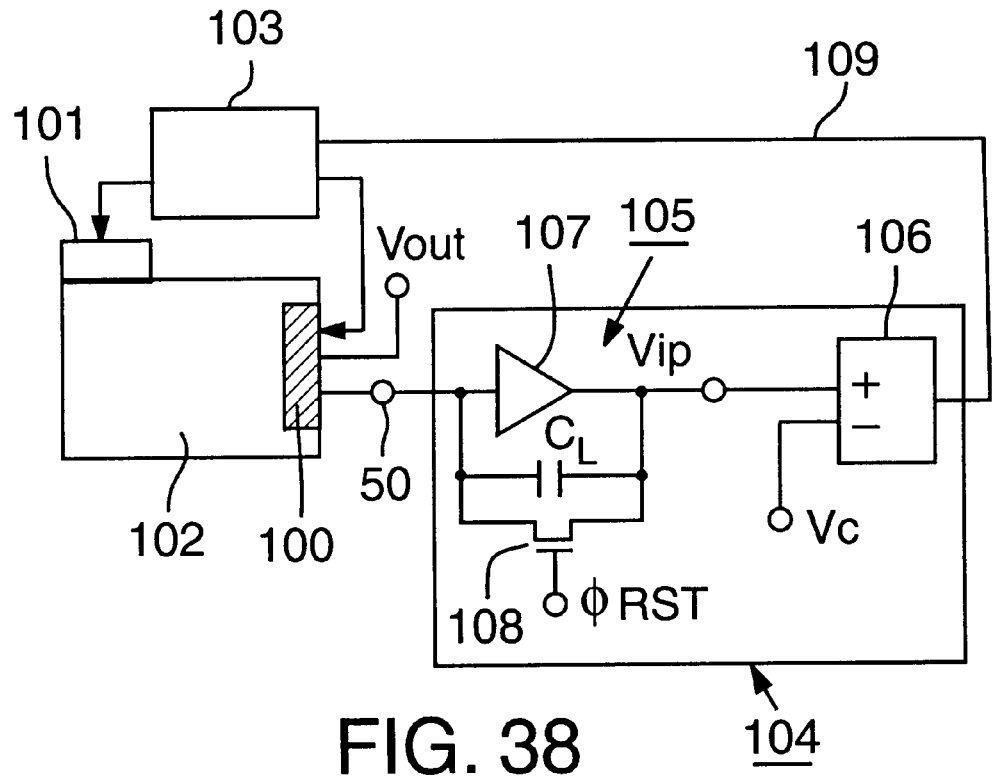
FIG. 38 is a schematic diagram of elements of an example embodiment of a fixed-image image capture apparatus of the present invention utilizing the image sensor array of FIG. 37 as image sensor array 100.

FIG. 38 is a general block diagram showing an example of a fixed-image image capture device utilizing this embodiment of a fixed-image image sensor array. A fixed-image image sensor array 100 is placed inside a black box 102 equipped with a light shielding shutter 101. Controller 103 controls fixed-image image sensor array 100 and shutter 101. The output terminal 50, which outputs photoelectric current Ip to serve as the light quantity monitoring signal from the fixed-image image sensor array 100 is electrically connected to a photoelectric current processor circuit 104. The photoelectric current processor circuit 104 includes a photoelectric current integrator circuit 105 and a comparator 106. Photoelectric current integrator circuit 105 is comprises an operational amplifier 107, a capacitor CL and a reset switch 108, connected as shown in the figure. The reset switch 108 discharges the charge in capacitor CL in response to reset signal ϕRST received at the gate electrode, thus resetting photoelectric current integrator circuit 105. The photoelectric current integrator circuit 105 integrates the photoelectric current Ip from the output terminal 50 and converts it into a voltage Vip. The comparator 19 compares this Vip with the reference voltage Vc, and when the voltage Vip is smaller than the reference voltage Vc, it outputs a control signal 109 to controller 103, which then closes shutter 101.

Figure 39:
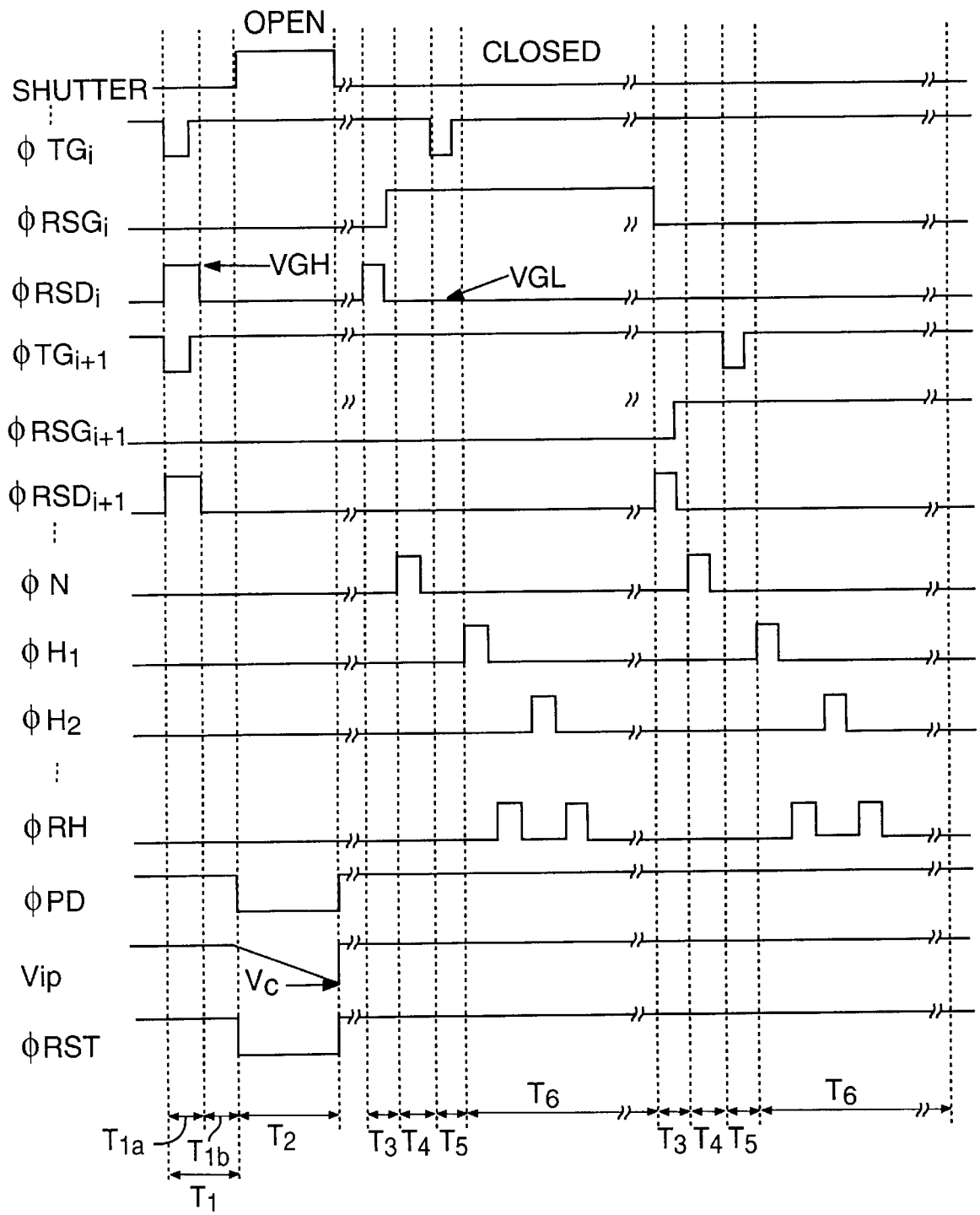
FIG. 39 is a timing chart illustrating the operation of the fixed-image capture apparatus of FIG. 38.

FIG. 39 is a timing chart for the fixed-image image sensor array 100 and the shutter 101 useful for capturing still (fixed) images using the fixed-image image capture apparatus shown in FIG. 38.

For the first half T1a of interval T1, the transfer gates 3 are turned on for all pixels, the charge on photodiodes 1 for all pixels is transferred to the gate areas 15 of the JFETs 2, and the photodiode 1 is thus reset. Still during T1a, the transfer gates 3 are then turned off by the return to the low level of the respective driving pulses ϕTG. During this time T1a, the respective driving pulses ϕRSD are set to the voltage VGH. Since the driving pulses ϕRSG are low, the P-channel MOSFETs 9 and 9a are all on, and the gate areas 15 of the JFETs 2 are all set to the voltage VGH.

Next, during the second half T1b of interval T1, the drive pulses ϕRSD go to high level, and since at this time the P-channel MOSFETs 9 and 9a all are still on, the gate areas 15 of the JFETs 2 of all pixels are set to the voltage VGL (a potential level that turns off JFETs 2). Pixel initialization is thus complete, and exposure can begin.

During interval T2, shutter 101 opens and the apparatus goes into exposure mode. At this time, the P-channel MOSFETs 9 and 9a for rows that include the first pixels (which possesses light quantity monitoring capabilities) all go on, while pulse ϕPD is low level. Accordingly, switch QB turns on while switch QA is off, such that reset drain interconnect 24 is connected to output terminal 50. As a result, photoelectric current Ip generated by the first pixels, located in the center of the image capture surface in the fixed-image image sensor array 100, flows to photoelectric current processing circuit 104, and the output voltage Vip from the photoelectric current integrator circuit 108 changes as shown in FIG. 39. The voltage Vip is proportional to the intensity of light incoming to fixed-image image sensor array 100, so by monitoring voltage Vip it is possible to determine the desired exposure in real time during exposure. In other words, in FIG. 39, at the point in time when output voltage Vip from photoelectric current integrator circuit 108 exceeds reference voltage Vc, the control signal 109 is sent from the photoelectric current processor circuit 104 to the controller 16, which closes the shutter 101. Thereafter, each row of the fixed-image image sensor array is read-out in sequence.

During interval T3, switch QB is off while switch QA is on, which connects reset drain interconnect 24 to vertical scan circuit 7. At this time, (taking the first interval T3 as an example) the P-channel MOSFETs 9 and 9a of the first (1st) row to be read-out are all on, and the driving pulse RSD for the first row is high (at VGH). This sets the gate areas 15 of the JFETs 2 of the first row to voltage VGH. Thereafter the P-channel MOSFETs 9 and 9a of the first row go off and go into floating mode.

During interval T4, signals are read out in source-follower mode from the source areas 14 of the JFETs 2 of the first row, and are stored in the capacitors 28 in the sort-processing circuit 27 as reference signals Vref (reference or "dark" output). In addition, driving pulse φN goes low, turning switch 29 off and putting the output sides (sides 29-1 to 29-n) of capacitors 28 into floating mode.

During interval T5, driving pulse φTGi goes low and the optical signal charges stored in photodiodes 1 are thus transferred to the gate areas 15 of the JFETs 2 in the first row via the transfer gates 3. Since the output side of capacitor 28 is in floating mode at this time, it produces a differential signal Vs-Vref, representing the differential between the optical signal Vs (actual or "combined" output) read-out from JFET2 source areas 14 and reference signal Vref (reference or "dark" output).

During interval T6, the horizontal scan circuit 8 sequentially turns on the horizontal-select switches 39-1 through 39-n, and the differential signals Vs-Vref for each pixel on the first row are read out from capacitors 28-1 to 28-n as image signals, and are output from output terminal OUT via output amplifier 35.

The intervals T3 through T6 are repeated in sequence for all rows through the last row, row m.

In this manner, fixed-image Image-sensor array 100 in this embodiment is able to monitor in real time the quantity of light directly entering the fixed-image image sensor array during an exposure. As a result, the fixed-image image capture apparatus utilizing this fixed-image image sensor array 100 as shown in FIG. 38 is always able to capture images with the optimal exposure time, even when the quantity of incoming light changes during an exposure.

Image Capture Apparatus Example Embodiment 2

Figure 40:
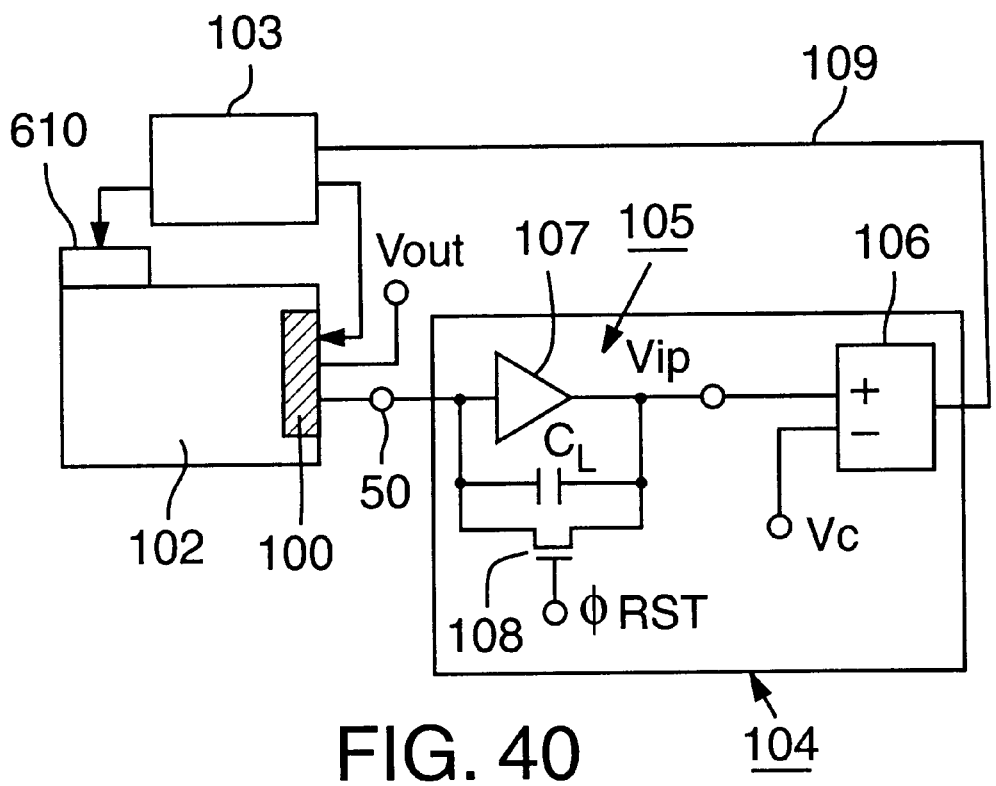
FIG. 40 is a schematic diagram of elements of another example embodiment of a fixed-image image capture apparatus of the present invention.

Another example usage of the fixed-image image sensor array 100 is shown in FIG. 40.

FIG. 40 is a schematic diagram showing another example of a fixed-image image capture apparatus utilizing the fixed-image image sensor array 100. In FIG. 40, elements identical or corresponding to elements in FIG. 38 are assigned the same reference characters, and the description thereof will not be repeated.

The image capture apparatus of FIG. 40 has a different exposure control system than the image capture apparatus of FIG. 38. In the image capture apparatus shown in FIG. 38, at the point in time when the optimal exposure quantity has been obtained, shutter 103 is closed, and the exposure time is terminated. In the image capture apparatus of FIG. 40, a supplemental light emitting apparatus (e.g., a strobe) 610 is used to illuminate the subject. At the point in time when the total exposure light that has entered fixed image capture apparatus 100 is optimal, light emission from strobe 610 is halted. This is the exposure control used in this example. The image capture apparatus shown in FIG. 40 differs in configuration from the image capture apparatus shown in FIG. 38 only in that it is equipped with a strobe 610 instead of a shutter 103.

Figure 41:
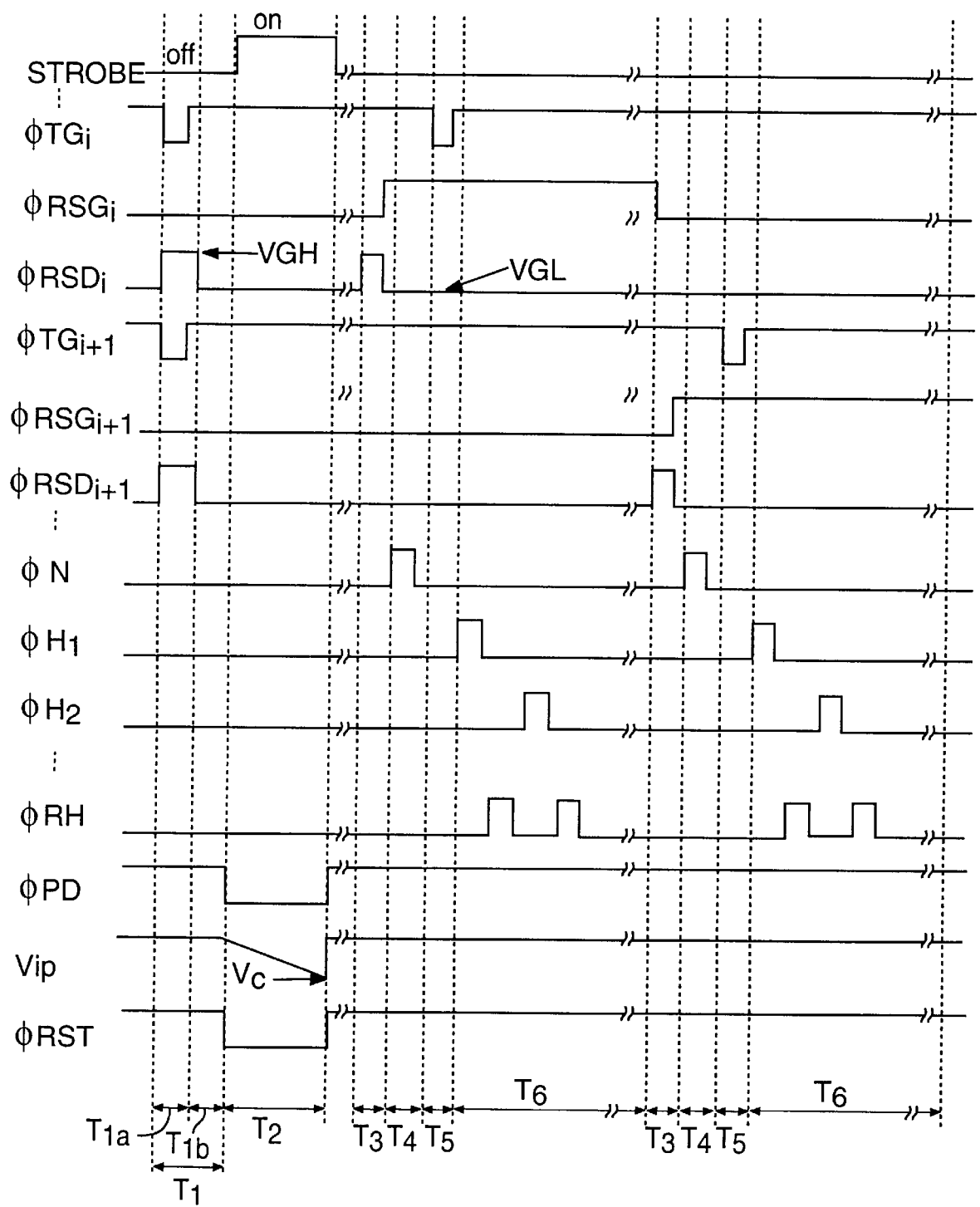
FIG. 41 is a timing chart illustrating the operation of the fixed-image capture apparatus of FIG. 40.

FIG. 41 is timing chart for fixed-image image sensor array 100 and strobe 610 when the image capture apparatus shown in FIG. 40 is used to capture still images. The timing chart shown in FIG. 41 substitutes strobe on/off for the shutter on/off in the timing chart in FIG. 40. All other operations are the same, and the explanation thereof is thus not repeated.

When using a strobe, the light reflected off the subject, and, therefore, the quantity of light entering fixed image capture apparatus 100, varies. Accordingly, the advantages are great from the ability of this embodiment to monitor the quantity of entering light in real time during exposure, and thereby to always capture images with the optimal exposure irrespective of the subject.

MODIFICATIONS TO THE IMAGE SENSOR ARRAY

As discussed previously, the example embodiment fixed-image image sensor array shown in FIG. 37 consists of a two-dimensional matrix (m×n) of the first pixels shown in FIGS. 25 and 26(a), and the fourth pixels shown in FIGS. 27 and 28(a).

The present invention is not limited to this kind of structure. It may also be composed of an appropriate combination of the above-discussed first through fourteenth pixels, including the above-discussed modifications of the twelfth through fourteenth pixels. At least one type of pixel with light-quantity monitoring capability should be used as at least one pixel among all the pixels. When all the MOSFETs 9 and MOSFETs 9a (if any) are on for a particular row in the two-dimensional matrix, the gate areas 15 of the JFETs 2 and the reset drains 4 of all the pixels on that row are electrically connected to the reset drain interconnect 24 of that row. When all the MOSFETs 9 and MOSFETs 9a (if any) for that row are off, the gate areas 15 of the JFETs 2 for all the pixels of that row are electrically disconnected from the reset drain interconnect 24 of that row. When all the P-channel MOSFETs 9 and 9a are on for a row that includes pixels with light quantity monitoring capabilities, the reset drains 4 of the pixels with light quantity monitoring capabilities should be electrically connected to the reset drain interconnect 24 for that row.

For example, in the example embodiment as shown in FIG. 37, (1) any of said eighth through eleventh pixels may be put in place of said first pixel, (2) any of said fifth through seventh pixels may be substituted for said fourth pixels in rows that do not include said first pixels, or in rows that do include said first pixels, but not adjacent to said first pixels, and (3) any of said eighth through eleventh pixels may be substituted for pixels that are adjacent to said fourth pixels.

In addition, it is possible in the two-dimensional matrix arrangement to have at least one out of all the pixels (and possibly all, of course) be any of said eighth through eleventh pixels, and to have the rest be any of said fourth through seventh pixels. When any of the eighth through eleventh pixels, which possess light monitoring capabilities, is used, the reset drains 4 that constitute the photodiodes 40 are directly electrically connected to the reset drain interconnect 24 for that row, irrespective of the on/off status of the MOSFETs 9 and MOSFETs 9a for that row.

Since the twelfth and fourteenth pixels correspond to the first pixel, and the thirteenth pixel corresponds to the fourth pixel, it is also possible to obtain further variations of the fixed-image image sensor array by replacing first pixels with the twelfth pixels or fourteenth pixels, and by replacing fourth pixels with the thirteenth pixels. The resulting fixed-image image sensor array performs the same functions as that of the first example embodiment, and yields the same advantages.

In addition, the arrangement and quantity of pixels that have a light monitoring function may be modified. It is not necessarily required that said pixels be arranged in the center nor, that they be arranged in a single group.

Furthermore, in the example embodiment of FIG. 37, the light-quantity monitor signals from the multiple pixels with light quantity monitoring capabilities were consolidated into one for output from output terminal 50. However, it is also possible to output the light-quantity monitor signals separately from various pixels, as needed.

Image Sensor Array Example Embodiment 2

Figure 42:
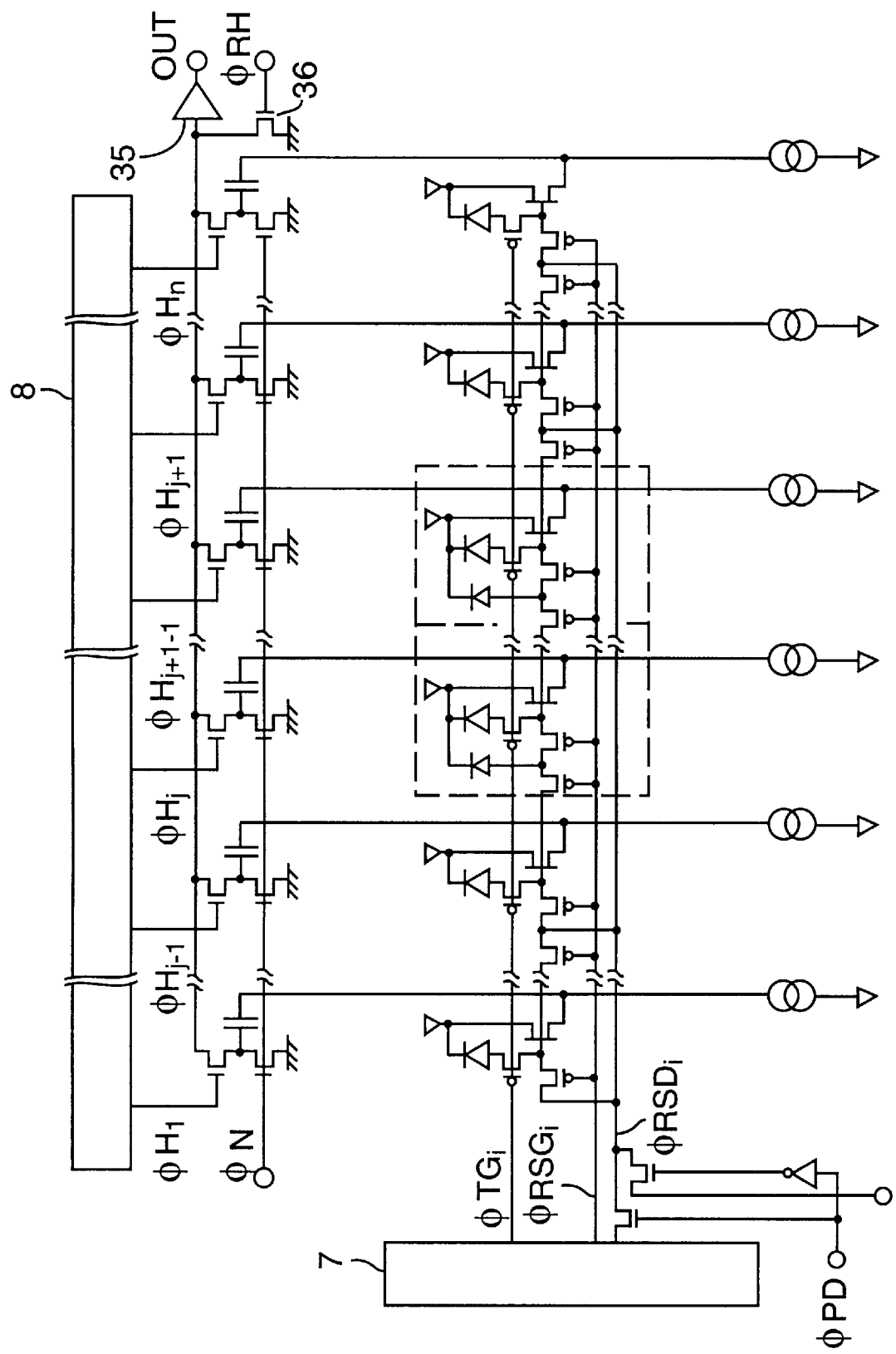
FIG. 42 is a circuit diagram of an equivalent circuit of another example embodiment of an image sensor array of the present invention.

FIG. 42 is a circuit diagram of a second example embodiment a fixed-image image sensor array. In FIG. 42, elements identical or corresponding to elements in FIG. 37 are assigned the same reference characters, and the description thereof will not be repeated.

Whereas said first example embodiment is a two-dimensional fixed-image image sensor array, this example embodiment is a one-dimensional fixed-image image sensor array.

This example embodiment comprises a single row of pixels including first pixels, along with related peripheral circuitry.

This embodiment yields the same advantages as the first example embodiment.

Moreover, the modifications previously described for the first example embodiment may be applied similarly to this embodiment as well.

Microlenses Example Embodiments

The image sensor arrays of the present invention can benefit from the use of on-chip microlenses to increase the light-sensitivity and the effective aperture ratio of the arrays. The microlenses of the present invention are specially configured to cooperate with one or more pixels having two photosensitive elements.

Microlenses Example Embodiment 1

FIG. 43 shows an example embodiment of a microlens arrangement for use in the context of the present invention. FIG. 43(a) is a plan view and FIG. 43(b) is a cross-sectional view taken along the line A-A' in FIG. 43(a).

In this example embodiment, a single pixel 702A has both a first photoelectric conversion element, such as a photodiode, positioned below an aperture 701, and a second photoelectric conversion element positioned below an aperture 702. The second photoelectric conversion element at aperture 702 is positioned near the center of the fixed-image image sensor array. The pixel 702A is surrounded by conventional single pixels 701A without second photoelectric conversion elements. FIG. 43 represents an enlargement of a single pixel 702A and the surrounding single pixels 701A that form a portion of a larger array of pixels.

In FIG. 43, 701 is the aperture over the first photoelectric conversion element, and 702 is the aperture over the second photoelectric conversion element. A standard on-chip microlens 703 is used in existing-type pixels 701A, while a reduced-size on-chip microlens 704 is used in the pixel 702A. (Hereafter, on-chip microlenses may be referred to simply as microlenses). A microlens 704 is also used in the pixel 701A that is adjacent to pixel 702A on the upper side in FIG. 43(a). In other words, the standard pixel 701A having a first photoelectric conversion element nearest the aperture 702 is not equipped with a standard microlens 703. Equipping it with a standard microlens 703 would cover up the aperture 702 over the second photoelectric conversion element.

In this embodiment, the separation between neighboring microlenses 703 is, for example, on the order of 0.2 microns horizontally and vertically. The horizontal separation between microlenses 704 is then likewise about 0.2 microns horizontally, but the vertical separation is enlarged so as to avoid the aperture 702 in the second photoelectric conversion element. The microlenses 704 are reduced and shaped in order to focus light on the first photoelectric conversion elements.

Both microlenses 703 and 704 use dome-shaped lenses (toric surface) in order to increase the covered area as much as possible to achieve the highest effective pixel aperture ratio. They are arranged so that the center point of the first photoelectric conversion element is aligned with the center point of the microlens.

In this example embodiment, microlenses 704 that focus light on the first photoelectric conversion element are placed so as to avoid aperture 702 on the second photoelectric conversion element. Thus, light entering the second photoelectric conversion element is not blocked or refracted by the microlenses focusing light on the first photoelectric conversion elements. Pixels 701A that are not adjacent to pixel 702A use a large standard microlens 703.

The example microlens embodiment of FIG. 43 makes it possible to efficiently illuminate the aperture 702 over the second photoelectric conversion element without degrading the effective aperture ratio of the great majority of the pixels. This example embodiment also makes it possible to increase the effective aperture ratio of the fixed-image image sensor array while still monitoring the quantity of incident light during exposure.

Figure 45:
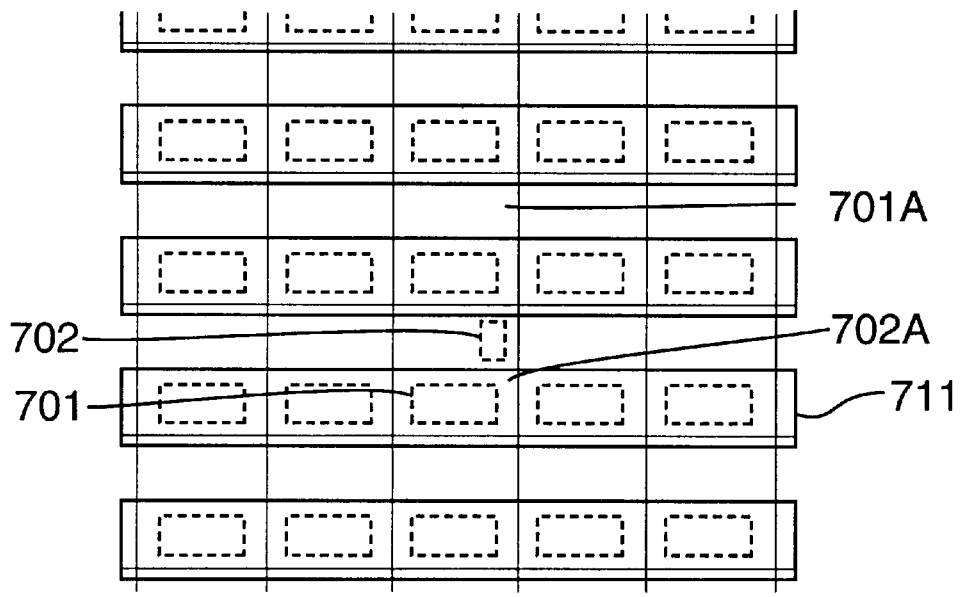
FIG. 45 is a plan view of yet another example embodiment of on-chip microlenses for use with the present invention.

The on-chip microlens used in this invention may be either a hemispheric lens, or a cylindrical lens extending along the row of pixels as shown in FIG. 45.

In FIG. 43 the microlenses adjacent to the second photoelectric conversion element have a different size than other microlenses. However, if desired, the same size may be used for all microlenses.

Microlenses Example Embodiment 2

FIG. 44 shows a second example embodiment of microlenses useful in the context of the present invention. FIG. 44(a) is a plan view, and FIG. 44(b) is a cross-sectional view taken along the line A-A' in FIG. 44(a).

Except for the microlenses themselves, this embodiment has the same structure as Embodiment 1 shown in FIG. 43. In FIG. 44, a hole 706 is formed by cutaway areas in microlenses 707 and 708. An Al film 709 is positioned on the side walls of the hole 706.

To produce the structure of this example embodiment, microlenses 703 that are the same as microlenses 703 in Embodiment 1 of FIG. 43 are placed over the entire surface with a horizontal and vertical separation of, for example, 0.2 microns. In addition, said microlenses 703 use dome-shaped lenses (toric surfaces) in order to increase the covered area as much as possible to achieve the highest effective pixel aperture ratio. The microlenses 703 are arranged so that the center point of the each first photoelectric conversion element is aligned with the center point of a microlens.

Next, photolithography technology is used to remove only the portion of the microlens covering pixel(s) 702A having an aperture 702 over a second photoelectric conversion element. This creates the hole 706 in microlenses above aperture 702 on the second photoelectric conversion element. Microlenses 707 and 708 are thus formed, each of which has a portion cut away.

Then a light-shielding film 709 such as an Al (aluminum) film is placed on the side walls of hole 706, as indicated in FIG. 44. This is done to prevent cross-talk between the light entering aperture 702 on the second photoelectric conversion element and the light entering aperture 701 on the first photoelectric conversion element. The light-shielding Al film may be formed by using Al sputtering to deposit the Al film over the entire microlens surface, including the previously formed hole 706, then anisotropic etching such as RIE (reactive ion etching) to etch only the Al film on the bottom of hole 706 and on the tops of the microlenses, leaving light-shielding film 709 on the side walls of hole 706.

The first example embodiments described above did not employ any microlens in the area B of pixel 702A shown in FIG. 44. As a result, light reaching that region could not be focused on any first photoelectric conversion element. With this second example embodiment, however, light entering area B can be focused on the respective first photoelectric conversion elements, thereby increasing the effective aperture ratio of pixel 702A and pixel 701A adjacent pixel 702A on the upper side thereof in FIG. 44.

The on-chip microlens used in this invention may be either a hemispheric or a cylindrical lens. In this second example embodiment, hole 706 is cut only on pixels having a second photoelectric conversion element. However, a hole may be cut on all pixels, if desired. The same size microlens is used for all pixels in this second sample embodiment, but as with the first example embodiment, a different microlens size may be used for microlenses adjacent to the second photoelectric conversion element.

Microlenses Example Embodiment 3

Figures 46A, 46B:
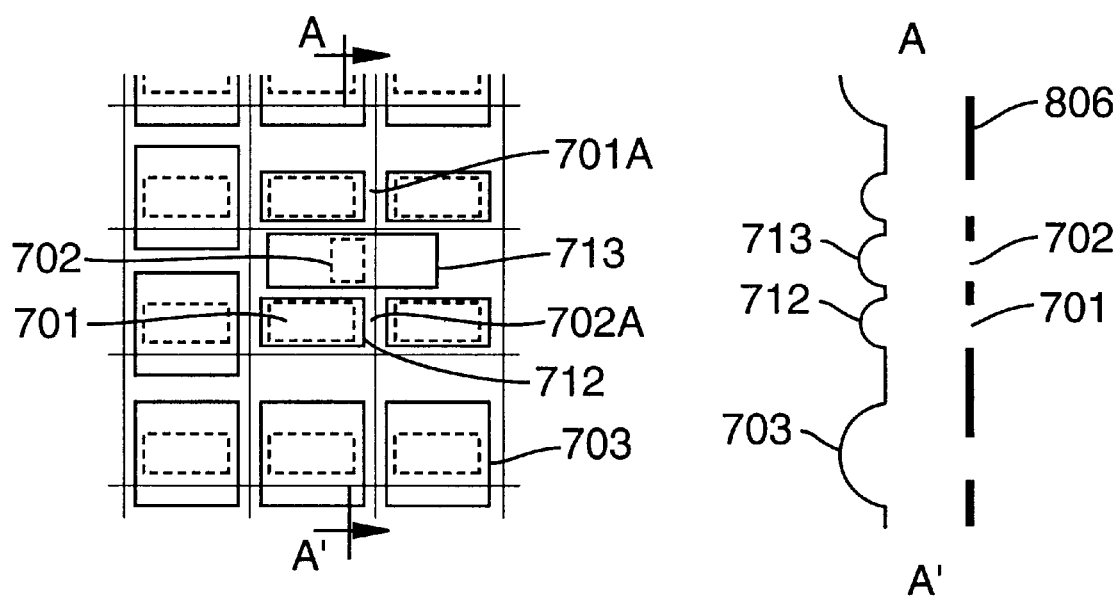
FIG. 46(a) is a plan view.
FIG. 46(b) is a cross-sectional view taken along the line A-A' in FIG. 46(a).
Figure 49:
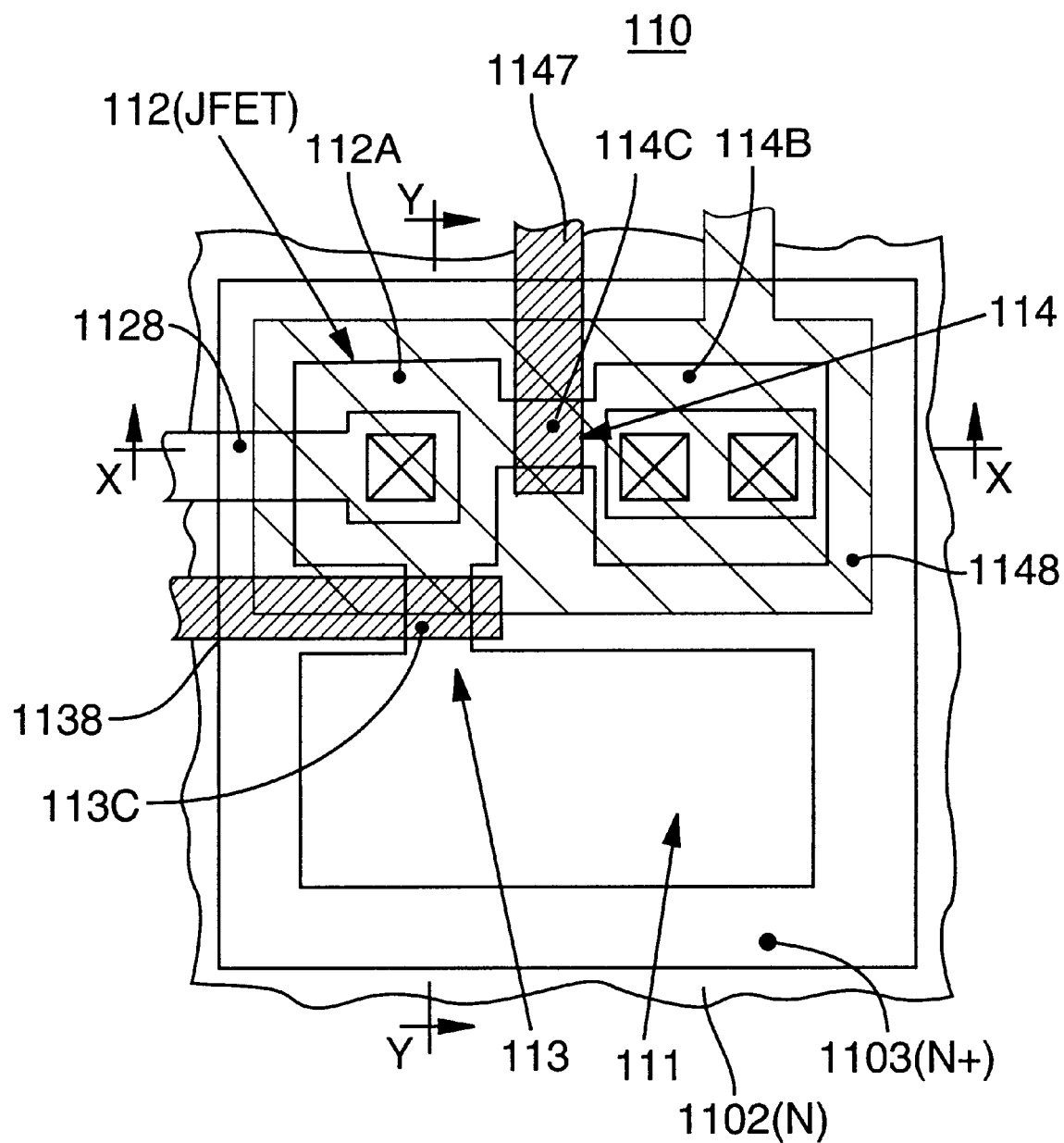
FIG. 49 (prior-art) is a plan view showing the structure of a conventional photoelectric conversion device 110.
Figure 50:
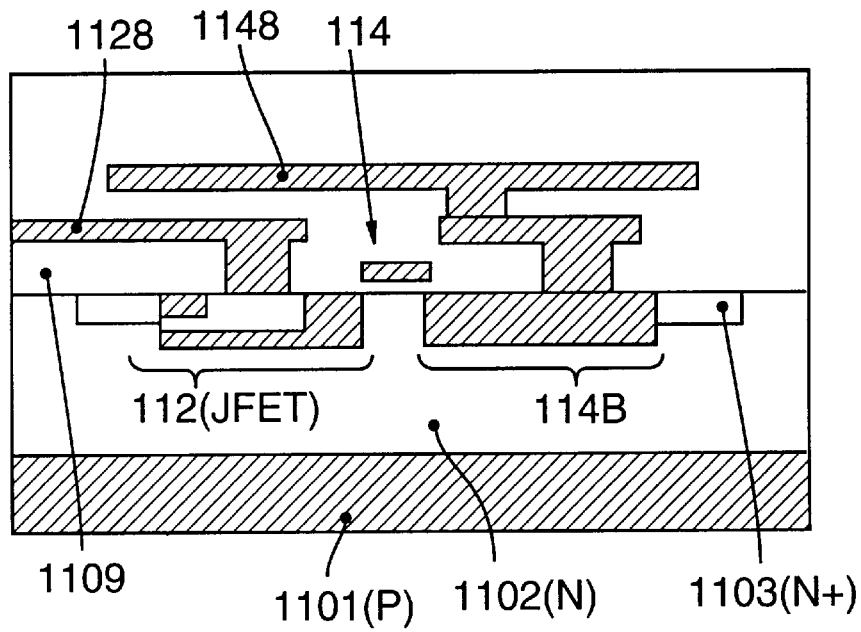
FIG. 50 (prior-art) is a cross-sectional view taken along the line X—X line shown in FIG. 25.
Figure 51:
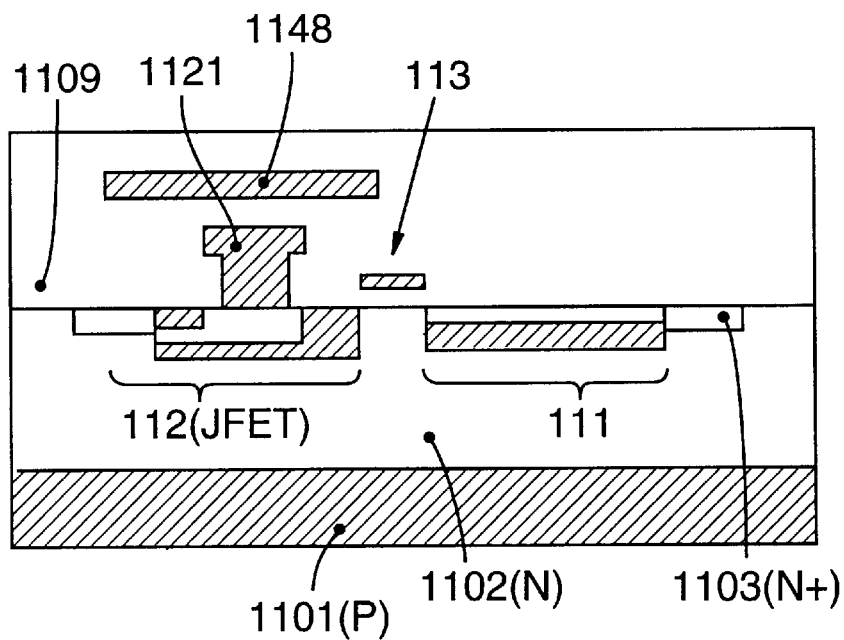
FIG. 51 (prior-art) is a cross-sectional view taken along the line Y—Y shown in FIG. 25.
Figure 52:
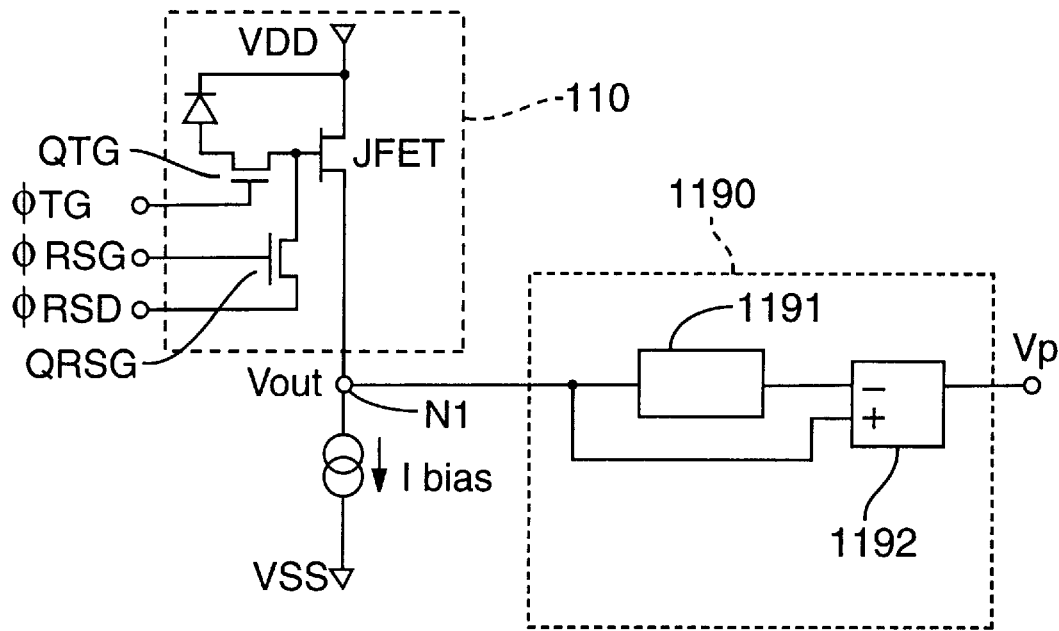
FIG. 52 (prior-art) is a circuit diagram showing the conventional photoelectric conversion device 110 and a conventional signal detection circuit 1190.
Figure 53:
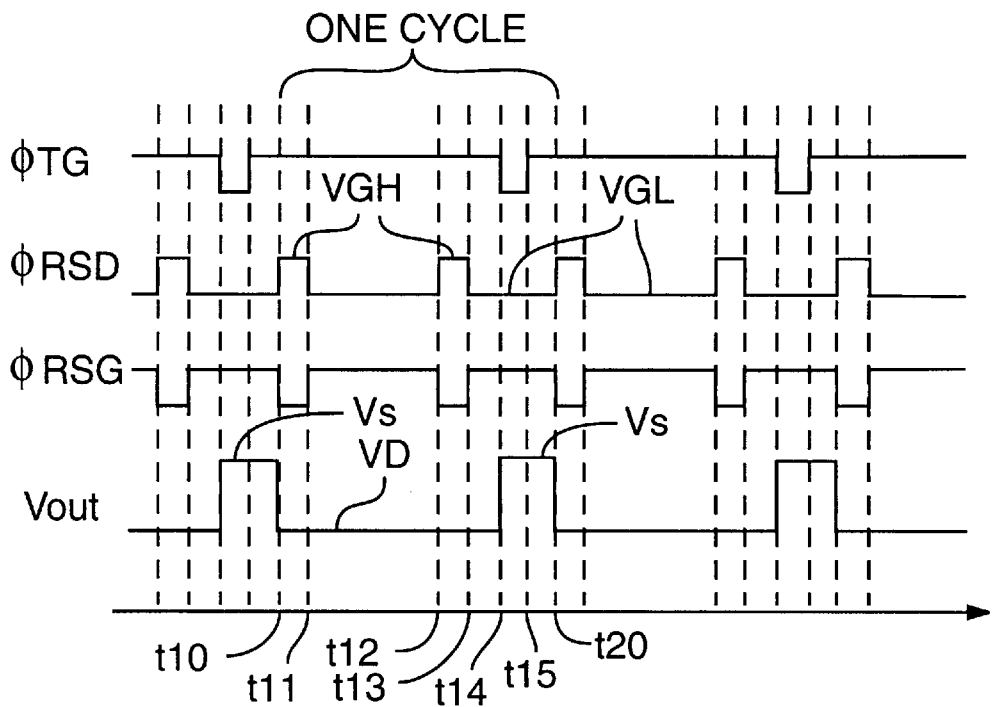
FIG. 53 (prior-art) is a timing chart showing the waveforms of driving pulses φTG, φRSG, and φRSD which are supplied to the conventional photoelectric conversion device 110.

FIG. 46 illustrates a third example embodiment of microlenses useful in the context of the present invention. In this example embodiment, a smaller microlens 712 focuses light on the first photoelectric conversion elements surrounding the second photoelectric conversion element, and a larger microlens 713 focuses light on the second photoelectric conversion element. Except for the microlenses, this embodiment has the same structure as the first sample embodiment, shown in FIG. 43.

In this third example embodiment, the microlens 713 is formed directly above the aperture 702 over the second photoelectric conversion element so as to focus light on the second photoelectric conversion element. A smaller microlens 712 is formed, for pixel 702A and the three pixels 701A around pixel 702A, at a distance of, for example, 0.2 microns from microlens 713, so as to focus light on the first photoelectric conversion element. Standard microlenses 703 are formed to focus light on the first photoelectric conversion elements not next to aperture 702.

The center point of microlenses 703, 712, and 713 are aligned with the center points, respectively, of the first and second photoelectric conversion elements, which is the area where they are focusing light. The vertical separation between microlenses 712 and microlens 703 is increased. The lenses used for these microlenses are dome-shaped lenses (toric lens surfaces).

In this embodiment, since microlens 713 is also placed above the second photoelectric conversion element, it is possible to increase the effective aperture ratio of the second photoelectric conversion element. Therefore, it is possible to monitor the quantity of incoming light during exposure, even when only a very small amount of light is available. This makes more highly sensitive TTL (through-the-lens) light modulation/metering possible.

Example Embodiment of Image Capture Circuity and Processing

FIG. 47 is a block diagram of the overall configuration of an image capture circuitry and processing useful with certain of the microlens arrangements of the present invention. The image capture apparatus of FIG. 47 comprises an image read-out control MPU (microprocessor unit) 2200, a timing generator 2201, an image output signal read driver 2202, a fixed-image image sensor array 2203, an image output signal amplifier 2204, an A/D converter 2205, an aperture ratio adjustment processor 2206, a signal processor 2207 for performing signal correction, a memory controller 2208, an image output device interface 2209, and a CRT or other image output device 2210.

Entering light is converted by the fixed-image image sensor array 2203 into an electrical signal, and after it is amplified by amplifier 2204, it is converted into a digital signal by A/D converter 2205. The effective aperture ratio is adjusted as needed by aperture ratio adjustment processor 2206, after which the signal is sent to signal processor 2207. The signal processing in signal processor 2207 is performed in conventional fashion, with the appropriately selected processing performed as needed. After undergoing signal processing, the signal enters memory controller 2208 and is stored in image memory, after which it is sent via interface 2209 to image output device 2210.

FIG. 48 is a flowchart showing the operations of the image capture apparatus of FIG. 47.

When light enters the image capture element (S1), MPU 2200 determines whether the microlens on the first photoelectric conversion element (image capture element) on the pixel that has received the light is a standard microlens or not (S2). A standard microlens is a microlens such as the microlenses 703 shown in FIGS. 43 and 44. Non-standard microlenses are those such as microlenses 704 in FIG. 43 or microlenses 707 and 708 in FIG. 44, i.e., small or specially shaped microlenses such as used in pixel(s) 702A and in pixel(s) 701A which are adjacent to pixel(s) 702A.

If the microlens is a standard one, conventional signal processing proceeds (S3a). If the microlens is non-standard, aperture ratio adjustment is performed (S3b), after which conventional signal processing proceeds (S3a). Then image output is performed (S4). When the standard microlens effective aperture ratio is 90% and the non-standard microlens effective aperture ratio is 60%, the aperture ratio adjustment method is to multiply the output signal from an image capture element with a non-standard microlens by 1.5 (=90/60) before output.

Performing this aperture adjustment processing makes it possible to output images with no variation in sensitivity between pixels.

While the invention has been described above by way of exemplary embodiments, it is understood that many changes and substitutions may be made by those skilled in the art with without departing from the spirit and the scope of the invention, which is not limited to the above embodiments, but is defined instead by the literal and equivalence scope of the appended claims.

What is claimed is:

1. A photoelectric conversion device comprising:
   (a) a photoelectric conversion element structured and arranged so as to generate, in response to incident light, a first signal charge corresponding to the incident light;
   (b) an output unit comprising an amplification transistor having a control electrode, the amplification transistor being structured and arranged such that the control electrode generates, in response to the incident light, a second signal charge corresponding to the incident light, and the output unit being structured and arranged so as to output an electric signal corresponding to a charge present in the control electrode; and
   (c) a transfer unit structured and arranged so as to transfer to the control electrode the first signal charge generated by the photoelectric conversion element, the transfer unit being supplied with a control signal so as to transfer the first signal charge in a manner either (1) so as to cause the output unit to output an electric signal corresponding to the sum of the first and second signal charges or (2) so as to cause the output unit to separately output both an electric signal corresponding to the first signal charge and an electric signal corresponding to the second signal charge.

2. The photoelectric conversion device of claim 1, wherein the amplification transistor is a field-effect transistor.

3. The photoelectric conversion device of claim 1, wherein a color filter of a specific color is provided above at least one of (1) an incident-light-receiving surface of the control electrode of the amplification transistor and (2) an incident-light-receiving surface of the photoelectric conversion element.

4. The photoelectric conversion device of claim 1, wherein a color filter of a specific color is provided above are incident-light-receiving surface of the control electrode of the amplification transistor and a color filter of a different color is provided above an incident-light-receiving surface of the photoelectric conversion element.

5. A photoelectric conversion apparatus comprising:
the photoelectric conversion device of claim 1;
a shutter; and
a controller structured and arranged so as to control the timing of the shutter so as to adjust the time during which the photoelectric conversion element generates a charge based on the second signal charge generated by the control electrode of the amplification transistor.

6. A photoelectric conversion apparatus comprising:
the photoelectric conversion device of claim 1;
a shutter; and
a controller structured and arranged to as to control the timing of the shutter based on the sum of (1) the signal charge generated by the control electrode of the amplification transistor and (2) the signal charge generated by the photoelectric conversion element, thereby adjusting the time during which the photoelectric conversion element generates a charge.

7. A photoelectric conversion device comprising:
(a) a photoelectric conversion element structured and arranged so as to generate, in response to incident light, a first signal charge corresponding to the incident light;
(b) an output unit comprising an amplification transistor having a control electrode, the output unit structured and arranged so as to output an electric signal corresponding to a charge present in the control electrode;
(c) a transfer unit structured and arranged so as to be able to transfer the first signal charge generated by the photoelectric conversion element to the control electrode; and
(d) a reset transistor positioned and arranged so as to be able to remove the charge present in the control electrode and so that at least a main electrode of the reset transistor generates, in response to the incident light, a second signal charge corresponding to the incident light, the reset transistor and the transfer unit being supplied with control signals so as to transfer the first signal charge to the output unit, causing the output unit to output an electric signal corresponding to the first signal charge, and so as to cause the second signal charge to be output from the reset transistor.

8. The photoelectric conversion device of claim 7, wherein said main electrode of the reset transistor is connected to a first transistor for outputting the signal charge generated by said main electrode and to a second transistor for applying a prescribed voltage to said main electrode.

9. The photoelectric conversion device of claim 7, wherein the amplification transistor is a field-effect transistor, and the reset transistor is a MOS transistor.

10. The photoelectric conversion device of claim 7, wherein a color filter of a specific color is positioned above at least one of (1) an incident-light-receiving surface of said main electrode of the reset transistor and (2) an incident-light-receiving surface of the photoelectric conversion element.

11. The photoelectric conversion device of claim 7, wherein a color filter of a specific color is provided above an incident-light-receiving surface of said main electrode of the reset transistor and a color filter of a different color is provided above an incident-light-receiving surface of the photoelectric conversion element.

12. A photoelectric conversion apparatus comprising:
the photoelectric conversion device of claim 7;
a shutter; and
a controller structured and arranged so as to control the timing of the shutter based on the second signal charge generated said main electrode of the reset transistor, thereby adjusting the time during which the photoelectric conversion element generates a charge.

13. A photoelectric conversion device comprising:
(a) a photoelectric conversion element structured and arranged so as to generate, in response to incident light, a first signal charge corresponding to the incident light;
(b) an output unit comprising an amplification transistor having a control electrode, the output unit being structured and arranged so as to output an electric signal corresponding to a charge present at the control electrode;
(c) a transfer unit positioned and arranged so as to be able to transfer the first signal charge generated by the photoelectric conversion element to the control electrode; and
(d) a reset transistor structured and arranged so as to be able to remove from the control electrode the charge present at the control electrode, the reset transistor being further structured and arranged so that at least a main electrode thereof generates, in response to the incident light, a second signal charge corresponding to the incident light, the reset transistor and the transfer unit being supplied with control signals so as to transfer the first and second signal charges to the control electrode either (1) such that the first and second signal charges are combined at the control electrode, or (2) such that the first and second signal charges are successively and individually present in the control electrode.

14. The photoelectric conversion device of claim 13, wherein the amplification transistor is a field-effect transistor, and the reset transistor is a MOS transistor.

15. The photoelectric conversion device of claim 13, wherein a color filter of a specific color is positioned above at least one of (1) an incident-light-receiving surface of said main electrode of the reset transistor and (2) an incident-light-receiving surface of the photoelectric conversion element.

16. The photoelectric conversion device of claim 13, wherein a color filter of a specific color is provided above an incident-light-receiving surface of said main electrode of the reset transistor, and a color filter of a different color is provided above an incident-light-receiving surface of the photoelectric conversion element.

17. A photoelectric conversion apparatus comprising:
the photoelectric conversion device of claim 13;
a shutter; and
a controller structured and arranged so as to control the timing of the shutter based on the second signal charge generated said main electrode of the reset transistor, thereby adjusting the time during which the photoelectric conversion element generates a charge.

18. A photoelectric conversion device comprising:
(a) a photoelectric conversion element structured and arranged so as to generate, in response to incident light, a first signal charge corresponding to the incident light;
(b) an output unit comprising an amplification transistor having a control electrode, the output unit being structured and arranged so as to output an electric signal corresponding to a charge present at the control electrode, the amplification transistor being structured and arranged such that the control electrode generates, in response to the incident light, a second signal charge corresponding to the incident light;
(c) a transfer unit structured and arranged so as to be able to transfer the first signal charge generated by the photoelectric conversion element to the control electrode; and
(d) a reset transistor structured and arranged so as to be able to remove from the control electrode the signal charge present at the control electrode, the reset transistor being further structured and arranged so that at least a main electrode thereof generates, in response to the incident light, a third signal charge corresponding to the incident light, the reset transistor and the transfer unit being supplied with control signals so as to transfer the first signal charge to the control electrode and so as to transfer the second and third signal charges to said main electrode of the reset transistor for output from said main electrode, the second and third signal charges being either (1) combined at said main electrode and output together as a combined signal charge, or (2) output sequentially at said main electrode.

19. The photoelectric conversion device of claim 18, wherein said main electrode of the reset transistor is connected to both a first transistor for outputting the second and third signal charges, and to a second transistor for applying a prescribed voltage to said main electrode.

20. The photoelectric conversion device of claim 18, wherein the amplification transistor is a field-effect transistor, and the reset transistor is a MOS transistor.

21. The photoelectric conversion device of claim 18, wherein a color filter of a specific color is provided above at least one incident-light-receiving surface from among (1) an incident-light-receiving surface of the control electrode of the amplification transistor, (2) an incident-light-receiving surface of said main electrode of the reset transistor, and (3) an incident-light-receiving surface of the photoelectric conversion element.

22. The photoelectric conversion device of claim 18, wherein a color filter of a specific color is provided above an incident-light-receiving surface of the photoelectric conversion element and a color filter of a different color is provided above at least one of (1) an incident-light-receiving surface of the control electrode of the amplification transistor and (2) an incident-light-receiving surface of said main electrode of the reset transistor.

23. A photoelectric conversion apparatus comprising:
the photoelectric conversion device of claim 18;
a shutter; and
a controller for controlling the timing of the shutter based on at least one of (1) the signal charge generated by the control electrode of the amplification transistor, and (2) the signal charge generated by said main electrode of the reset transistor, thereby adjusting the time during which the photoelectric conversion element generates a charge.

24. The photoelectric conversion apparatus of claim 23, wherein the controller closes the shutter when an electric signal output from the output unit exceeds a first prescribed value, or when a signal charge output from said main electrode of the reset transistor exceeds a second prescribed value, whichever comes first, thereby adjusting the time during which the photoelectric conversion element generates a charge.

25. A photoelectric conversion device comprising:
(a) a photoelectric conversion element structured and arranged so as to generate, in response to incident light, a first signal charge corresponding to the incident light;
(b) an output unit comprising an amplification transistor having a control electrode, the output unit being structured and arranged so as to output an electric signal corresponding to a charge present at the control electrode, the amplification transistor being structured and arranged such that the control electrode generates, in response to the incident light, a second signal charge corresponding to the incident light;
(c) a transfer unit structured and arranged so as to be able to transfer to the control electrode the first signal charge generated by the photoelectric conversion element; and
(d) a reset transistor structured and arranged so as to be able to remove from the control electrode the charge present at the control electrode, the reset transistor being further structured and arranged such that at least a main electrode thereof generates, in response to the incident light, a third signal charge corresponding to the incident light, the reset transistor and the transfer unit being supplied with control signals so as to output the third signal charge from said main electrode of the reset transistor and so as to transfer to the control electrode both the first and second signal charges, the first and second signal charges being so transferred either (1) so as to combine the first and second signal charges at the control electrode, or (2) so as to make the first and second signal charges individually present at the control electrode in succession.

26. The photoelectric conversion device of claim 25, wherein said main electrode of the reset transistor is connected to both a first transistor for outputting the third signal charge, and to a second transistor for applying a prescribed voltage to said main electrode.

27. The photoelectric conversion device of claim 25, wherein the amplification transistor is a field-effect transistor, and the reset transistor is a MOS transistor.

28. The photoelectric conversion device of claim 25, wherein a color filter of a specific color is provided above at least one incident-light-receiving surface from among (1) an incident-light-receiving surface of the control electrode of the amplification transistor, (2) an incident-light-receiving surface of said main electrode of the reset transistor, and (3) an incident-light-receiving surface of the photoelectric conversion element.

29. The photoelectric conversion device of claim 25, wherein a color filter of a specific color is provided above an incident-light-receiving surface of the photoelectric conversion element and a color filter of a different color is provided above at least one of (1) an incident-light-receiving surface of the control electrode of the amplification transistor and (2) an incident-light-receiving surface of said main electrode of the reset transistor.

30. A photoelectric conversion apparatus comprising:
the photoelectric conversion device of claim 25;
a shutter; and
a controller for controlling the timing of the shutter based on at least one of (1) the signal charge generated by the control electrode of the amplification transistor, and (2) the signal charge generated by said main electrode of the reset transistor, thereby adjusting the time during which the photoelectric conversion element generates a charge.

31. The photoelectric conversion apparatus of claim 30, wherein the controller closes the shutter when an electric signal output from the output unit exceeds a first prescribed value, or when a signal charge output from said main electrode of the reset transistor exceeds a second prescribed value, whichever comes first, thereby adjusting the time during which the photoelectric conversion element generates a charge.

32. A photoelectric conversion device comprising:
(a) a photoelectric conversion element structured and arranged so as to generate, in response to incident light, a first signal charge corresponding to the incident light;
(b) an output unit comprising an amplification transistor having a control electrode, the output unit being structured and arranged to as to output an electric signal corresponding to a charge present at the control electrode, the amplification transistor being structured and arranged such that the control electrode generates, in response to the incident light, a second signal charge corresponding to the incident light;
(c) a transfer unit structured and arranged so as to be able to transfer the first signal charge generated by the photoelectric conversion element to the control electrode; and
(d) a reset transistor structured and arranged so as to be able to remove from the control electrode the charge present at the control electrode, the reset transistor being further structured and arranged such that at least a main electrode thereof generates, in response to the incident light, a third signal charge corresponding to the incident light, the reset transistor and the transfer unit being supplied with control signals so as to cause the first, second, and third signal charges to be present, at the control electrode of the amplification transistor, with (1) all three signal charges combined at once at the control electrode, (2) all three signal charges individually in succession present at the control electrode, or (3) the first signal charge present individually and the second and third charges present in combination at the control electrode.

33. The photoelectric conversion device of claim 32, wherein the amplification transistor is a field-effect transistor, and the reset transistor is a MOS transistor.

34. The photoelectric conversion device of claim 32, wherein a color filter of a specific color is provided above at least one incident-light-receiving surface from among (1) an incident-light-receiving surface of the control electrode of the amplification transistor, (2) an incident-light-receiving surface of said main electrode of the reset transistor, and (3) an incident-light-receiving surface of the photoelectric conversion element.

35. The photoelectric conversion device of claim 32, wherein a color filter of a specific color is provided above an incident-light-receiving surface of the photoelectric conversion element and a color filter of a different color is provided above at least one of (1) an incident-light-receiving surface of the control electrode of the amplification transistor and (2) an incident-light-receiving surface of said main electrode of the reset transistor.

36. A photoelectric conversion apparatus comprising:
the photoelectric conversion device of claim 32;
a shutter; and
a controller for controlling the timing of the shutter based on at least one of (1) the signal charge generated by the control electrode of the amplification transistor, and (2) the signal charge generated by said main electrode of the reset transistor, thereby adjusting the time during which the photoelectric conversion element generates a charge.

37. The photoelectric conversion apparatus of claim 36, wherein the controller closes the shutter when an electric signal output from the output unit exceeds a first prescribed value, or when a signal charge output from said main electrode of the reset transistor exceeds a second prescribed value, whichever comes first, thereby adjusting the time during which the photoelectric conversion element generates a charge.

38. A light receiving device useful as a pixel element in a photodetector array, the device comprising:
(a) a photosensitive element structured and arranged so as to generate, in response light incident thereon, a first signal charge; and
(b) a first transistor having at least one electrode structured and arranged so as to generate, in response to light incident on said electrode, a second signal charge; the first transistor being positioned and arranged within the device in one of the two following ways:
(i) the first transistor being positioned and arranged within the device to function as an amplification transistor, the said electrode comprising a gate of the first transistor connected to the photosensitive element in such a way as to be capable of receiving the first signal charge; and
(ii) the first transistor being positioned and arranged within the device to function as a reset transistor, connected to the photosensitive element in such a way as to be able to remove the first signal charge from the device, the said electrode comprising a reset drain of the reset transistor,
wherein the photosensitive element and the first transistor are positioned together within the device so as to facilitate formation of an extended array of such devices.

39. An photosensitive array comprising multiple instances of the device of claim 38.

40. An image sensor array comprising a regular array of pixel elements formed on a single semiconductor substrate, the array of pixel elements including at least one first pixel element, said at least one first pixel element comprising at least first and second photosensitive areas, said at least first and second photosensitive areas of said at least one first pixel element each being capable of providing an output signal in response to incident light, the value of any one said output signal being independent of any other said output signal.

41. The image sensor array of claim 40 wherein the array of pixel elements is a rectangular array.

42. The image sensor array of claim 41 wherein the array of pixel elements is a one-dimensional array.

43. The image sensor array of claim 41 wherein the array of pixel elements is a two-dimensional array.

44. The image sensor array of claim 40 wherein the array further includes at least one second pixel element, said at least one second pixel element including one and only one photosensitive area.

45. The image sensor array of claim 44 wherein each pixel includes an amplifier and the output signal from the first photosensitive area is read out via the amplifier.

46. The image sensor array of claim 45 wherein the output signal from the second photosensitive area is read out via said amplifier.

47. The image sensor array of claim 45 wherein the amplifier is a junction-field-effect transistor.

48. The image sensor array of claim 45 further including a reset interconnection and wherein the second photosensitive area is read out via the reset interconnection.

49. The image sensor array of claim 48 wherein the second photosensitive area comprises at least a portion of a reset drain.

50. The image sensor array of claim 48 wherein the second photosensitive area is permanently electrically connected to said reset interconnection.

51. The image sensor array of claim 48 wherein the second photosensitive area is capable of being intermittently electrically connected to said reset interconnection.

52. The image sensor array of claim 51 further comprising inter-pixel switches capable of electrically connecting a second photosensitive area of one pixel with an area of another pixel, and wherein the second photosensitive area is intermittently electrically connected to said reset interconnection via a pixel other than said at least one first pixel.

53. The image sensor array of claim 48 further comprising a switch arranged so as to be able to change between a first state in which a driving pulse is supplied to the reset interconnection and a second state in which an output signal may be read from the reset interconnection.

54. The image sensor array of claim 44 wherein each first pixel of the array is associated with a first on-chip microlens so arranged as to focus incident light on the first photosensitive area of said first pixel, and each second pixel of the array is associated with the first or a second on-chip microlens so arranged as to focus incident light on the one and only one photosensitive area of said second pixel, the first microlens pixel being shaped and positioned with respect to said first pixel in a fashion identical to how the first or the second microlens is shaped and positioned with respect to said second pixel, the first microlens not extending above the second photosensitive area.

55. The image sensor array of claim 54 wherein the first microlens is cylindrical.

56. The image sensor array of claim 54 wherein the first microlens is semispherical.

57. The image sensor array of claim 44 further comprising an on-chip microlens over the first photosensitive area and no microlens over the second photosensitive area.

58. The image sensor array of claim 57 wherein the second pixel is not adjacent to the first pixel and further comprising an on-chip microlens substantially the same size as the second pixel positioned over the one and only one photosensitive area.

59. The image sensor array of claim 44 further comprising on-chip microlenses over each of the first and second pixels, said on-chip microlenses being virtually identical except for a hole over the second photosensitive area of the first pixel.

60. The image sensor array of claim 59 wherein the hole has sidewalls having a reflective layer thereon.

61. The image sensor array of claim 44 further comprising a first on-chip microlenses over each at least one first pixel, said on-chip microlens having a hole over the second photosensitive area of the first pixel, the second pixel having a second on-chip microlens virtually identical to the first microlens.

62. The image sensor array of claim 44 wherein the first photosensitive area is associated with a first on-chip microlens positioned to focus light thereon, and the second photosensitive area is associated with a second on-chip microlens positioned to focus light thereon.

63. The image sensor array of claim 44 including an aperture ratio compensator capable of adjusting the output signals from the first photosensitive area and the one and only one photosensitive area as needed so as to cancel differences in said output signals attributable to a difference between an effective aperture ratio of the first photosensitive area and an effective aperture ratio of the one and only one photosensitive area.

64. The image sensor array of claim 63 wherein the pixels of the array are provided with on-chip microlenses.

65. A fixed-image image capture apparatus comprising an (1) image sensor array for capturing an image formed, for an exposure time, on the image sensor array, and (2) a light-control device; the image sensor array comprising a regular array of pixel elements formed on a single semiconductor substrate, the array including at least one photosensitive area arranged to be capable of providing an output signal, during an exposure time, indicative of the incident light flux at said photosensitive area during the exposure time, the light-control device arranged to be able to control the duration of the exposure time based on the output signal from the at least one photosensitive area.

66. The fixed-image image capture apparatus of claim 65 further comprising a shutter for starting and ending the exposure time by opening and closing, respectively, and wherein the exposure control device is arranged to be capable of controlling the exposure time by controlling the shutter.

67. The fixed-image image capture apparatus of claim 65 further comprising a strobe for starting and ending the exposure time by turning on and turning off, respectively, and wherein the exposure control device is arranged to be capable of controlling the exposure time by controlling the strobe.

68. A photoelectric conversion device comprising a photoelectric conversion element structured and arranged so as to be able to generate a signal charge in response to incident light, an amplification transistor for amplifying the signal charge from the photoelectric conversion element; and a reset transistor for resetting the photoelectric conversion device, wherein at least one of (1) a control electrode of the output amplification transistor and
(2) a main electrode of the reset transistor is structured and arranged so as to be able to generate a signal charge in response to incident light.

* * * * *

UNITED STATES PATENT AND TRADEMARK OFFICE
CERTIFICATE OF CORRECTION

PATENT NO.    : 6,046,466
DATED         : April 4, 2000
INVENTOR(S)   : Ishida et al.

It is certified that error appears in the above-identified patent and that said Letters Patent is hereby corrected as shown below:

Column 5,
Line 20, change "is a achieved" to -- is achieved --

Column 8,
Line 12, change "firs pixel" to -- first pixel --
Line 42, change "More particular" to -- A more particular --

Column 12,
Line 60, change "a third" to -- to a third --

Column 14,
Line 7, change "FIG. 35 is shows" to -- FIG. 35 shows --
Line 57, change "line X—X line shown" to -- line X—X shown --

Column 27,
Line 52, change "level.)" to -- level. --

Column 45,
Line 18, change "drain, 4 so that" to -- drain 4, so that --
Line 40, change "left of FIGS. 29(*a*) 29)(*b*)." to -- left in FIGS. 29(*a*) and 29(*b*). --

Column 47,
Line 22, change "P/N junction not reach" to -- P/N junction do not reach --
Line 48, change "in same ways" to -- in the same ways --

Column 48,
Line 42, change "(k´1)" to -- (k ´ l) --,

Column 49,
Line 9, change "in same way" to -- in the same way --
Lines 39-40, change "interconnect 24 for is connected" to -- interconnect 24 is connected --

Column 50,
Line 2, change "is comprises an" to -- comprises an --

UNITED STATES PATENT AND TRADEMARK OFFICE
CERTIFICATE OF CORRECTION

PATENT NO.   : 6,046,466
DATED          : April 4, 2000
INVENTOR(S) : Ishida et al.

Page 2 of 3

It is certified that error appears in the above-identified patent and that said Letters Patent is hereby corrected as shown below:

Column 51,
Line 24, change "Image-sensor array 100" to -- sensor array 100 --
Line 57, change "FIG. 41 is timing chart" to -- FIG. 41 is a timing chart --

Column 53,
Line 49, change "microlenses)." to -- microlenses.) --

Column 54,
Line 49, change "point of the each first" to -- point of each of the first --

Column 56,
Line 48, change "with without" to -- without --
Line 50, change "equivalence" to -- equivalents --

Claims,
Column 57,
Line 19, change "above are incident-light receiving" to -- above an incident-light-receiving --

Column 58,
Line 25, change "generated said main" to -- generated by said main --

Column 59,
Line 9, change "generated said main" to -- generated by said main --

Column 61,
Line 31, change "arranged to as to output" to -- arranged as to output --

Column 62,
Line 30, change "in response light" to -- in response to light --
Line 52, change "An photosensitive" to -- A photosensitive --

UNITED STATES PATENT AND TRADEMARK OFFICE
CERTIFICATE OF CORRECTION

PATENT NO. : 6,046,466
DATED : April 4, 2000
INVENTOR(S) : Ishida et al.

It is certified that error appears in the above-identified patent and that said Letters Patent is hereby corrected as shown below:

Column 64,
Line 6, change "a first on-chip microlenses" to -- a first on-chip microlens --

Signed and Sealed this

Thirteenth Day of November, 2001

Attest:

*Nicholas P. Godici*

NICHOLAS P. GODICI
*Attesting Officer*    *Acting Director of the United States Patent and Trademark Office*